US012796148B2

(12) United States Patent
Ishino et al.

(10) Patent No.: US 12,796,148 B2
(45) Date of Patent: Nov. 10, 2026

(54) SEMICONDUCTOR DEVICE

(71) Applicant: Canon Kabushiki Kaisha, Tokyo (JP)

(72) Inventors: Hideaki Ishino, Tokyo (JP); Jun Yamaguchi, Kanagawa (JP); Tsutomu Tange, Kanagawa (JP); Takuya Hara, Kanagawa (JP); Daisuke Kobayashi, Saitama (JP)

(73) Assignee: Canon Kabushiki Kaisha, Tokyo (JP)

(*) Notice: Subject to any disclaimer, the term of this patent is extended or adjusted under 35 U.S.C. 154(b) by 470 days.

(21) Appl. No.: 18/345,012

(22) Filed: Jun. 30, 2023

(65) Prior Publication Data

US 2024/0021648 A1 Jan. 18, 2024

(30) Foreign Application Priority Data

Jul. 15, 2022 (JP) ................................. 2022-114323

(51) Int. Cl.

| | |
|---|---|
| ***H10F 39/00*** | (2025.01) |
| ***H10F 39/12*** | (2025.01) |
| ***H10W 20/00*** | (2026.01) |

(52) U.S. Cl.

CPC ......... *H10F 39/811* (2025.01); *H10F 39/024* (2025.01); *H10F 39/802* (2025.01); (Continued)

(58) Field of Classification Search

None

See application file for complete search history.

(56) References Cited

U.S. PATENT DOCUMENTS

2012/0193785 A1 8/2012 Lin
2013/0105667 A1* 5/2013 Kobayashi ............ H10F 39/804 250/208.1

(Continued)

FOREIGN PATENT DOCUMENTS

JP 2018170528 A 11/2018
JP 2019220703 A 12/2019

(Continued)

OTHER PUBLICATIONS

Korean Office Action dated Jan. 7, 2026 in counterpart Korean Patent Appln. No. 10-2023-0081587.

(Continued)

*Primary Examiner* — Julio J Maldonado
*Assistant Examiner* — Pinaki Das
(74) *Attorney, Agent, or Firm* — Venable LLP

(57) ABSTRACT

A semiconductor device in which semiconductor layers are stacked is provided. A first structure is arranged between a first semiconductor layer and a second semiconductor layer. A second structure is arranged between the second semiconductor layer and a third semiconductor layer. In an orthographic projection to the third semiconductor layer, a region where elements are arranged in the third semiconductor layer is a first region, and a region between the first region and a peripheral portion of the third semiconductor layer is a second region. In the second region, an opening that extends through the third semiconductor layer, the second structure and the second semiconductor layer and exposes an electrode arranged in the first structure is arranged. Between the first region and the opening, an insulator is arranged at the same height as the second semiconductor layer.

19 Claims, 31 Drawing Sheets

(52) U.S. Cl.
CPC ....... *H10F 39/8037* (2025.01); *H10F 39/809* (2025.01); *H10F 39/199* (2025.01); *H10W 20/00* (2026.01); *H10W 20/021* (2026.01); *H10W 20/0234* (2026.01)

(56) References Cited

U.S. PATENT DOCUMENTS

| | | | | |
|---|---|---|---|---|
| 2015/0296162 | A1* | 10/2015 | Kurokawa | H10D 86/60 257/43 |
| 2016/0035766 | A1* | 2/2016 | Hongo | H10F 39/026 438/70 |
| 2017/0207158 | A1* | 7/2017 | Kang | H10W 20/20 |
| 2017/0221950 | A1 | 8/2017 | Ho | |
| 2018/0286910 | A1 | 10/2018 | Kobayashi | |
| 2020/0127030 | A1* | 4/2020 | Ogawa | H10F 39/024 |
| 2020/0176493 | A1* | 6/2020 | Ikeda | H10F 39/8063 |
| 2020/0343280 | A1 | 10/2020 | Ishino | |
| 2021/0126026 | A1* | 4/2021 | Hirota | H10F 39/18 |
| 2021/0400224 | A1 | 12/2021 | Gocho et al. | |
| 2022/0231067 | A1* | 7/2022 | Huang | H10F 39/026 |
| 2022/0367540 | A1* | 11/2022 | Saka | H10F 39/802 |
| 2023/0081238 | A1* | 3/2023 | Jang | H10F 39/811 257/213 |

FOREIGN PATENT DOCUMENTS

| | | | |
|---|---|---|---|
| JP | 2022051782 | A | 4/2022 |
| TW | 201724412 | A | 7/2017 |
| TW | 201806005 | A | 2/2018 |
| WO | 2020105713 | W | 5/2020 |
| WO | 2022085722 | A1 | 4/2022 |

OTHER PUBLICATIONS

Taiwanese Office Action dated Apr. 22, 2025 in counterpart Taiwanese Patent Appln. No. 112124698.

Extended European Search Report issued on Nov. 22, 2023 in counterpart European Patent Appln. No. 23180893.2.

Korean Office Action dated May 13, 2025 in counterpart Korean Patent Appln. No. 10-2023-0081587.

Japanese Office Action dated May 18, 2026 in counterpart Japanese Patent Appln. No. 2022-114323.

Japanese Office Action dated Aug. 7, 2026 in counterpart Japanese Patent Appln. No. 2022-114323.

* cited by examiner

SEMICONDUCTOR DEVICE

BACKGROUND OF THE INVENTION

Field of the Invention

The present invention relates to a semiconductor device.

Description of the Related Art

International Publication No. 2020/105713 discloses a solid-state image sensor in which a plurality of semiconductor substrates are stacked.

Some embodiments of the present invention provide a technique advantageous in improving the characteristic of a semiconductor device in which a plurality of semiconductor substrates are stacked.

SUMMARY OF THE INVENTION

According to some embodiments, a semiconductor device in which a first semiconductor layer, a second semiconductor layer, and a third semiconductor layer are stacked, wherein the second semiconductor layer is arranged between the first semiconductor layer and the third semiconductor layer, a first structure comprising a first insulating layer is arranged between a first principal surface of the first semiconductor layer and a second principal surface of the second semiconductor layer, which face each other, a second structure comprising a second insulating layer is arranged between a third principal surface of the second semiconductor layer and a fourth principal surface of the third semiconductor layer, which face each other, in an orthographic projection to the fourth principal surface, a region where a plurality of elements are arranged in the third semiconductor layer is defined as a first region, and a region between the first region and a peripheral portion of the third semiconductor layer is defined as a second region, in the second region, an opening portion configured to expose a pad electrode arranged in the first structure is arranged, the opening portion extends through the third semiconductor layer, the second structure, and the second semiconductor layer from a fifth principal surface, of the third semiconductor layer, on an opposite side of the fourth principal surface to the pad electrode, and between the first insulating layer and the second insulating layer and between the first region and the opening portion, an insulator portion is arranged at the same height as the second semiconductor layer is provided.

Further features of the present invention will become apparent from the following description of exemplary embodiments (with reference to the attached drawings).

DESCRIPTION OF THE EMBODIMENTS

Figure 1:
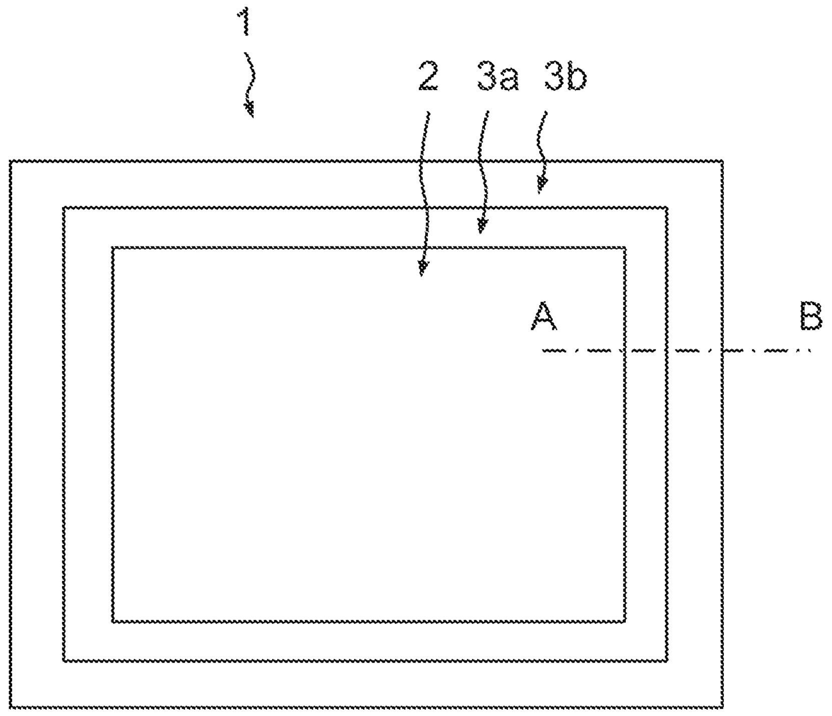
FIG. 1 is a plan view showing an example of the configuration of a semiconductor device according to the embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A semiconductor device and a manufacturing method and a semiconductor device according to an embodiment of the present disclosure will be described with reference to FIGS.

1 to 24A and 24B. FIG. 1 is a plan view showing the structure of a semiconductor device 1 according to the embodiment of the present invention. FIG. 1 shows the semiconductor device 1 corresponding to one chip. The semiconductor device 1 includes a region 2 and a region 3 (regions 3*a* and 3*b*) from the center of the chip to an end. The regions 2 and 3 will be described later.

Figure 2:
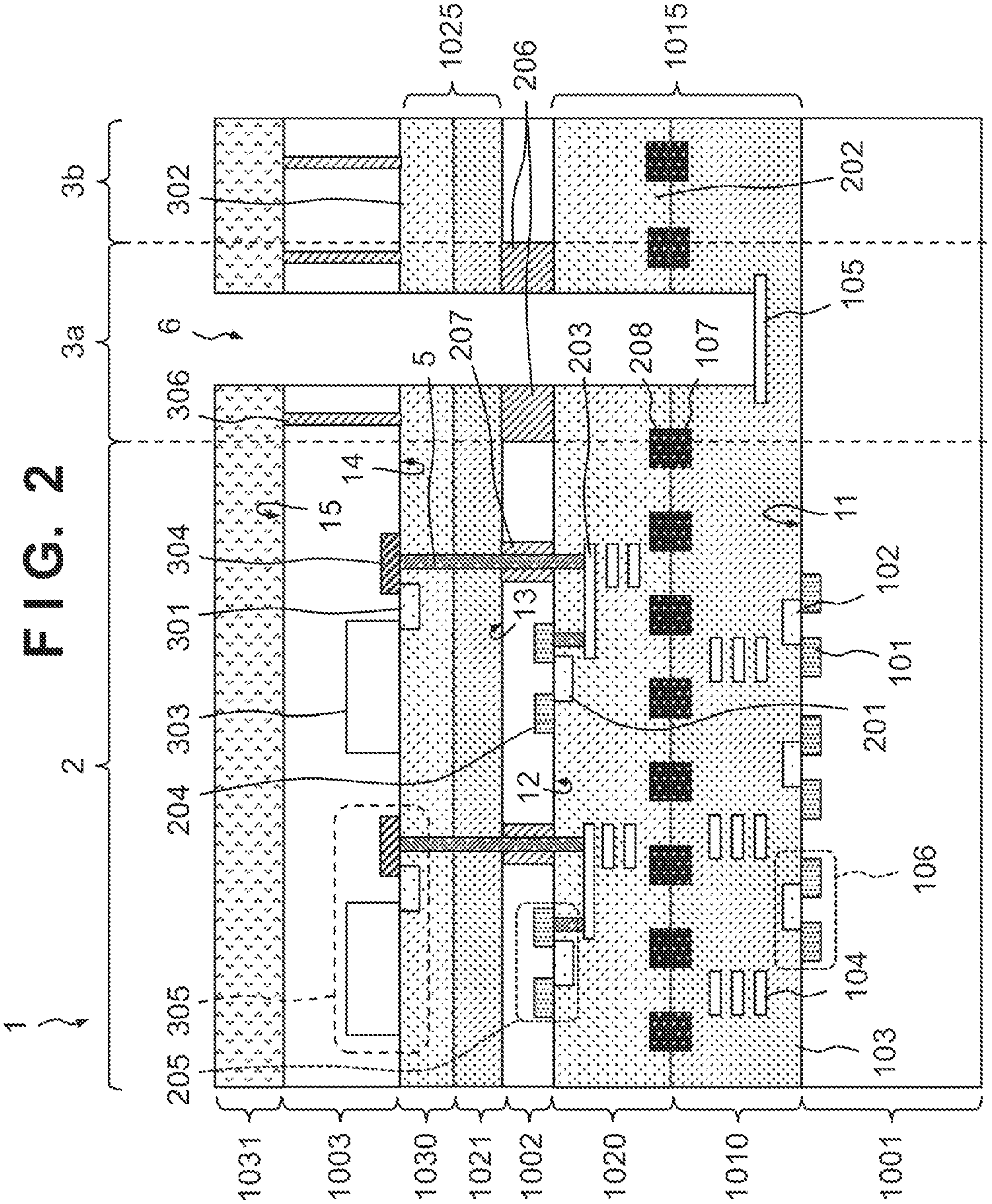
FIG. 2 is a sectional view showing an example of the configuration of the semiconductor device shown in FIG. 1.

FIG. 2 shows a sectional structure taken along a line A-B shown in FIG. 1. In the semiconductor device 1, a semiconductor layer 1001, a semiconductor layer 1002, and a semiconductor layer 1003 are stacked. As shown in FIG. 2, the semiconductor layer 1002 is arranged between the semiconductor layer 1001 and the semiconductor layer 1003. A structure 1015 including an insulating layer is arranged between a principal surface 11 of the semiconductor layer 1001 and a principal surface 12 of the semiconductor layer 1002, which face each other. The structure 1015 includes a structure 1010 formed on the principal surface 11 of the semiconductor layer 1001 when manufacturing the semiconductor device 1, and a structure 1020 formed on the principal surface 12 of the semiconductor layer 1002. A structure 1025 including an insulating layer is arranged between a principal surface 13 of the semiconductor layer 1002 and a principal surface 14 of the semiconductor layer 1003, which face each other. The structure 1025 includes a structure 1021 formed on the principal surface 13 of the semiconductor layer 1002 when manufacturing the semiconductor device 1, and a structure 1030 formed on the principal surface 14 of the semiconductor layer 1003. Here, the semiconductor layer 1001 includes the principal surface 11 and a principal surface (without a reference numeral), the semiconductor layer 1002 includes the principal surface 12 and the principal surface 13, and the semiconductor layer 1003 includes the principal surface 14 and a principal surface 15. For example, in the semiconductor layer 1001, the principal surface 11 is a surface on the opposite side of the principal surface (without a reference numeral). In the semiconductor layer 1002, the principal surface 12 is a surface on the opposite side of the principal surface 13. In the semiconductor layer 1003, the principal surface 14 is a surface on the opposite side of the principal surface 15. For example, the principal surface 11, the principal surface 12, and the principal surface 14 can also be referred to as obverse surfaces, and the principal surface of the semiconductor layer 1001 without a reference numeral, the principal surface 13, and the principal surface 15 can also be referred to as reverse surfaces. For example, the obverse surface can be said as a side to arrange the gate of a transistor or a side to arrange the structure 1015 or 1025.

As shown in FIG. 2, in an orthographic projection to the principal surface 14 of the semiconductor layer 1003, a region where a plurality of elements 305 are arranged in the semiconductor layer 1003 is defined as the region 2, and a region between the region 2 and the peripheral portion of the semiconductor layer 1003 (semiconductor device 1) is defined as the region 3. The region 3 will sometimes described divisionally as the region 3*a* where an insulator portion 206 (to be described later) is arranged in the orthographic projection to the principal surface 14 of the semiconductor layer 1003 and the region 3*b* arranged between the insulator portion 206 and the peripheral portion of the semiconductor device 1.

In the semiconductor layer 1001, diffusion layers 101, a shallow trench isolation (not shown), and the like are arranged in the region 2. In the structure 1010 arranged on the principal surface 11 of the semiconductor layer 1001, gate electrodes 102, an insulating layer 103, wiring layers and vias (to be referred to as wiring patterns 104 hereinafter), and the like are arranged in the region 2. Also, in the structure 1010, a pad electrode 105 and the like are arranged in the region 3. The diffusion layers 101 and the gate electrode 102 form a transistor 106. The transistor 106 and the pad electrode 105 can electrically be connected. The pad electrode 105 is arranged to electrically connect the semiconductor device 1 to an apparatus arranged outside the semiconductor device 1 and exchange a signal and the like. In addition, bonding pads 107 buried in the insulating layer 103 are arranged on the surface of the structure 1010.

In the semiconductor layer 1002, diffusion layers 204 and the like are arranged in the region 2. In the structure 1020, gate electrodes 201, an insulating layer 202, wiring layers and vias (to be referred to as wiring patterns 203 hereinafter), and the like are arranged in the region 2. The diffusion layers 204 and the gate electrode 201 form a transistor 205. The transistor 205 includes, for example, an amplification transistor configured to amplify a signal output from a photoelectric conversion element arranged in the semiconductor layer 1003 to be described later. The wiring pattern 203 and the gate electrode 201, and the wiring pattern 203 and the diffusion layer 204 are respectively electrically connected via conductive members included in the wiring pattern 203 arranged in a contact hole. In the structure 1020, bonding pads 208 buried in the insulating layer 202 are arranged on the surface facing the semiconductor layer 1001. The structure 1021 includes an insulating layer. The structure 1010 and the structure 1020 are bonded at the surfaces of the insulating layer 103 and the insulating layer 202 and at the surfaces of the bonding pads 107 and the bonding pads 208, thereby forming the structure 1015.

Also, in the semiconductor layer 1002, insulator portions 206 and 207 extending through the semiconductor layer 1002 from the principal surface 12 to the principal surface 13 are arranged. Here, the insulator portion 206 indicates a member arranged in the region 3*a*, and the insulator portion 207 indicates a member arranged in the region 2. The insulator portion 206 and the insulator portions 207 can simultaneously be formed. The insulator portion 206 and the insulator portions 207 may be made of the same material.

In the semiconductor layer 1003, photodiodes 303, floating diffusions 304, and the like are arranged in the region 2. In the structure 1030, gate electrodes 301, an insulating layer 302, and the like are arranged in the region 2. The gate electrode 301, the photodiode 303, and the floating diffusion 304 form a photoelectric conversion element. The plurality of elements 305 arranged in the semiconductor layer 1003 thus include photoelectric conversion elements. The photoelectric conversion elements can be arranged to form a plurality of rows and a plurality of columns in the region 2 of the semiconductor layer 1003. In other words, a region where a plurality of photoelectric conversion elements are arranged in a matrix can be the region 2. In addition, a so-called peripheral region arranged around the region 2 where the plurality of photoelectric conversion elements are arranged in a matrix can be the region 3. In the semiconductor layer 1003, insulator portions 306 extending through the semiconductor layer 1003 from the principal surface 14 to the principal surface 15 are arranged at least in the regions 3*a* and 3*b*. For example, the plurality of elements 305 arranged in the semiconductor layer 1003 include photoelectric conversion elements. Next, an element circuit including the transistor 205 that amplifies a signal output from the photoelectric conversion element arranged in the semiconductor layer 1003 is arranged on the principal surface 12 of the semiconductor layer 1002. Furthermore, a driving circuit including the transistor 106 configured to drive the plurality of elements 305 arranged in the semiconductor layer 1003 and the element circuit arranged in the semiconductor layer 1002 may be arranged on the principal surface 11 of the semiconductor layer 1001.

A structure 1031 including optical elements is arranged on the principal surface 15 on the opposite side of the principal surface 14 of the semiconductor layer 1003 with the elements 305 formed therein. Optical elements such as a light-shielding layer, an intra-layer lens, a color filter, and a microlens may be arranged in the structure 1031. These optical elements may be formed with respect to the insulator portion 306 formed in the region 3*b* as the reference point of alignment. The structure 1021 and the structure 1030 are bonded at the surfaces of the insulating layers, thereby forming the structure 1025.

An element such as the transistor 205 arranged in the semiconductor layer 1002 and an element such as the element 305 arranged in the semiconductor layer 1003 can electrically be connected via a plug electrode 5 and the wiring pattern 203. As described above, the structure 1015 includes the wiring patterns 203 arranged in the insulating layer 202. The plug electrode 5 configured to connect the photoelectric conversion element (element 305) and the wiring pattern 203 is arranged extending through the structure 1025 and the semiconductor layer 1002. In an orthographic projection to the principal surface 13 of the semiconductor layer 1002, the insulator portion 207 surrounding the plug electrode 5 and extending through the semiconductor layer 1002 from the principal surface 12 to the principal surface 13 is arranged in the semiconductor layer 1002. The plug electrode 5 is formed in the insulator portion 207 in the semiconductor layer 1002. The insulating characteristic between the semiconductor layer 1002 and the plug electrode 5 is thus held. The semiconductor layer 1002 can be formed thin, considering the processing stability and resistance stability of a through via in which the plug electrode 5 is arranged. An element such as the transistor 106 arranged in the semiconductor layer 1001 and an element such as the transistor 205 arranged in the semiconductor layer 1002 are electrically be connected via the bonding pad 107 and the bonding pad 208.

In the region 3*a*, an opening portion 6 that extends through the semiconductor layer 1003, the structure 1025, and the semiconductor layer 1002 from the principal surface 15 of the semiconductor layer 1003 on the opposite side of the principal surface 14 of the semiconductor layer 1003 to the pad electrode 105 arranged in the structure 1015 and exposes the pad electrode 105 is arranged. To expose the pad electrode 105, the opening portion 6 extends through the structure 1031 as well. In the orthographic projection to the principal surface 13 of the semiconductor layer 1002, the insulator portion 206 extending through the semiconductor layer 1002 from the principal surface 12 to the principal surface 13 is arranged between the region 2 of the semiconductor layer 1002 and the opening portion 6. It is necessary to hold the insulating characteristic between the opening portion 6 and the semiconductor layer 1002 with the transistors 205 arranged therein. For example, a metal wire connected to the pad electrode 105 configured to connect the semiconductor device 1 to an apparatus outside the semiconductor device 1 is arranged in the opening portion 6. Even if this wire comes into contact with the wall surface of the opening portion 6, the insulating characteristic between the wire and the semiconductor layer 1002 needs to be held. When the insulator portion 206 is arranged between the region 2 and the opening portion 6, the insulating characteristic between the wire and the semiconductor layer 1002 can be held. That is, an operation error of an element such as the transistor 205 arranged in the semiconductor layer 1002, which is caused by, for example, a signal flowing through the wire, is suppressed, and a characteristic such as the reliability of the semiconductor device 1 improves.

In the orthographic projection to the principal surface 13 of the semiconductor layer 1002, the insulator portion 206 may be arranged to surround the opening portion 6. When the insulator portion 206 surrounds the opening portion 6, the insulating characteristic between the region 2 of the semiconductor layer 1002 and the opening portion 6 can more reliably be held. Also, as shown in FIG. 2, the insulator portion 206 may form the wall surface of a portion of the opening portion 6 extending through the semiconductor layer 1002. The opening portion 6 may be formed to extend through the insulator portion 206 provided in the semiconductor layer 1002, and details of the manufacturing method will be described later. However, the present invention is not limited to this, and the insulator portion 206 may be apart from the opening portion 6 and may not form the wall surface of the opening portion 6, like the insulator portion 306 arranged in the semiconductor layer 1003.

Similarly, in the semiconductor layer 1003, the insulator portion 306 is arranged between the region 2 and the opening portion 6. In an orthographic projection to the principal surface 15 of the semiconductor layer 1003, the insulator portion 306 may be arranged to surround the opening portion 6. The insulating characteristic between the opening portion 6 and the region 2 of the semiconductor layer 1003 can thus be held.

As described above, the semiconductor layer 1002 can be thinned. Hence, the mechanical strength of the semiconductor layer 1002 can lower. From the viewpoint of the mechanical strength of the semiconductor layer 1002, it is advantageous in terms of strength when the width of the region 3*a* of the region 3, where the insulator portion 206 is arranged, is as narrow as possible. For example, in the orthographic projection to the principal surface 13 of the semiconductor layer 1002, the semiconductor layer 1002 (semiconductor device 1) can have a rectangular shape. Hence, the width of the region 3*a* may be, for example, 1/100 or less of the length of the short side of the semiconductor layer 1002 (semiconductor device 1). The arrangement of the opening portion 6 complies with the arrangement of the insulator portion 206.

The above description has been made using a so-called photoelectric conversion device in which the element 305 arranged in the semiconductor layer 1003 includes a photoelectric conversion element as an example of the semiconductor device 1. However, the present disclosure is not limited to this, and a similar effect to that described above can be obtained even in another semiconductor device in which three semiconductor layers are stacked. For example, a memory or the like may be mounted in each semiconductor layer.

Figure 3:
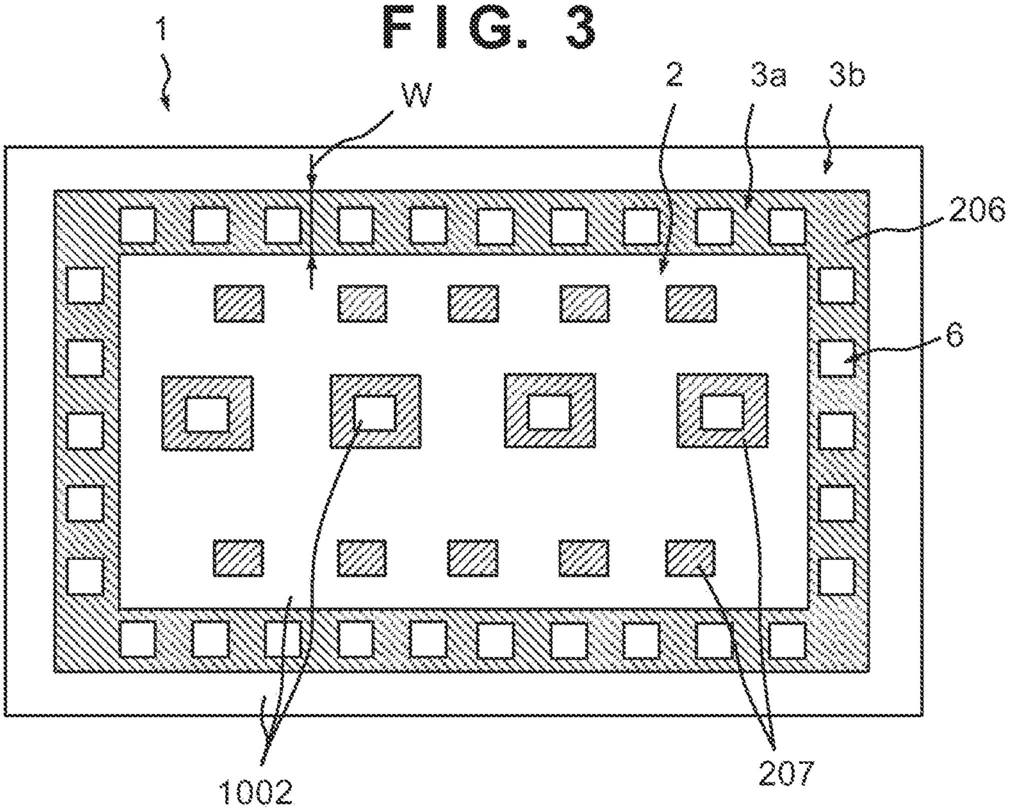
FIG. 3 is a plan view showing an example of the configuration of the semiconductor device shown in FIG. 1.

FIG. 3 is a plan view showing the principal surface 13 of the semiconductor layer 1002. The plan view shown in FIG. 3 focuses the arrangement of the insulator portions 206 and 207, and the plug electrode 5 and the like are omitted. As described above, the semiconductor device 1 includes the region 2, the region 3*a*, and the region 3*b* from the center of the chip to the peripheral portion. In the region 3*a*, the insulator portion 206 extending through the semiconductor layer 1002 is arranged. Also, the opening portions 6 configured to expose the pad electrodes 105 are arranged to be surrounded by the insulator portion 206.

In the configuration shown in FIG. 3, the portion of the semiconductor layer 1002 arranged in the region 2 and the portion arranged in the region 3*b* are separated by the insulator portion 206. Also, the insulator portions 207 are provided in the portion of the semiconductor layer 1002 arranged in the region 2.

As shown in FIG. 3, the region 2 of the semiconductor layer 1002 is surrounded by the insulator portion 206 extending through the semiconductor layer 1002. In the orthographic projection to the principal surface 13 of the semiconductor layer 1002, it can be said that the insulator portion 206 is arranged continuously for a plurality of opening portions 6. For this reason, the insulator portion 206 always exists in a path from the region 2 to the region 3*b*. When the insulator portion 206 is arranged in this way, it is possible to hold the insulating characteristic between the opening portions 6 and the portion of the semiconductor layer 1002 arranged in the region 2 while keeping the degree of freedom concerning the arrangement of the opening portions 6.

As described above, from the viewpoint of the mechanical strength of the semiconductor layer 1002, it is advantageous in terms of strength when the width of the region 3*a* of the region 3, where the insulator portion 206 is arranged, is as narrow as possible. Here, the width of the region 3*a* is represented by a length W shown in FIG. 3. Although the dimensions are different for the descriptive convenience in FIG. 3, the width of the region 3*a* where the insulator portion 206 is arranged may be, for example, 1/100 or less of the short side width of the chip of the semiconductor device 1, as described above. Since the arrangement interval between the plurality of opening portions 6 can be made small by this configuration, microfabrication is possible.

Figure 4:
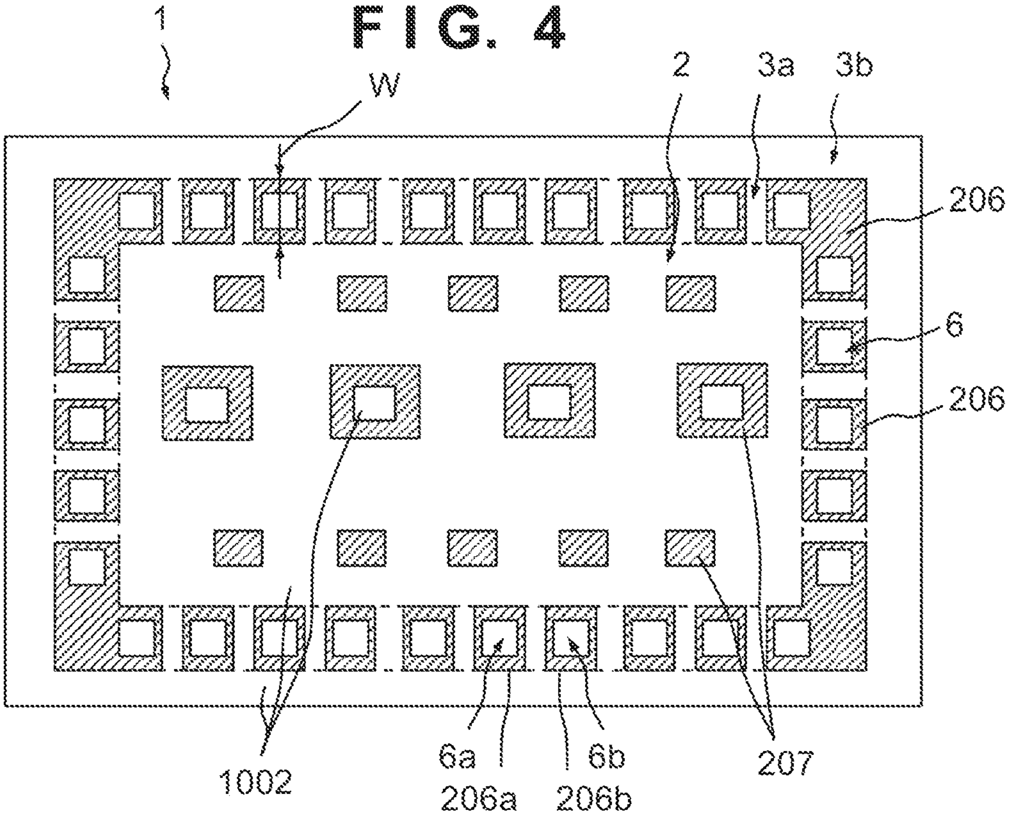
FIG. 4 is a plan view showing an example of the configuration of the semiconductor device shown in FIG. 1.

FIG. 4 is a view showing a modification of the plan view of the principal surface 13 of the semiconductor layer 1002 shown in FIG. 3. Even in the configuration shown in FIG. 4, the plurality of opening portions 6 are arranged in correspondence with the plurality of pad electrodes 105, like the configuration shown in FIG. 3. Here, of the plurality of opening portions, an opening portion 6*a* and an opening portion 6*b*, which are adjacent to each other, will be focused. In the orthographic projection to the principal surface 13 of the semiconductor layer 1002, the insulator portion 206 includes a portion 206*a* surrounding the opening portion 6*a* and a portion 206*b* surrounding the opening portion 6*b*, and a part of the semiconductor layer 1002 is arranged between the portion 206*a* and the portion 206*b*. That is, the insulator portion 206 is not continuously arranged but intermittently arranged in accordance with the opening portions 6, unlike the configuration shown in FIG. 3. However, since the insulator portions 206 are arranged to surround the opening portions 6, the insulating characteristic between the opening portions 6 and the portion of the semiconductor layer 1002 arranged in the region 2 can be held.

As shown in FIG. 4, the insulator portion 206 is intermittently arranged. Hence, the portion of the semiconductor layer 1002 arranged in the region 2 and the portion (for example, the region 3*b*) of the semiconductor layer 1002 arranged between the plurality of opening portions 6 and the peripheral portion of the semiconductor layer 1002 continue via the portions of the semiconductor layer 1002 in the region 3*a* where the insulator portion 206 is not arranged. In the configuration shown in FIG. 4, the semiconductor layer 1002 in the region 2 and that in the region 3*b* are not separated by the insulator portion 206, unlike the configuration shown in FIG. 3. Hence, the mechanical strength of the semiconductor layer 1002 can be improved as compared to the configuration shown in FIG. 3.

In the configuration shown in FIG. 4 as well, it is advantageous when the width (length W) of the region 3*a* of the region 3, where the insulator portion 206 is arranged, is as narrow as possible. Hence, the width of the region 3*a* may be, for example, 1/100 or less of the length of the short side of the semiconductor layer 1002 (semiconductor device 1). At each corner portion, two opening portions 6 are arranged in one insulator portion 206. Even in other portions, two or more opening portions 6 may be arranged in one insulator portion 206. It is possible to improve the mechanical strength while implementing a finer configuration.

Figure 5:
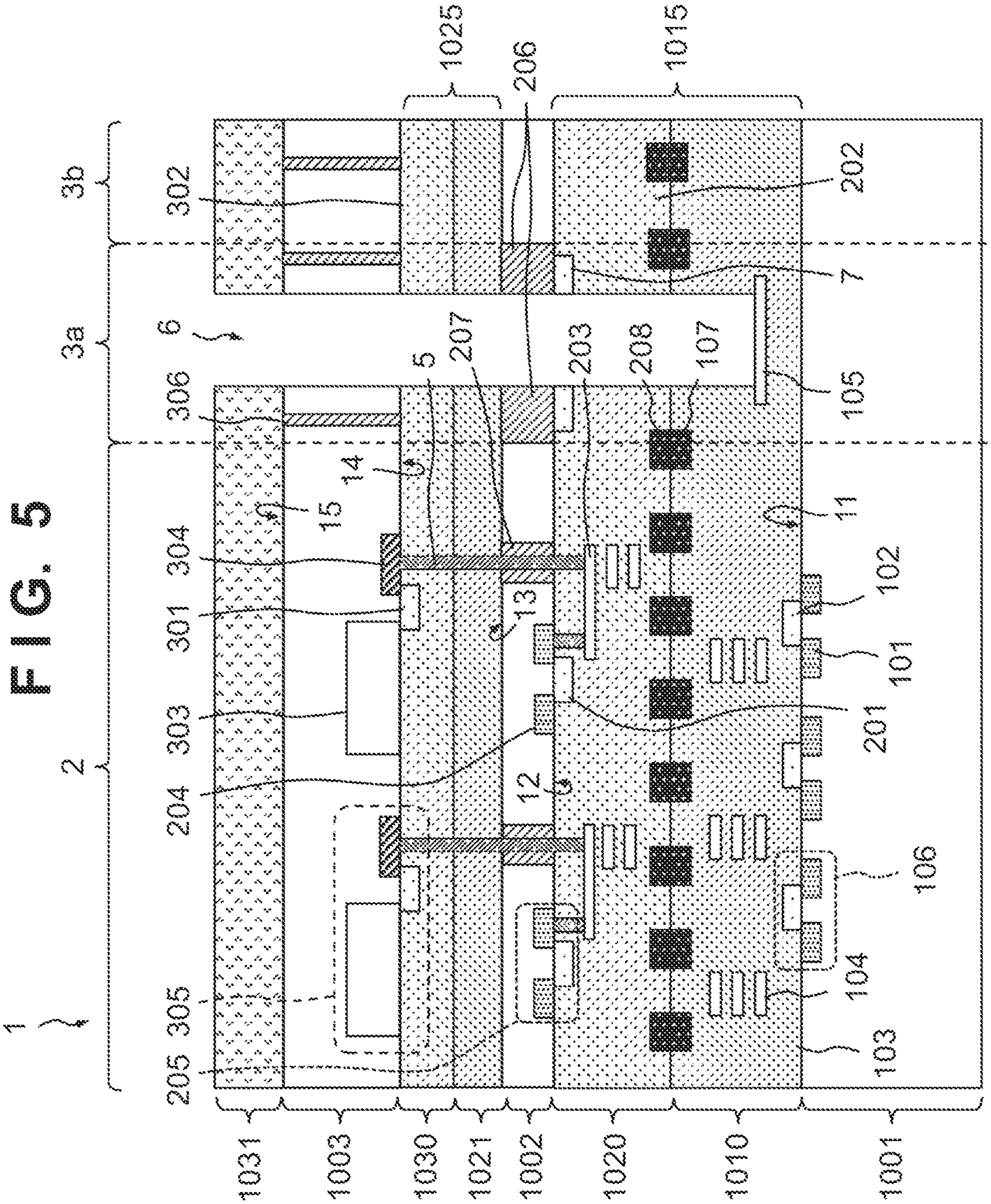
FIG. 5 is a sectional view showing an example of the configuration of the semiconductor device shown in FIG. 1.

FIG. 5 is a view showing a modification of the sectional view of the semiconductor device 1 shown in FIG. 2. In the semiconductor device 1 shown in FIG. 5, a member 7 using a material different from the insulating layer 202 and the insulator portion 206 is arranged in a portion of the structure 1015 in contact with the insulator portion 206. The rest of the configuration may be similar to the configuration shown in FIG. 2, and the member 7 will be described below in detail.

The member 7 may be made of the same material as the gate electrode 201 of the transistor 205 arranged on the principal surface 12 of the semiconductor layer 1002. For example, when forming the gate electrode 201 of the transistor 205 on the principal surface 12 of the semiconductor layer 1002, one material layer is etched, thereby forming the gate electrode 201 and the member 7. As the material of the member 7, a material whose etching rate is lower than that of the insulator portion 206 under the same etching conditions is used. For example, if silicon oxide is used as the insulator portion 206, polycrystalline silicon, amorphous silicon, single crystal silicon, or the like can be selected as the gate electrode 201 and the member 7.

In the orthographic projection to the principal surface 13 of the semiconductor layer 1002, the opening portion 6 is formed inside the member 7 and the insulator portion 206. Hence, since the periphery of the opening portion 6 is surrounded by the insulator portion 206 in the semiconductor layer 1002, the insulating characteristic between the opening portion 6 and the semiconductor layer 1002 can be held. Also, in an etching step of forming the opening portion 6, the insulator portion 206 can be etched using the member 7 as an etching stopper. When the etching is temporarily stopped on the member 7, etching of the pad electrode 105 caused by the variation in the etching amount can be suppressed.

Figure 6:
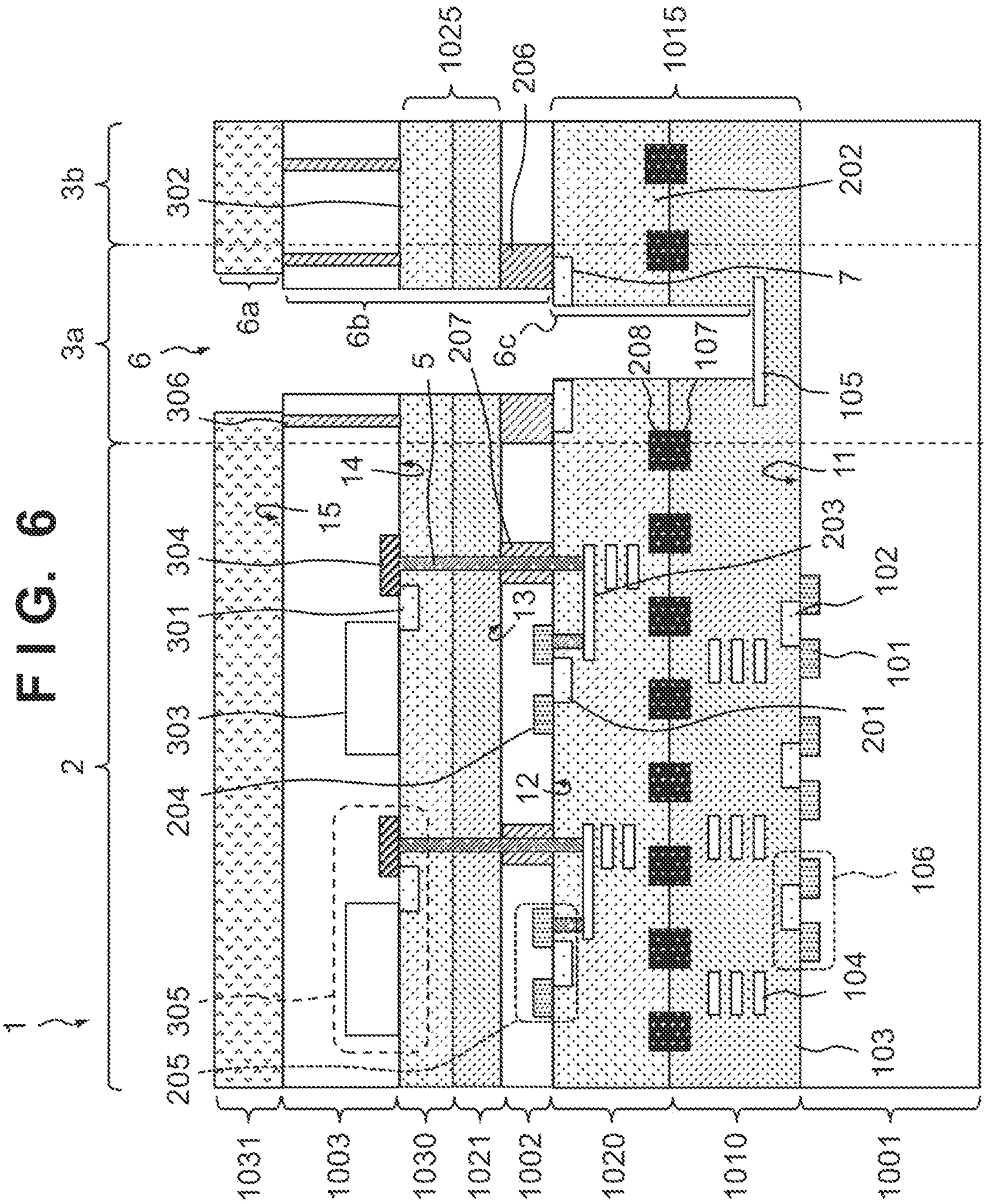
FIG. 6 is a sectional view showing an example of the configuration of the semiconductor device shown in FIG. 1.

FIG. 6 is a view showing a modification of the sectional view of the semiconductor device 1 shown in FIG. 5. In the configurations shown in FIGS. 2 and 5, the opening portion 6 can be formed using, for example, one mask pattern arranged on the structure 1031. On the other hand, in the configuration shown in FIG. 6, the opening portion 6 is divided into opening portions 6*a*, 6*b*, and 6*c* having different opening sizes. The opening portions 6*a*, 6*b*, and 6*c* shown in FIG. 6 can be formed using, for example, the following steps.

The opening portion 6*a* is formed using a first mask pattern. A large etching selectivity can be obtained between the structure 1031 including optical elements such as an intra-layer lens, a color filter, and a microlens and the semiconductor layer 1003 made of a semiconductor such as silicon. For this reason, when forming the opening portion 6*a*, the etching can accurately be stopped on the semiconductor layer 1003.

Next, the opening portion 6*b* is formed using a second mask pattern. The second mask pattern is formed such that an opening is arranged inside the first mask pattern. As described above, a large etching selectivity can be obtained between the insulator portion 206 and the member 7. For this reason, in the opening portion 6*b*, the etching can accurately be stopped on the member 7. By this step, in the orthographic projection to the principal surface 15 of the semiconductor layer 1003, the portion (opening portion 6*b*) of the opening portion 6 extending through the semiconductor layer 1003, the structure 1025, and the semiconductor layer 1002 is arranged inside the portion (opening portion 6*a*) of the opening portion 6 arranged in the structure 1031.

After the formation of the opening portions 6*a* and 6*b*, the opening portion 6*c* is formed using a third mask pattern. The third mask pattern is formed such that an opening is arranged inside the second mask pattern. If the pad electrode 105 is provided in the structure 1020 formed on the semiconductor layer 1002 in the structure 1015, the opening portion 6*c* is opened only to the structure 1020. If the pad electrode 105 is provided in the structure 1010 formed on the semiconductor layer 1001 in the structure 1015, the opening portion 6*c* is opened to the structure 1020 and the structure 1010. By this step, in the orthographic projection to the principal surface 15 of the semiconductor layer 1003, the portion (opening portion 6*c*) of the opening portion 6 arranged in the structure 1015 is arranged inside the portion (opening portion 6*b*) of the opening portion 6 extending through the semiconductor layer 1003, the structure 1025, and the semiconductor layer 1002.

In this way, the opening portion 6 is formed using three etching steps. Hence, as compared to a case where the opening portion 6 is formed by one etching step, excessive etching of the pad electrode 105 caused by the variation of etching can be suppressed. In addition, since the opening portion 6*a* is larger than the opening portion 6*c*, wire bondings can easily be formed.

Figure 7:
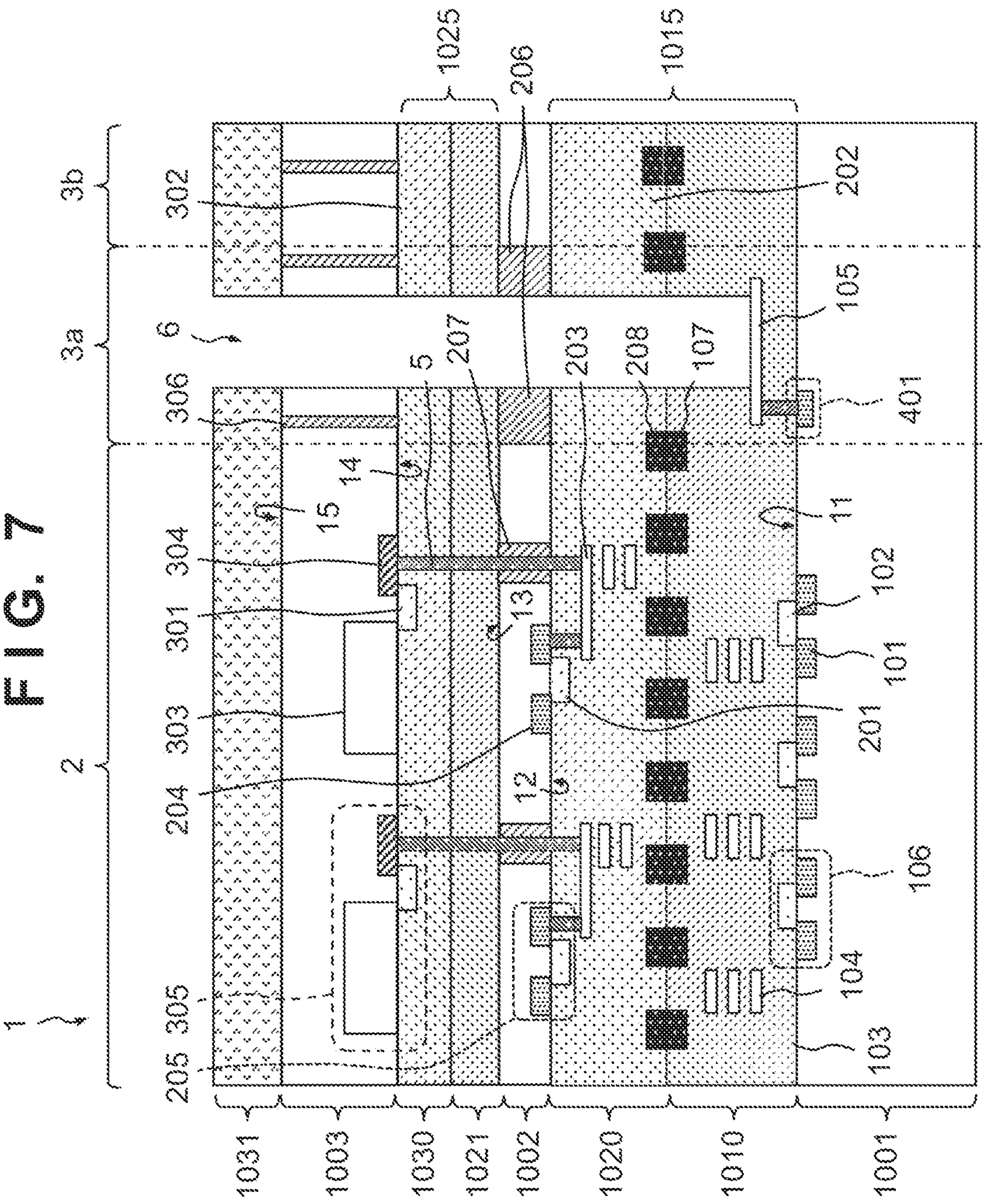
FIG. 7 is a sectional view showing an example of the configuration of the semiconductor device shown in FIG. 1.

FIG. 7 is a view showing a modification of the sectional view of the semiconductor device 1 shown in FIG. 2. In the configuration shown in FIG. 7, a protection element 401 is arranged on the pad electrode 105 via the wiring pattern 104. The rest of the configuration may be similar to the configuration shown in FIG. 2, and the protection element 401 will mainly be described here.

The pad electrode 105 is connected to an apparatus arranged outside the semiconductor device 1. For example, a metal wire is bonded to the pad electrode 105. When bonding the metal wire, a surge voltage may be input to give, for example, electrical damage to the transistor 106. In addition, noise may be mixed from the external apparatus via the wire, and the semiconductor device 1 may cause an operation error. When the protection element 401 is arranged on the pad electrode 105, the electrical damage or noise mixing can be reduced. In the sectional structure, the protection element 401 may be arranged immediately under the pad electrode 105.

Figure 8C:
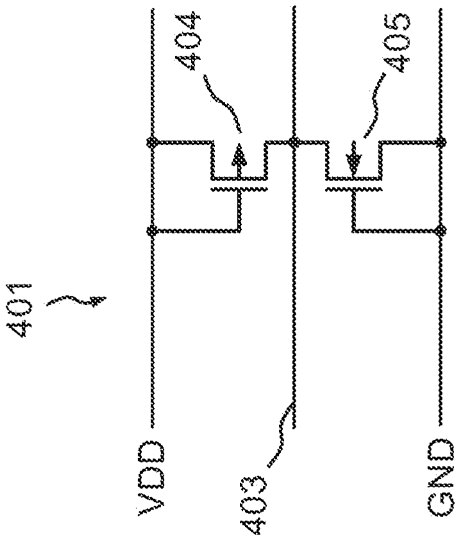
FIGS. 8A to 8C are circuit diagrams showing examples of the configuration of a protection element shown in FIG. 7.
Figure 8B:
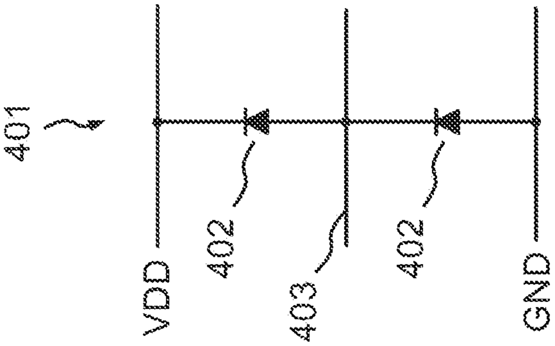
Figure 8A:
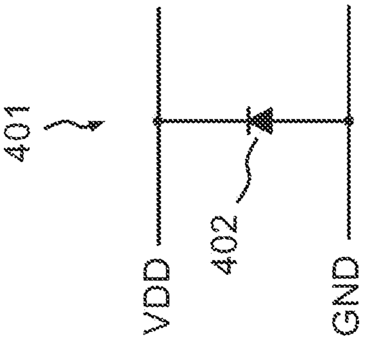

FIGS. 8A to 8C are circuit diagrams showing examples of the configuration of the protection element 401. FIG. 8A shows an example in which a protection diode 402 is arranged between a power supply potential VDD and a potential GND. The protection element 401 suppresses electrical damage or noise mixing to the power supply potential VDD and the potential GND. FIG. 8B shows an example in which the protection diodes 402 are arranged between a signal line 403 and the power supply potential VDD and between the signal line 403 and the potential GND. Electrical damage or noise mixing to an element connected to the signal line 403, for example, the transistor 106 is suppressed. FIG. 8C shows an example of the protection element 401 in which a p-type transistor 404 and an n-type transistor 405, each having a gate electrode grounded, are arranged in place of the protection diodes 402 in FIG. 8B. The configuration of the protection element 401 is not limited to the configuration examples shown in FIGS. 8A to 8C, and an appropriate configuration can be used as needed in accordance with a circuit configuration arranged in the semiconductor device 1.

Figure 9:
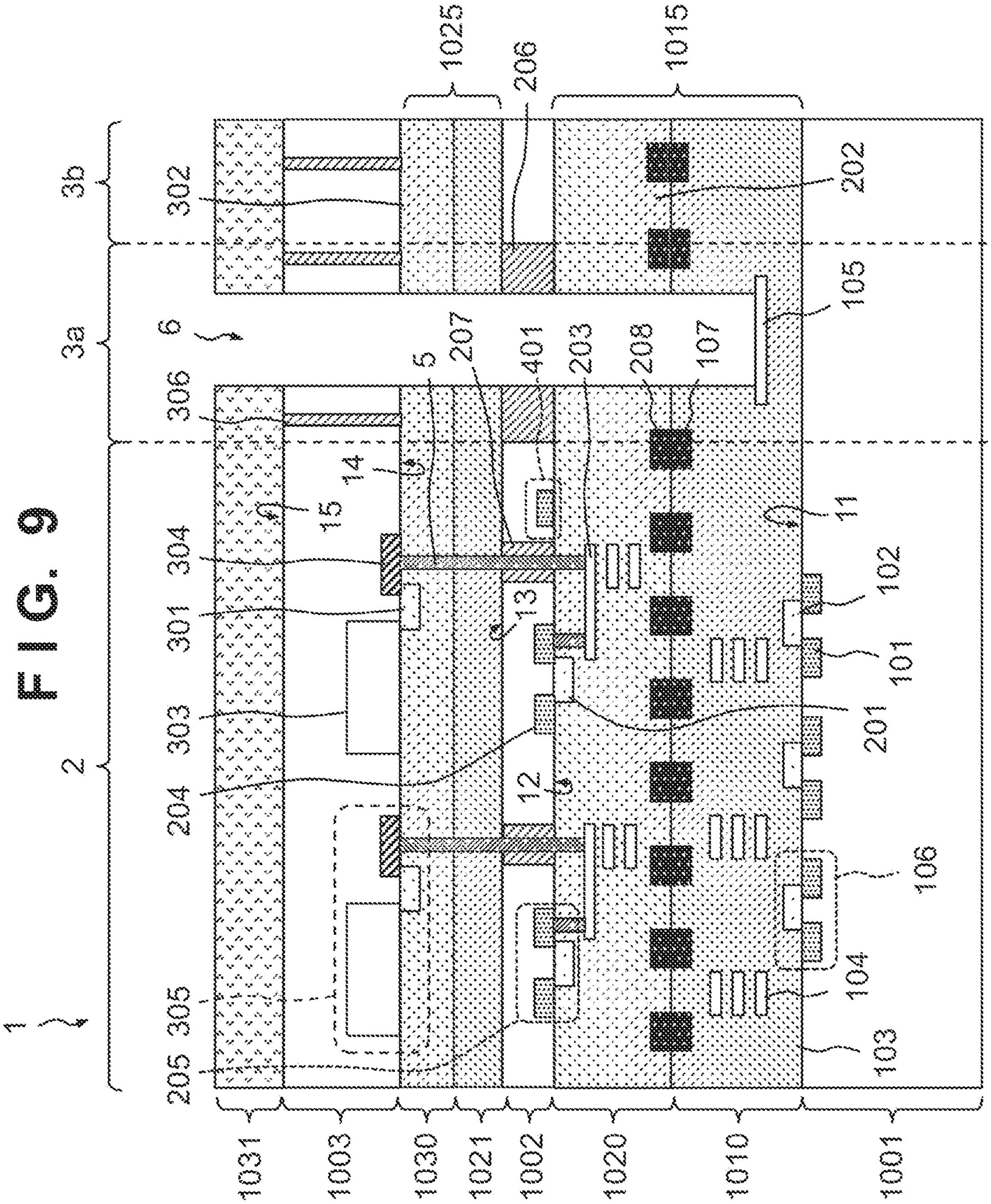
FIG. 9 is a sectional view showing an example of the configuration of the semiconductor device shown in FIG. 1.

FIG. 9 shows an example in which the protection element 401 is arranged in the semiconductor layer 1002. To the semiconductor device 1, a power supply potential or a control signal of the semiconductor device 1 is supplied from an external apparatus via the pad electrode 105. For example, the power supply potential is sometimes connected to the transistor 205 arranged in the semiconductor layer 1002 from an external apparatus via the pad electrode 105, the bonding pad 107, the bonding pad 208, and the like. That is, electrical damage or noise mixing from the external apparatus to the transistor 205 may occur. Hence, the protection element 401 may be arranged in the connection path from the external apparatus to the transistor 205. When the protection element 401 is arranged in the semiconductor layer 1002, like the configuration shown in FIG. 9, electrical damage or noise mixing to the transistor 205 can be suppressed. Here, in FIG. 9, the protection element 401 is provided in the region 2. Depending on the shape of the insulator portion 206 in the region 3, the protection element 401 may be provided in the region 3. For example, the protection element 401 may be arranged between the plurality of insulator portions 206 shown in FIG. 4.

The protection element 401 may be arranged in the semiconductor layer 1001 in which the pad electrode 105 is formed on the principal surface 11, or may be arranged in another semiconductor layer 1002 or 1003. A plurality of protection elements 401 may be arranged in correspondence with one pad electrode 105. In this case, the protection elements 401 may be arranged in one of the semiconductor layers 1001 to 1003, or may be arranged in a plurality of semiconductor layers. For example, in correspondence with one pad electrode 105, the protection elements 401 may be arranged in the semiconductor layer 1001 and the semiconductor layer 1002, in the semiconductor layer 1002 and the semiconductor layer 1003, or in each of the semiconductor layers 1001 to 1003. Note that in the region 3 including the portion under the pad electrode 105, not only the protection element 401 but also a member made of the material of an insulator serving as an isolation structure or the gate electrode of a transistor may be provided. That is, a pattern formed by an insulator or a pattern formed by polycrystalline silicon may be arranged. This can improve the uniformity of the pattern when forming the semiconductor device 1.

A manufacturing method of the semiconductor device 1 will be described next with reference to FIGS. 10A to 10C and FIGS. 15A and 15B. Here, a description will be made using, as an example, the semiconductor device 1 having the configuration shown in FIG. 6 described above.

Figures 10A, 10B, 10C:
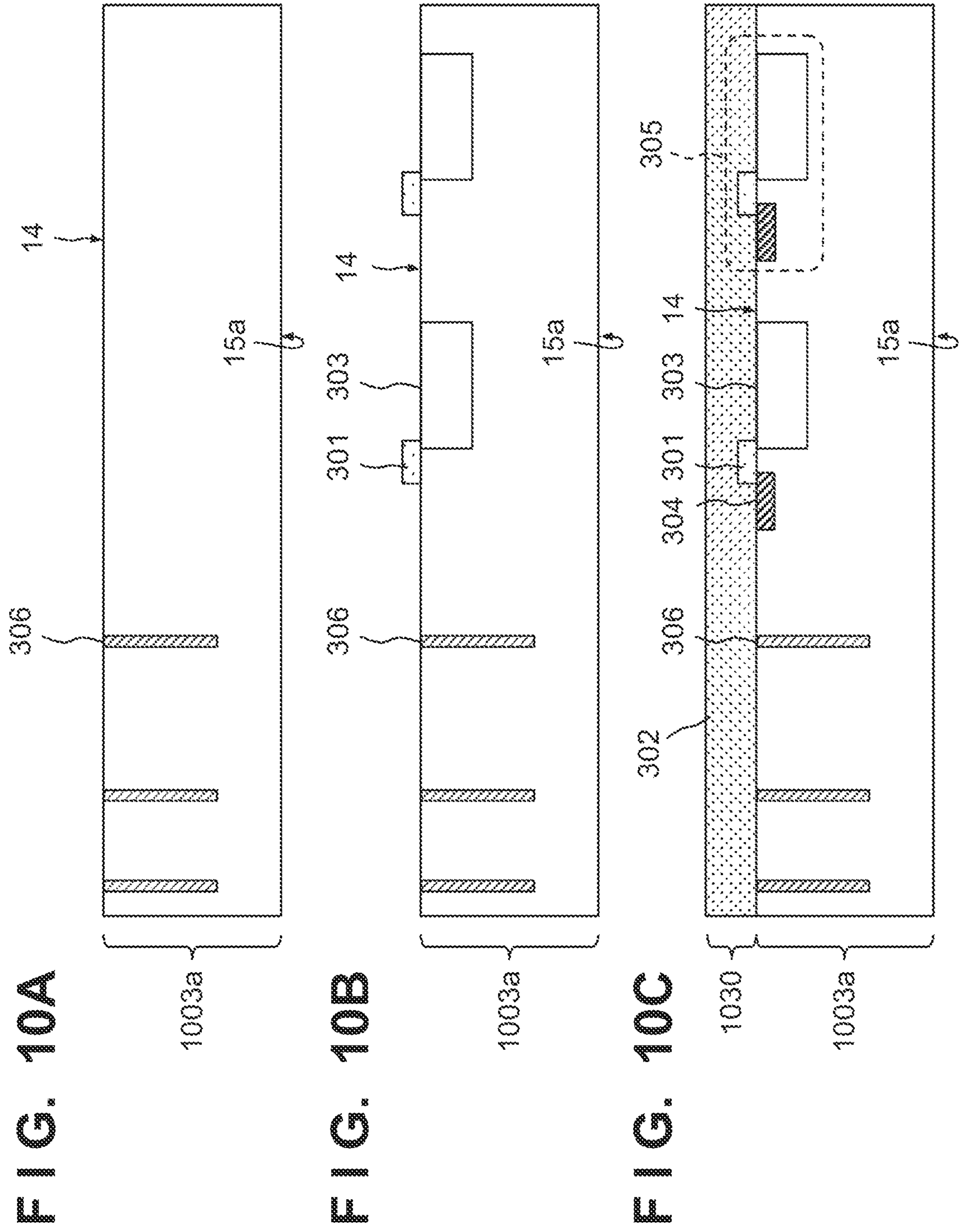
FIGS. 10A to 10C are sectional views showing an example of the manufacturing method of the semiconductor device shown in FIG. 6.

A semiconductor substrate 1003*a* that is a prospective semiconductor layer 1003 is prepared. The semiconductor substrate 1003*a* may be, for example, a silicon substrate. As shown in FIG. 10A, insulator portions 306 are formed in regions that are prospective regions 3*a* and 3*b* using a photolithography step and an etching step. At the point of time shown in FIG. 10A, the insulator portion 306 has the shape of a Deep Trench Isolation (DTI) formed in the semiconductor substrate 1003*a*. After the formation of the DTI, an isolation structure such as a Shallow Trench Isolation (STI) may be formed (not shown). Here, the semiconductor layer 1003 before thinning by the following steps will be referred to as the semiconductor substrate 1003*a* for the sake of convenience. However, the thinned semiconductor layer 1003 may be referred to as a "semiconductor substrate", or the semiconductor substrate 1003*a* before thinning may be referred to as a "semiconductor layer". The semiconductor layer 1003 and the semiconductor substrate 1003*a* indicate substantially the same member. This also applies to a semiconductor substrate 1002*a* to be described later.

Next, as shown in FIG. 10B, photodiodes 303 are formed using the photolithography step and an ion implantation step. Also, after a gate insulating film (not shown) and a polycrystalline silicon film are deposited, gate electrodes 301 are formed using the photolithography step and the etching step.

After the formation of the gate electrodes 301, as shown in FIG. 10C, floating diffusions 304 are formed using the photolithography step and the ion implantation step. As described above, the photodiode 303, the gate electrode 301, and the floating diffusion 304 form a photoelectric conversion element. Next, an insulating layer 302 made of silicon oxide or the like is formed. A structure 1030 is thus formed on a principal surface 14 of the semiconductor substrate 1003*a*.

Figure 11A:
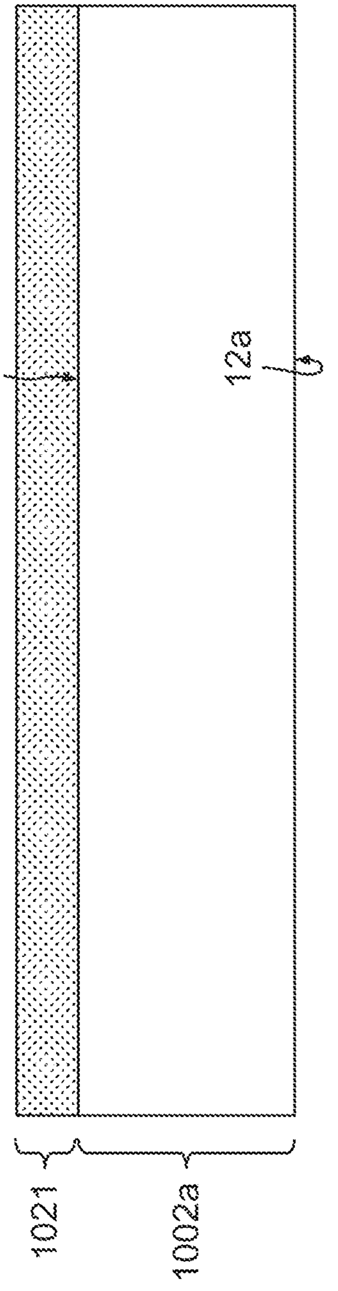
FIGS. 11A to 11D are sectional views showing an example of the manufacturing method of the semiconductor device shown in FIG. 6.

A semiconductor layer 1002 is processed from the semiconductor substrate 1002*a*. The semiconductor substrate 1002*a* may be, for example, a silicon substrate. As shown in FIG. 11A, a structure 1021 made of silicon oxide or the like is formed on a principal surface 13 of the semiconductor substrate 1002*a*.

Figure 11B:
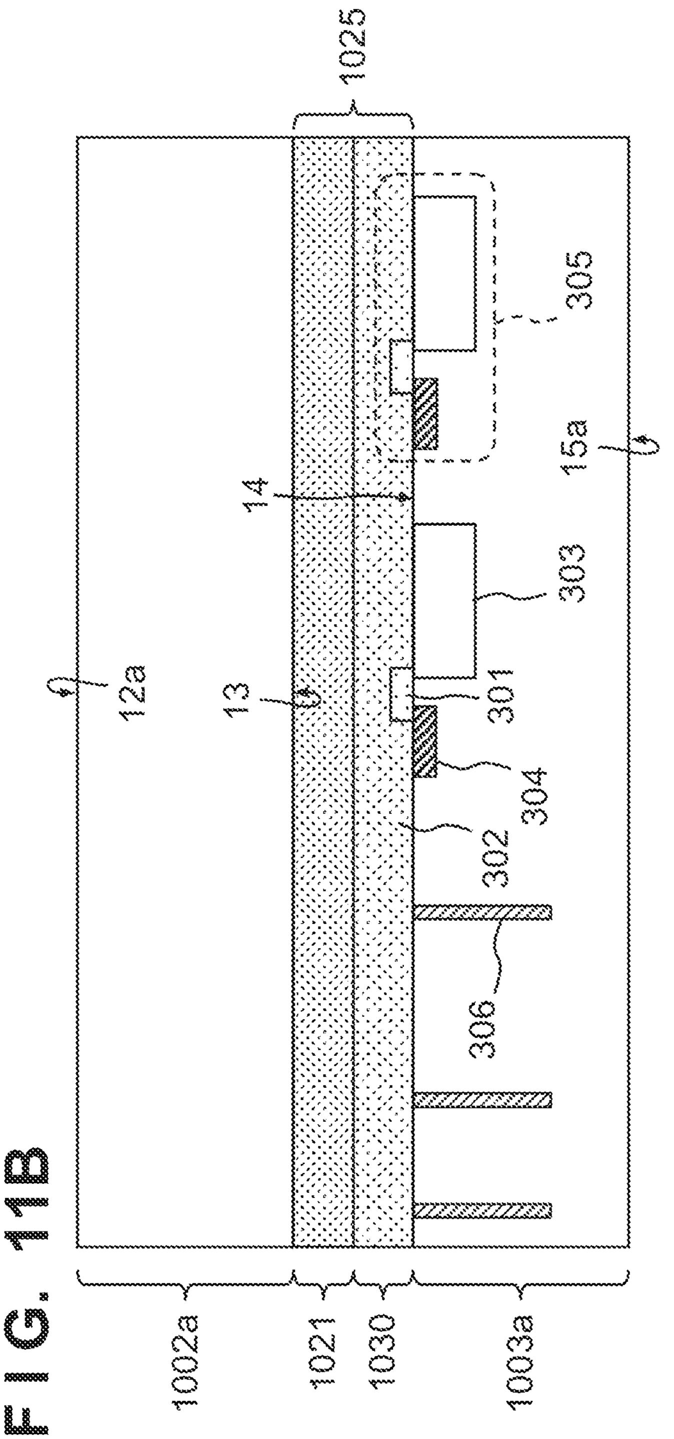

Next, as shown in FIG. 11B, the structure 1021 and the structure 1030 are bonded using the surface of the structure 1021 and the surface of the structure 1030 as bonding surfaces. As for the combination of the surface of the structure 1021 and the surface of the structure 1030, for example, both may be made of the same material such as silicon oxide or silicon nitride, or different materials may be combined. By this step, a structure 1025 including the structure 1021 and the structure 1030 is formed, and the semiconductor layer 1002 (semiconductor substrate 1002*a*) and the semiconductor layer 1003 (semiconductor substrate 1003*a*) are stacked. As the method of bonding the structure 1021 and the structure 1030, so-called room temperature bonding can be used, in which the surfaces of the structures 1021 and 1030 are activated by plasma irradiation and then bonded. However, the method is not limited to this. For example, the structure 1021 and the structure 1030 may be bonded via a bonding member such as an adhesive.

Figure 11C:
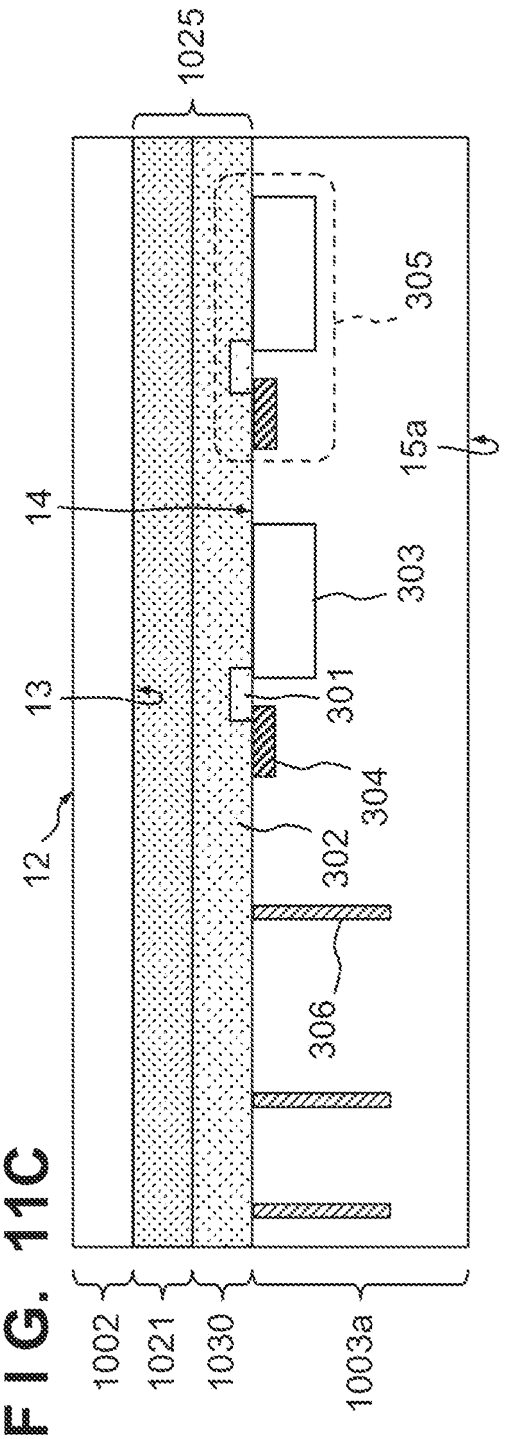

After the structure 1021 and the structure 1030 are bonded, as shown in FIG. 11C, the semiconductor substrate 1002*a* is thinned from the side of a principal surface 12*a* of the semiconductor substrate 1002*a*, thereby forming the semiconductor layer 1002. As the thinning method, a method using a grinder apparatus, a wet etching apparatus, a CMP apparatus, or the like can be used. Thinning the semiconductor substrate 1002*a* using an appropriate method suffices.

Figure 11D:
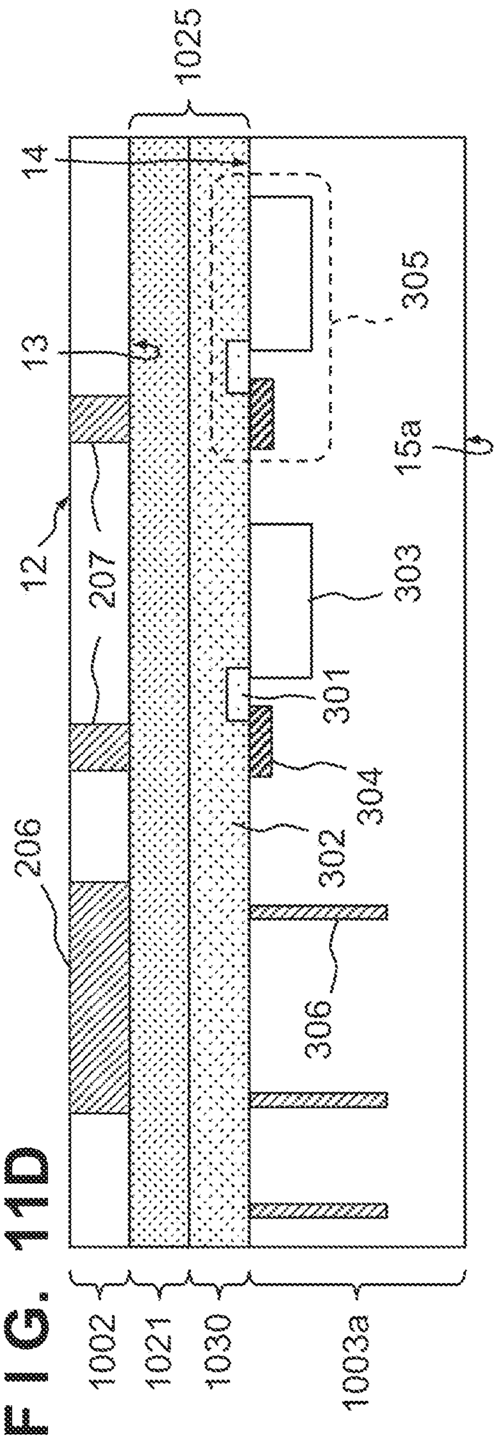

Next, as shown in FIG. 11D, an insulator portion 206 is formed in a region that is the prospective region 3*a* in the semiconductor layer 1002, and insulator portions 207 are formed in a region that is the prospective region 2 in the semiconductor layer 1002. The insulator portion 206 and the insulator portions 207 may be formed simultaneously. For example, the photolithography step and the etching step are performed for the semiconductor layer 1002, thereby forming trenches that reach from the principal surface 12 of the semiconductor layer 1002 to the structure 1021. Next, the trenches formed in the semiconductor layer 1002 are filled with silicon oxide, and excess silicon oxide is removed using a CMP apparatus or the like, thereby forming the insulator portion 206 and the insulator portions 207.

Figure 12A:
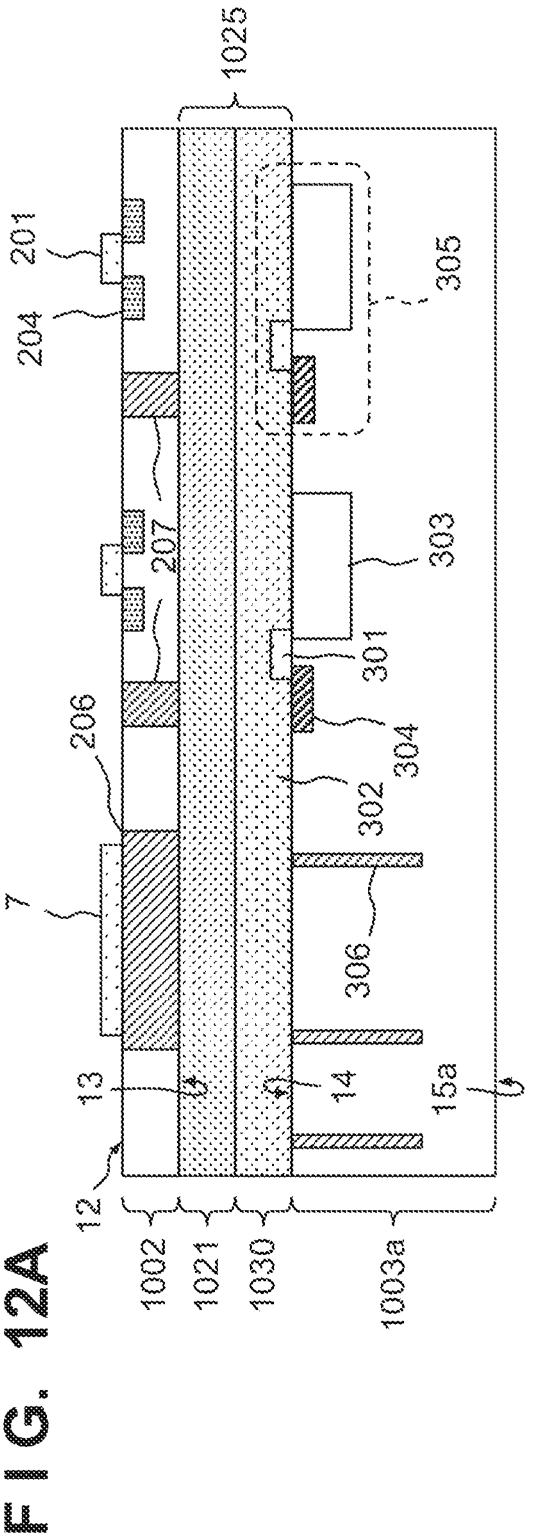
FIGS. 12A to 12C are sectional views showing an example of the manufacturing method of the semiconductor device shown in FIG. 6.

After the formation or the insulator portions 206 and 207, as shown in FIG. 12A, a gate insulating film and a polycrystalline silicon (or amorphous silicon or single crystal silicon) film are formed, and then, gate electrodes 201 and a member 7 are formed using the photolithography step and the etching step. The member 7 is formed such that it is overlaid on the insulator portion 206 in an orthographic projection to the principal surface 12 of the semiconductor layer 1002. After the formation of the gate electrodes 201, diffusion layers 204 are formed in the semiconductor layer 1002 using the photolithography step and the ion implantation step.

Figure 12B:
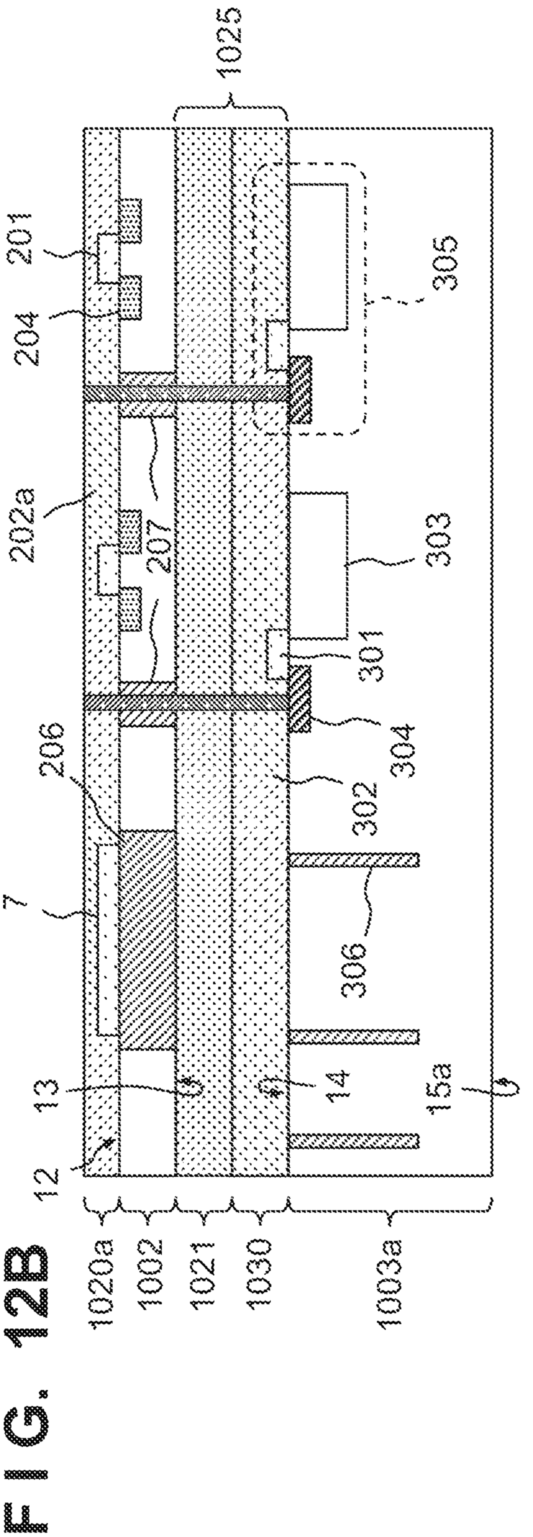

Next, as shown in FIG. 12B, an insulating layer 202*a* is formed, and contact holes reaching the gate electrodes 201 and the diffusion layers 204 and plug electrodes 5 reaching the gate electrodes 301 and the floating diffusions 304 are formed. The plug electrode 5 is formed in each insulator portion 207. The insulating characteristic between the semiconductor layer 1002 and the plug electrode 5 can thus be held.

Figure 12C:
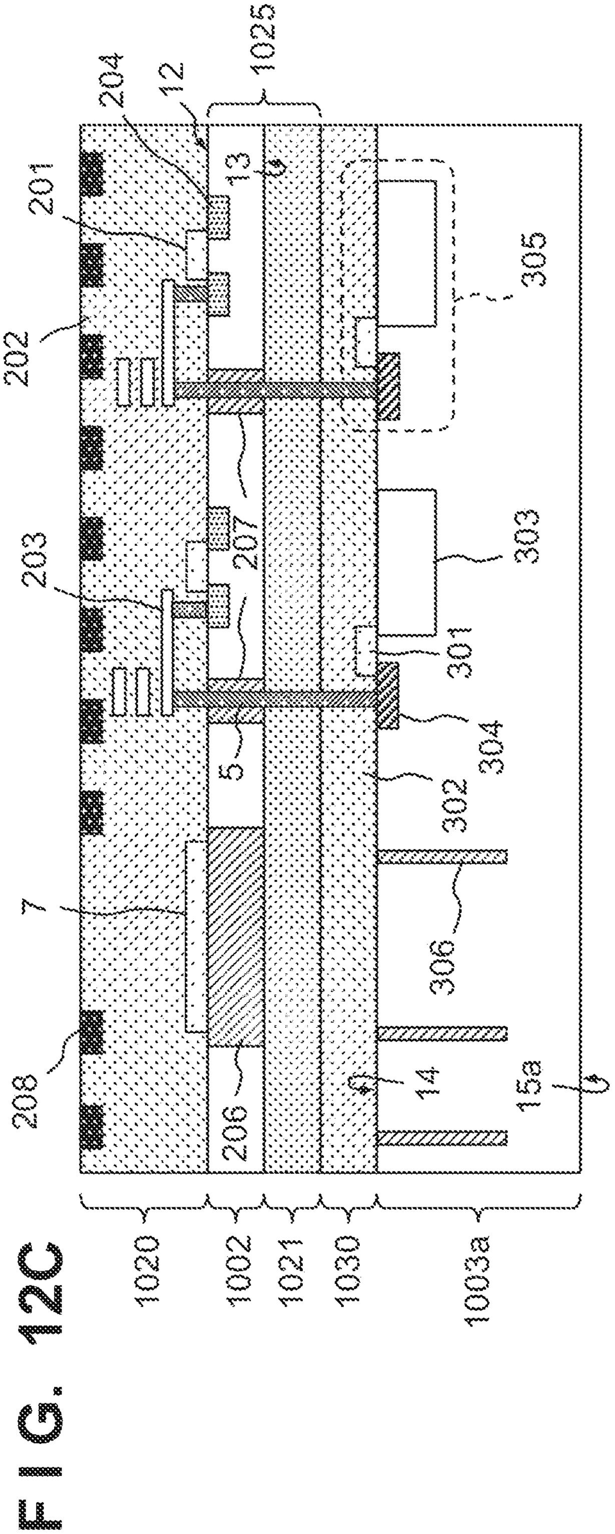

Furthermore, as shown in FIG. 12C, an insulating layer 202, wiring patterns 203, bonding pads 208, and the like are formed using appropriate steps. The insulating layer 202 includes the above-described insulating layer 202*a*. For the insulating layer 202, silicon oxide may be used. Alternatively, silicon nitride, silicon oxynitride, silicon carbide, or the like may appropriately be used for the insulating layer 202. For the above-described insulating layer 302, a similar material to the insulating layer 202 can be used. The wiring patterns 203 may be formed using a normal aluminum wiring process or a copper wiring process. The bonding pads 208 can be formed by a normal copper wiring process. A structure 1020 can be formed using these steps.

Figure 13A:
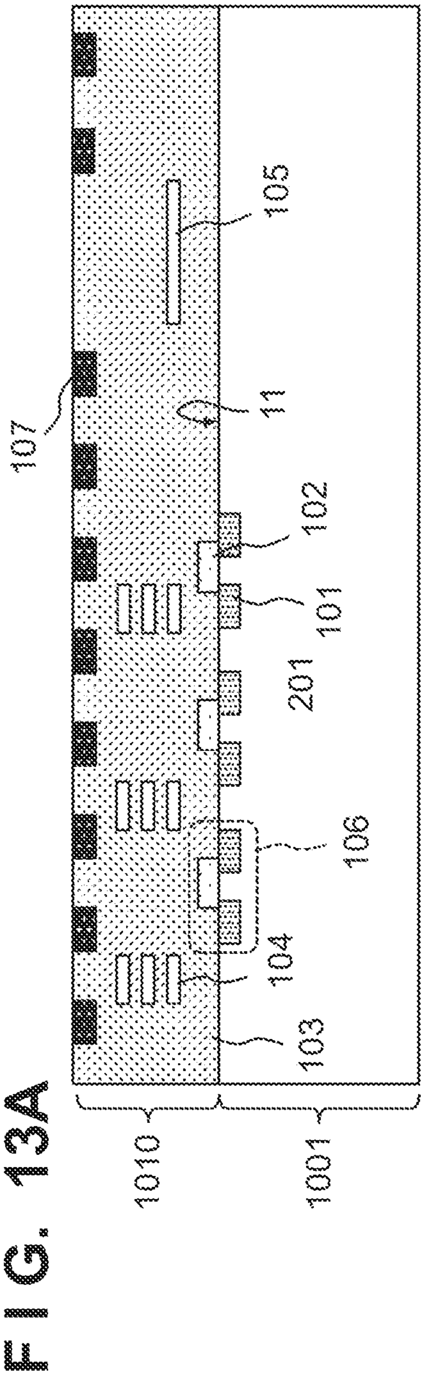
FIGS. 13A and 13B are sectional views showing an example of the manufacturing method of the semiconductor device shown in FIG. 6.

FIG. 13A is a view showing a step of forming a structure 1010 on a principal surface 11 of a semiconductor layer 1001. The semiconductor layer 1001 may be, for example, a silicon substrate. An STI (not shown), diffusion layers 101 and gate electrodes 102, which from transistors 106, and the like are formed on the principal surface 11 of the semiconductor layer 1001. Next, an insulating layer 103, wiring patterns 104, a pad electrode 105, bonding pads 107, and the like are formed. The structure 1010 can be formed using these steps.

Figure 13B:
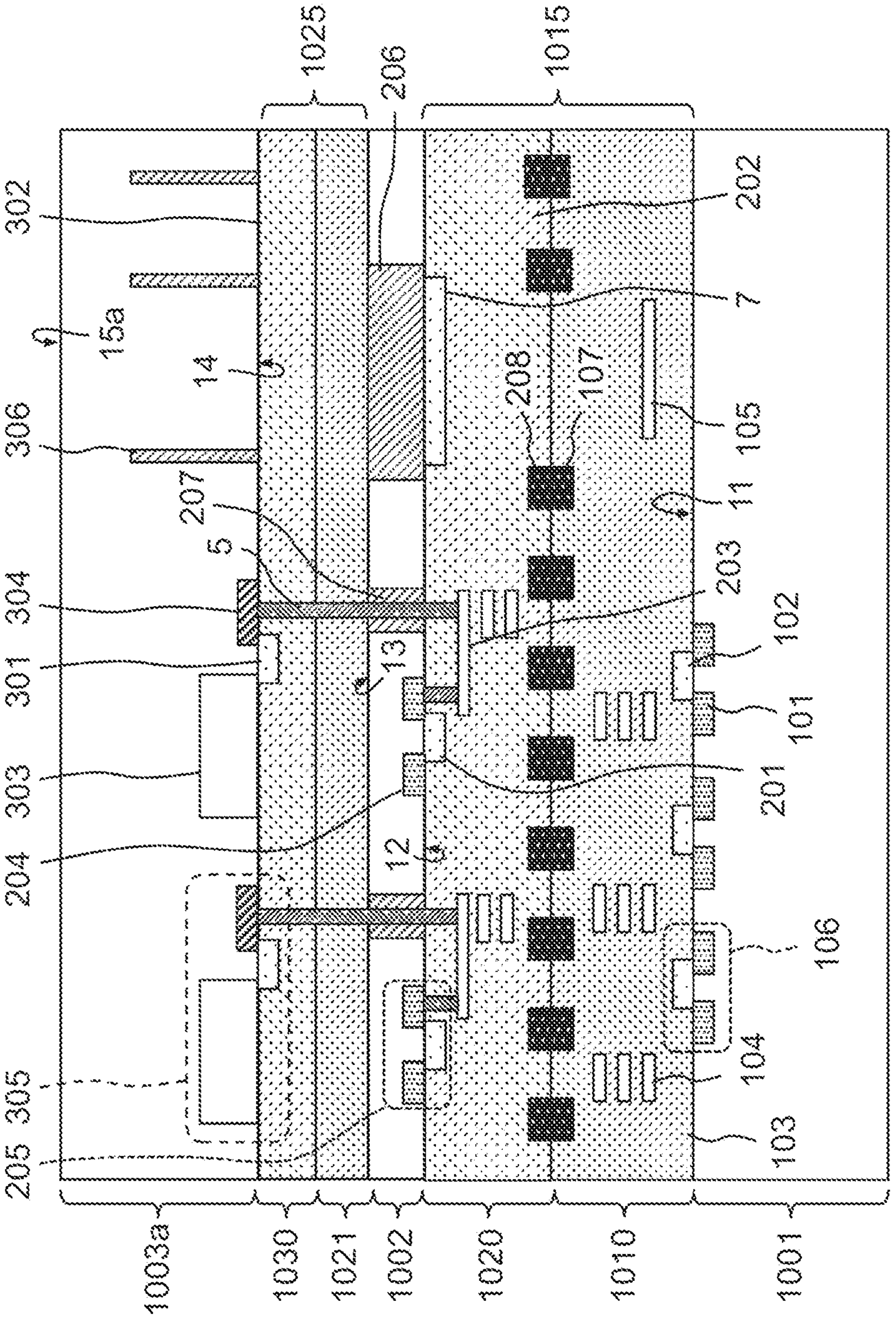

Next, as shown in FIG. 13B, the structure 1010 and the structure 1020 are bonded using the surface of the structure 1010 and the surface of the structure 1020 as bonding surfaces. As for the combination of the surface of the structure 1010 and the surface of the structure 1020, for example, both may be made of the same material such as silicon oxide or silicon nitride, or different materials may be combined. By this step, a structure 1015 including the structure 1010 and the structure 1020 is formed, and the semiconductor layer 1001, the semiconductor layer 1002, and the semiconductor layer 1003 (semiconductor substrate 1003*a*) are stacked. In this bonding step, the insulating layer 103 and the insulating layer 202 are bonded, and simultaneously, the bonding pads 107 and the bonding pads 208 are bonded. As the bonding method, so-called room temperature bonding can be used, in which the surface of the structure 1010 and the surface of the structure 1020 are activated by plasma irradiation and then bonded. However, the method is not limited to this. For example, the structure 1010 and the structure 1020 may be bonded via a bonding member such as an adhesive.

Figure 14A:
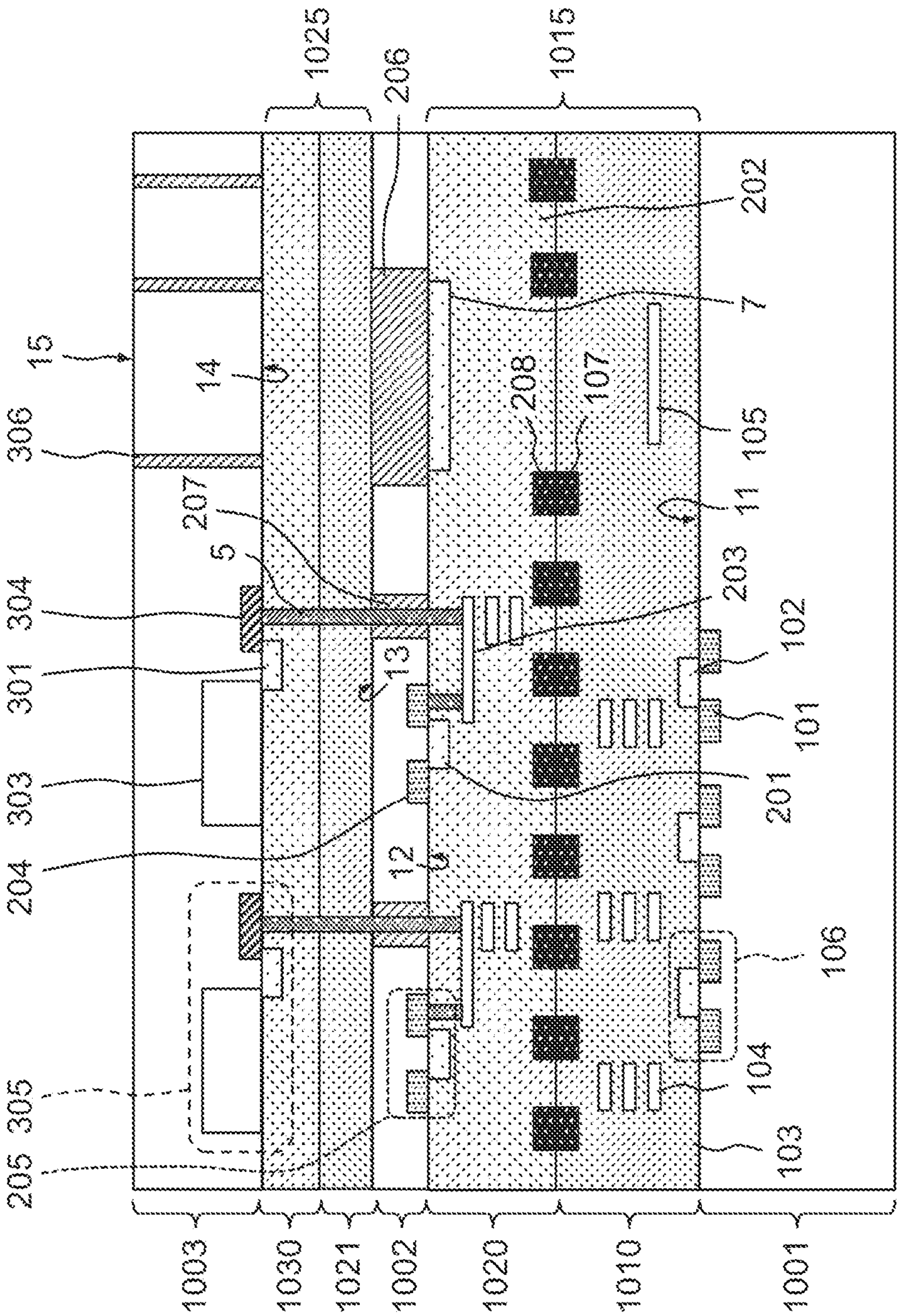
FIGS. 14A and 14B are sectional views showing an example of the manufacturing method of the semiconductor device shown in FIG. 6.

After the structure 1010 and the structure 1020 are bonded, as shown in FIG. 14A, the semiconductor substrate 1003*a* is thinned from the side of a principal surface 15*a* of the semiconductor substrate 1003*a* until the insulator portions 306 are exposed, thereby forming the semiconductor layer 1003. As the thinning method, a method using a grinder apparatus, a wet etching apparatus, a CMP apparatus, or the like can be used. Thinning the semiconductor substrate 1003*a* using an appropriate method suffices.

Figure 14B:
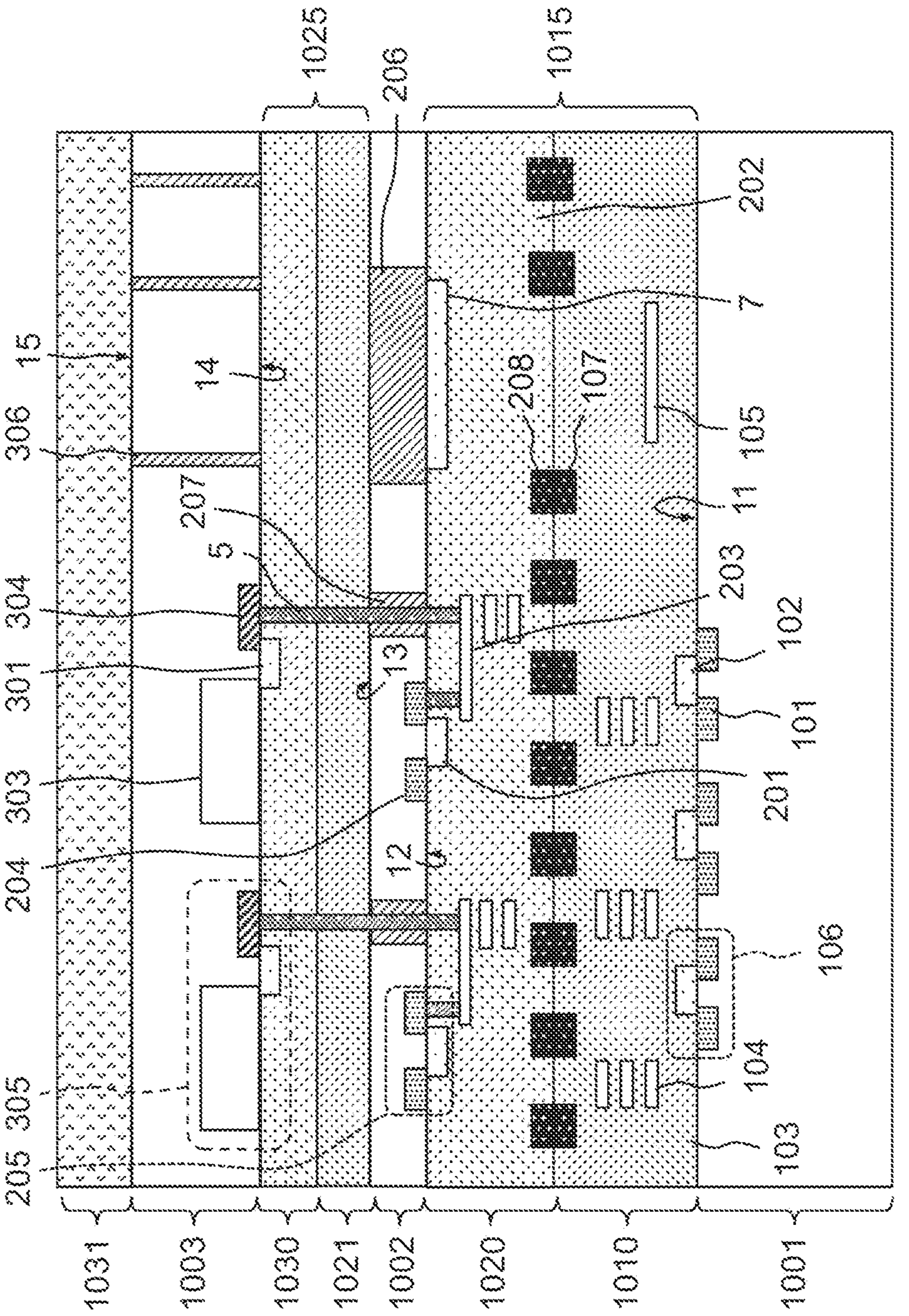

After the semiconductor layer 1003 is formed by thinning the semiconductor substrate 1003*a*, as shown in FIG. 14B, a structure 1031 including optical elements such as an intra-layer lens, a color filter, and a microlens is formed on a principal surface 15 of the semiconductor layer 1003. The structure 1031 may include all the light-shielding layer, the intra-layer lens, the color filter, and the microlens, or may include one, two or three of these.

Figure 15A:
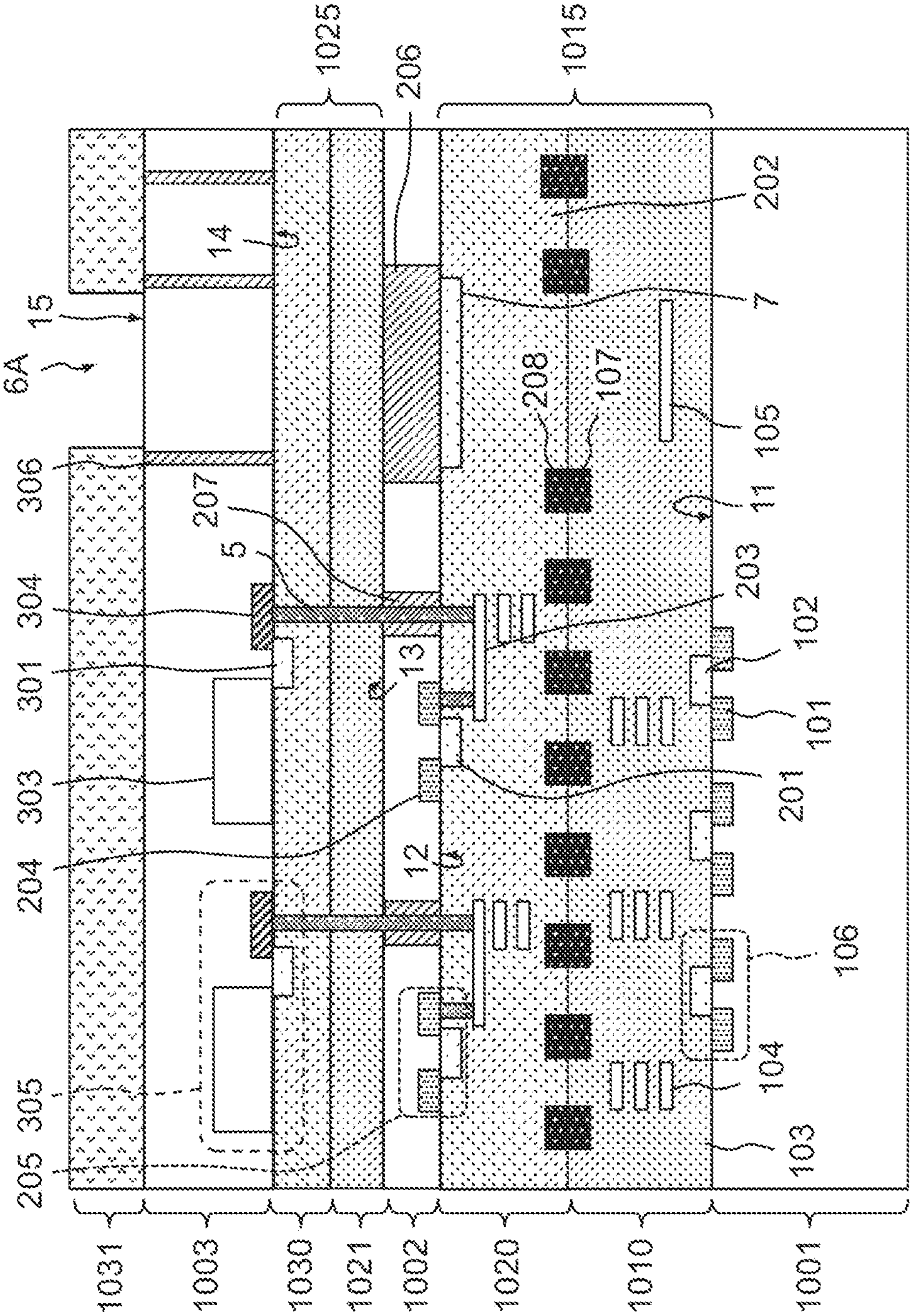
FIGS. 15A and 15B are sectional views showing an example of the manufacturing method of the semiconductor device shown in FIG. 6.

Next, as shown in FIG. 15A, an opening portion 6*a* is formed in the region that is the prospective region 3*a* using the photolithography step and the etching step. As described above with reference to FIG. 6, a large etching selectivity can be obtained between the structure 1031 and the semiconductor layer 1003. For this reason, the etching of the opening portion 6*a* can accurately be stopped on the principal surface 15 of the semiconductor layer 1003. The mask pattern in etching is not illustrated here.

Figure 15B:
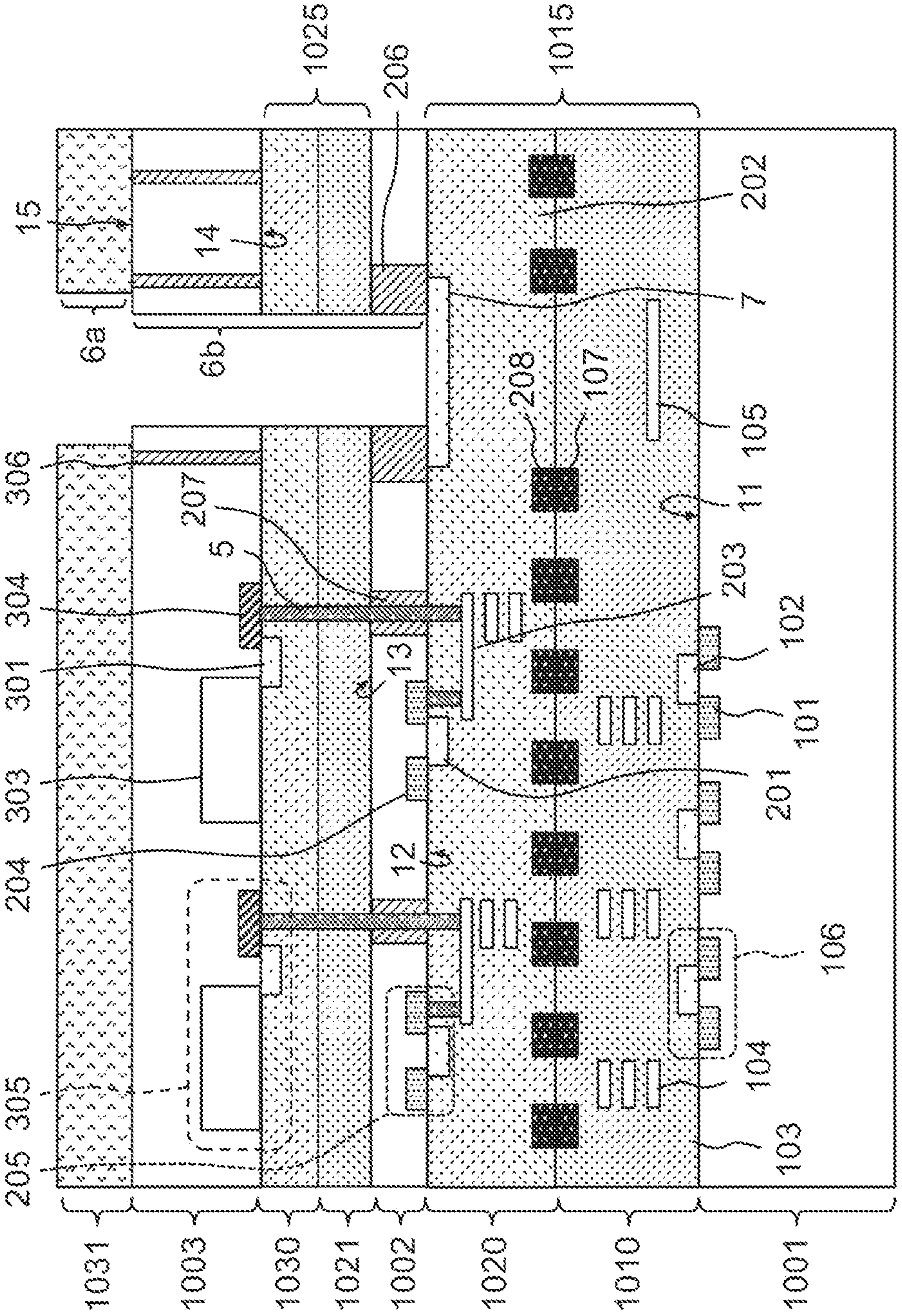

After the formation of the opening portion 6*a*, as shown in FIG. 15B, an opening portion 6*b* is formed inside the opening portion 6*a* using the photolithography step and the etching step. The mask pattern used when forming the opening portion 6*b* is formed such that an opening is arranged inside the mask pattern used when forming the opening portion 6*a*. In the semiconductor layer 1003, the opening portion 6*b* is formed inside the insulator portion 306. The insulating characteristic between the opening portion 6 and the semiconductor layer 1003 can thus be held. Also, in an orthographic projection to the principal surface 13 of the semiconductor layer 1002, the opening portion 6*b* is formed inside the member 7. Since a large etching selectivity can be obtained between the insulator portion 206 and the member 7 when etching the opening portion 6*b*, the etching of the opening portion 6*b* can accurately be stopped on the surface of the member 7. Since the opening portion 6*b* is formed inside the insulator portion 206, the insulating characteristic between the opening portion 6*b* and the semiconductor layer 1002 can be held.

In this embodiment, an example in which the insulator portion 206 is etched to form the opening portion 6*b* (opening portion 6) is shown. If silicon oxide is used as the insulator portion 206, etching can efficiently be performed from the structure 1025 capable of using silicon oxide to the insulator portion 206. Also, the member 7 that can be formed at the same time as the gate electrodes 201 of the transistors 205 can be used as an etching stopper. However, the present invention is not limited to this, and the insulator portion 206 may be formed apart from the opening portion 6*b*, like the insulator portion 306. In this case, the semiconductor layer 1002 using silicon or the like is etched to form the opening portion 6*b*. However, for example, without forming the member 7, the etching of the semiconductor layer 1002 to form the opening portion 6*b* may be performed using the insulating layer 202 as an etching stopper.

After the formation of the opening portion 6*b*, an opening portion 6*c* is formed inside the opening portion 6*b* using the photolithography step and the etching step. The mask pattern used when forming the opening portion 6*c* is formed such that an opening is arranged inside the mask pattern used when forming the opening portion 6*b*. By the opening portion 6*c*, the pad electrode 105 is exposed. With the above-described steps, the semiconductor device 1 shown in FIG. 6 is manufactured.

Figure 16:
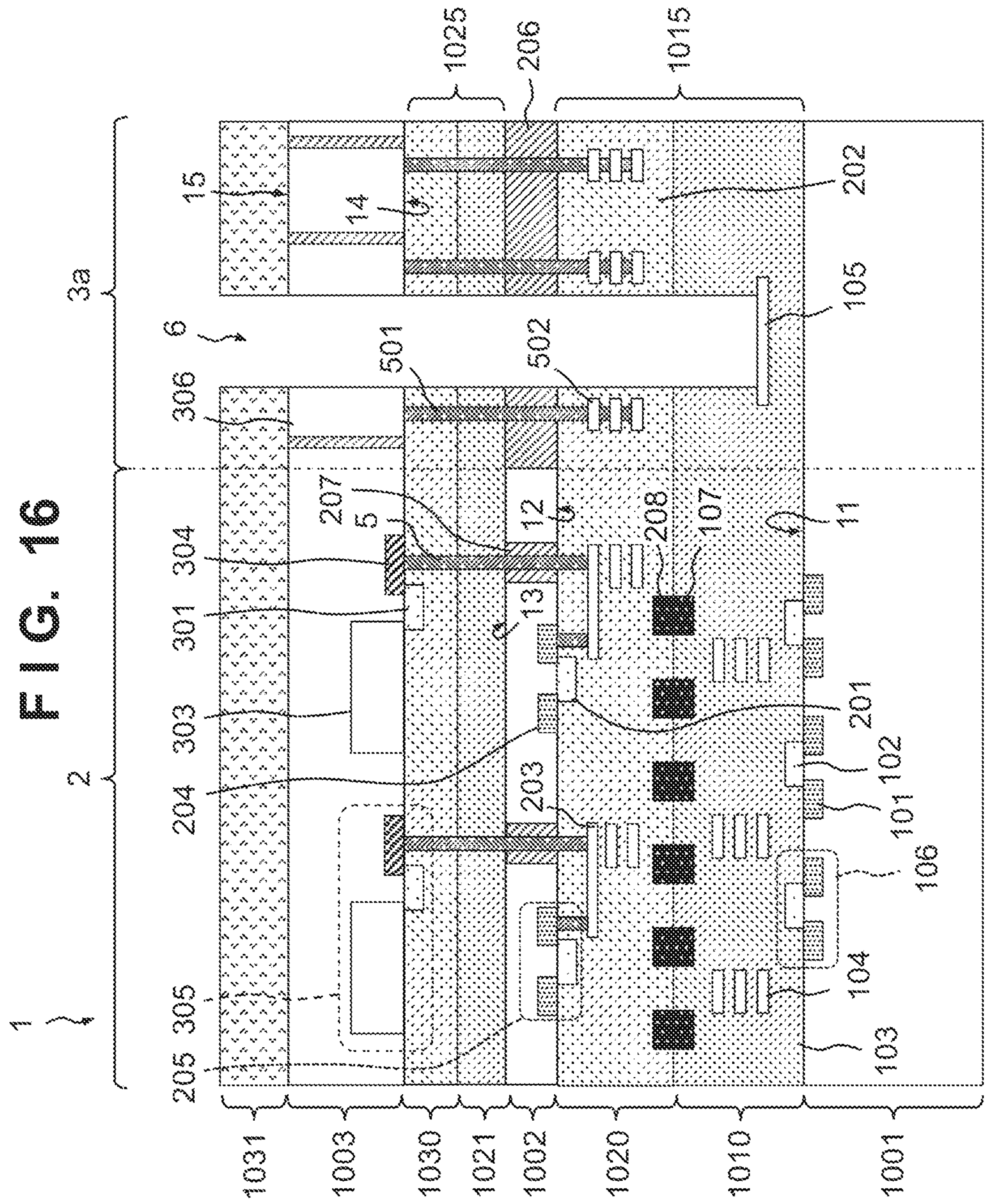
FIG. 16 is a sectional view showing an example of the configuration of the semiconductor device shown in FIG. 1.

By the way, in the semiconductor device 1 in which the plurality of semiconductor layers 1001, 1002, and 1003 are stacked, water or the like may enter from the opening portion 6 or a cut surface of the peripheral portion of the chip of the semiconductor device 1 and lower the characteristic of reliability of the semiconductor device 1. To prevent this, as shown in FIG. 16, a conductive member 501 extending from the structure 1015 to the structure 1025 may be arranged in the region 3. The conductive member 501 may extend through the insulator portion 206, as shown in FIG. 16. When the conductive member 501 is arranged, water infiltration to the region 2 where many elements (the transistors 106, the transistors 205, the elements 305, and the like) are formed in the semiconductor layers 1001 to 1003 can be suppressed.

FIGS. 17A to 17D are plan views showing examples of the arrangement of the conductive member 501 on the principal surface 13 of the semiconductor layer 1002. In the plan views shown in FIGS. 17A to 17D, focus is placed on the region 2, the opening portions 6, and the conductive members 501, and the remaining constituent elements are appropriately omitted. In the orthographic projection to the principal surface 13 of the semiconductor layer 1002, the conductive member 501 is arranged in the region 3 between the region 2 where the plurality of elements 305 are arranged in the semiconductor layer 1003 and the peripheral portion of the semiconductor layer 1002 (which is also the peripheral portion of the semiconductor device 1 and the semiconductor layers 1001 and 1003).

Figure 17B:
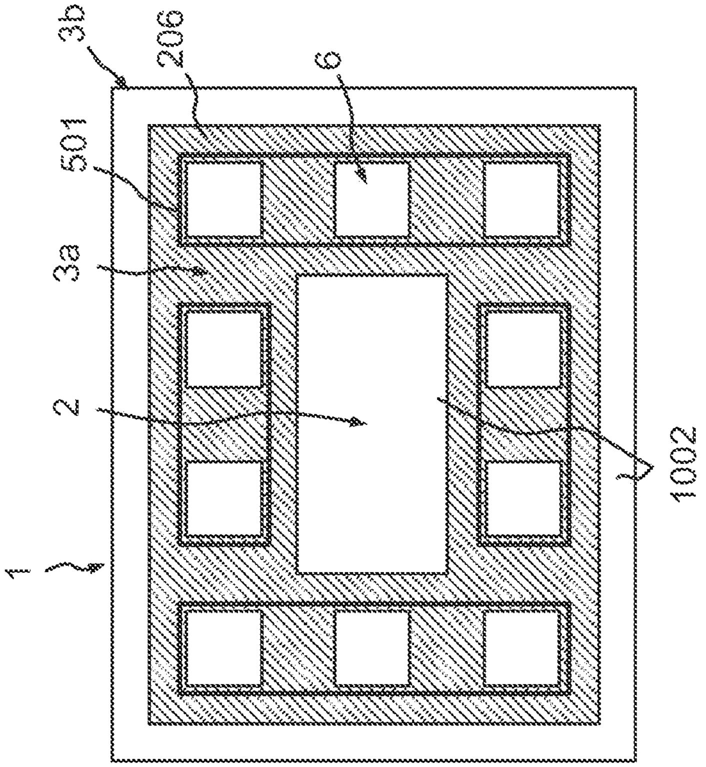
FIGS. 17A to 17D are plan views showing examples of the arrangement of a conductive member shown in FIG. 16.
Figure 17A:
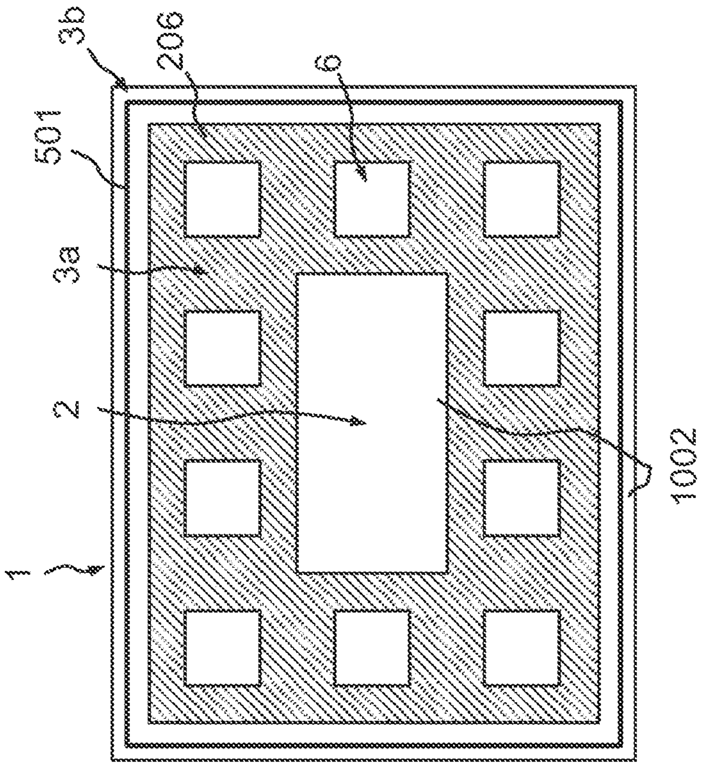
Figure 17D:
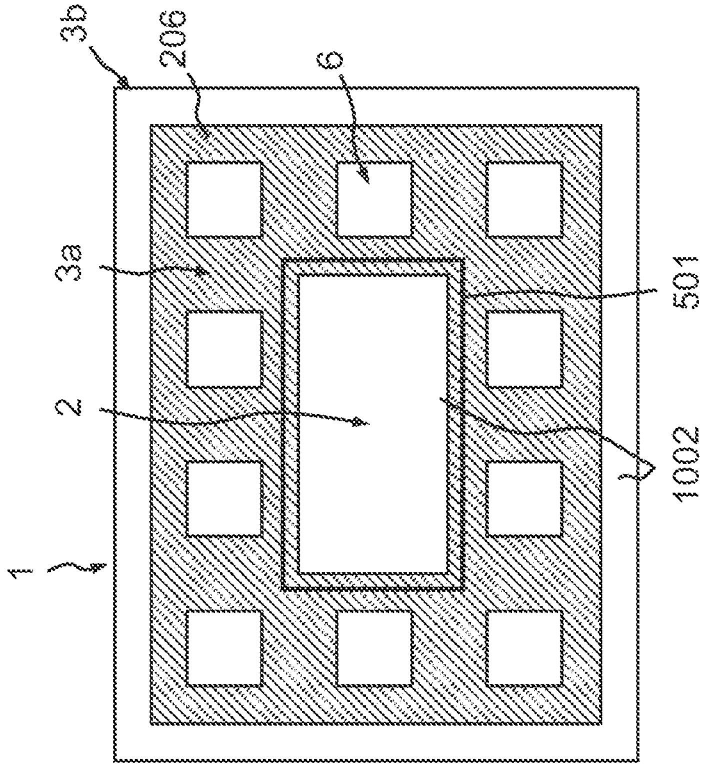
Figure 17C:
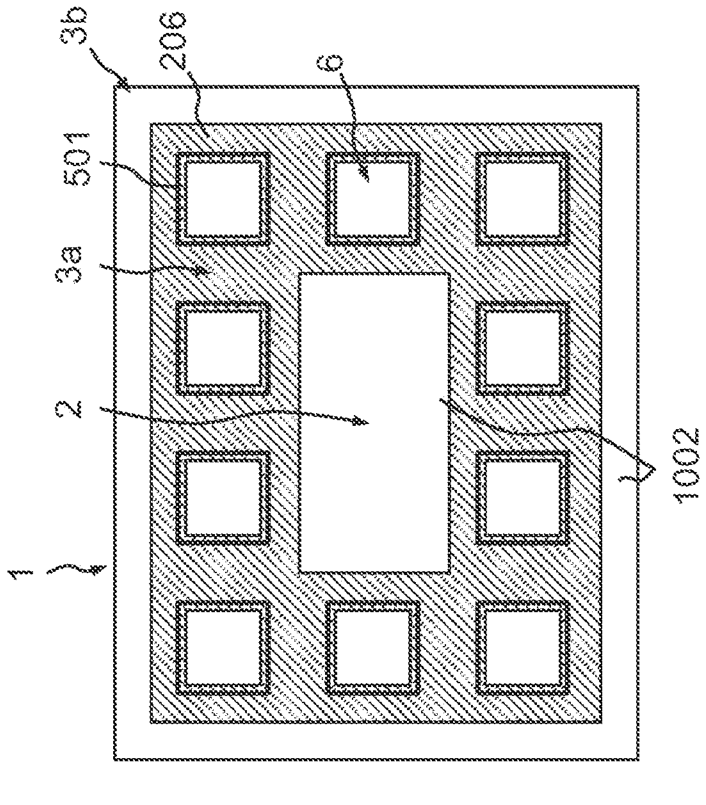

As shown in FIG. 17A, the conductive member 501 may be arranged to surround the inside of the outer edge portion of the semiconductor device 1. It can also be said that the conductive member 501 surrounds the region 2 and the opening portions 6 wholly. In this case, the conductive member 501 may be arranged in the region 3*b*, as shown in FIG. 17A, or may be arranged in the region 3*a* and extend through the insulator portion 206. Alternatively, the conductive member 501 may be arranged to surround the outside of a plurality of opening portions 6, as shown in FIG. 17B, or may be arranged to surround the outside of each opening portion 6, as shown in FIG. 17C. Alternatively, the conductive member 501 may be arranged between the region 2 and the opening portions 6 to surround the region 2, as shown in FIG. 17D.

The conductive member 501 may be arranged continuously or intermittently in the patterns shown in FIGS. 17A to 17D. In the examples shown in FIGS. 17A to 17D, the conductive member 501 singly surrounds the opening portions 6 and the like. However, the conductive members 501 may be arranged doubly or triply. Furthermore, the conductive members 501 may be arranged in a combination of the patterns shown in FIGS. 17A to 17D.

The conductive member 501 can be formed together with wiring patterns 502 at the same time as the plug electrodes 5 and the wiring patterns 203 in the steps of forming the plug electrodes 5 and the wiring patterns 203 shown in FIGS. 12B and 12C. It is therefore possible to arrange the conductive member 501 having a desired shape in a desired region of the region 3 (regions 3*a* or 3*b*) without increasing the number of steps.

In the semiconductor device 1 in which three or more semiconductor layers are stacked, the conductive member 501 extending from the structure 1015 to the structure 1025 is arranged in the region 3. This can suppress water infiltration from the outer edge portion of the semiconductor device 1 or the wall surface of the opening portion 6 to the region 2. Hence, the reliability of the semiconductor device 1 improves. For example, when the semiconductor device 1 is mounted in a transport apparatus to capture the exterior of the transport apparatus or measure the external environment, it is possible to suppress water infiltration to the region 2 of the semiconductor device 1 and maintain excellent image quality or obtain a high measurement accuracy for a long term.

Examples of the arrangement of the conductive members 501 and the wiring patterns 502 will further be described with reference to FIGS. 18A to 18F to FIGS. 22A and 22B. The following examples show a case where the conductive members 501 triply surround the opening portions 6 and the like. However, conductive members 501 arranged may be singly, doubly, or quadruply or more.

Figure 18B:
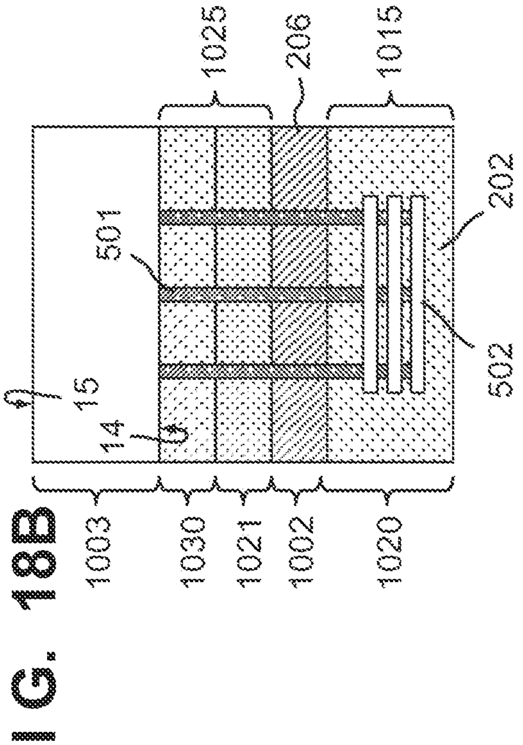
FIGS. 18A to 18F are sectional views showing an example of the arrangement of the conductive member shown in FIG. 16.
Figure 18A:
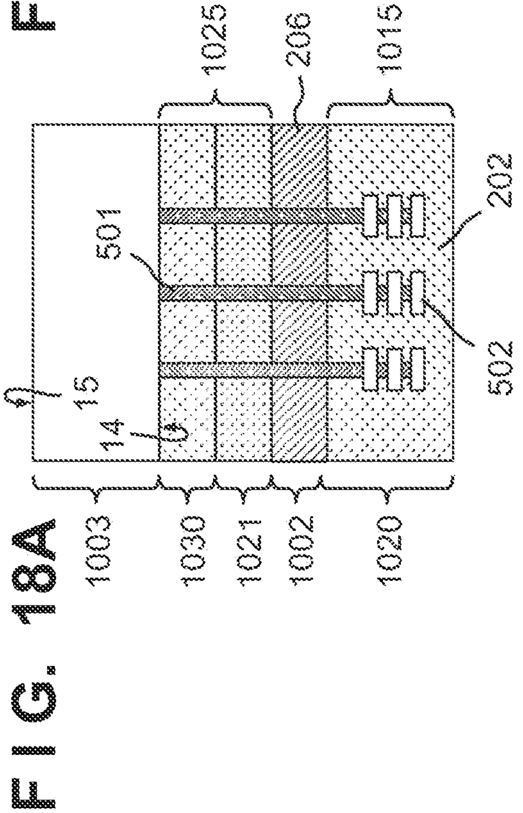

In the configuration shown in FIG. 18A, the conductive members 501 are in contact with the wiring patterns 502 arranged in the insulating layer 202 of the structure 1015. In addition, the conductive members 501 electrically connect the plurality of wiring patterns 502 to each other. However, the present invention is not limited to this, and the conductive members 501 may not electrically connect some wiring patterns 502 to each other. Also, for example, as shown in FIG. 18B, the plurality of conductive members 501 may be connected to each other by the wiring pattern 502. When the conductive members 501 with a high moisture resistance and the wiring patterns 502 are connected to each other, the moisture resistance can be improved as compared to a case where the conductive members 501 and the wiring patterns 502 are not connected to each other.

Figure 18D:
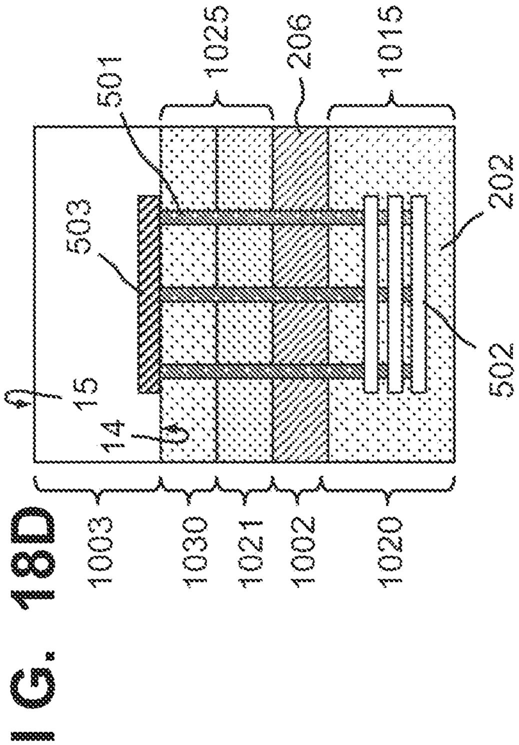
Figure 18C:
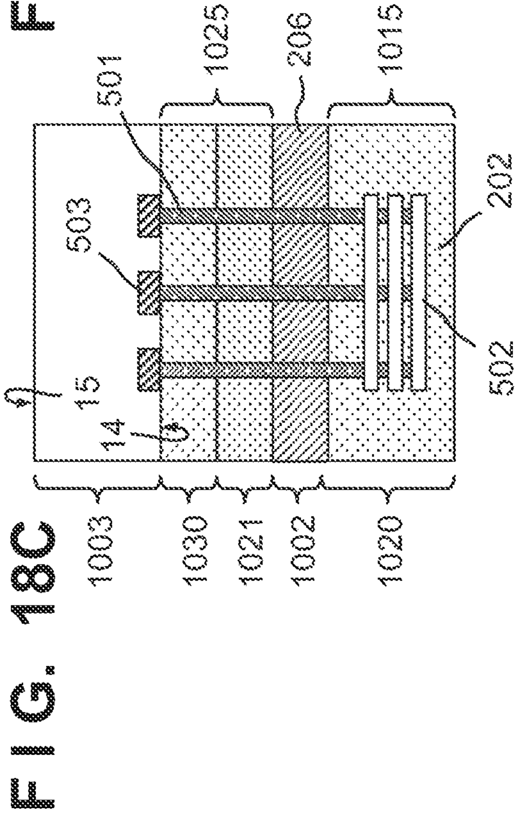

In the configuration shown in FIG. 18C, the conductive members 501 are in contact with the principal surface 14 of the semiconductor layer 1003, like the configurations described above. On the other hand, a doping layer 503 is formed on a portion of the principal surface 14 of the semiconductor layer 1003 where the conductive member 501 is in contact. The doping layers 503 can be formed at the same time as the floating diffusions 304 in the step shown in FIG. 10C. Hence, the impurity concentration of the portion of the principal surface 14 of the semiconductor layer 1003 where the conductive member 501 is in contact can equal the impurity concentration of the floating diffusions 304 arranged in the photoelectric conversion elements. When the underlying structure of the region 3 in the semiconductor layer 1003 is made close to the underlying structure of the region 2, the process of forming the structure 1030 on the semiconductor layer 1003 can be stabilized. As shown in FIG. 18C, the doping layer 503 may be arranged for each conductive member 501. Also, as shown in FIG. 18D, a plurality of conductive members 501 may be in contact with one doping layer 503.

Figure 18E:
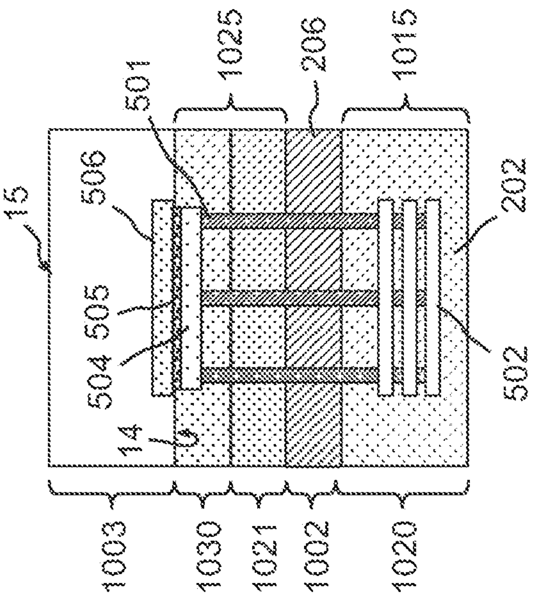

As shown in FIG. 18E, in the region 3 of the structure 1030, a contact member 504 made of the same material as the gate electrodes 301 included in the plurality of elements 305 may be arranged, and the conductive members 501 may be in contact with the contact member 504. In this case, an insulating film 505 made of the same material as the gate insulating film arranged between the gate electrode 201 and the principal surface 14 of the semiconductor layer 1003 can be arranged between the contact member 504 and the principal surface 14 of the semiconductor layer 1003. The insulating film 505 and the contact member 504 can be formed at the same time as the gate insulating films and the gate electrodes 301 in the step shown in FIG. 10B. In addition, an insulating layer 506 may be arranged in a region of the semiconductor layer 1003 overlapping the contact member 504. The insulating layer 506 is formed in the same step as an isolation structure such as an STI formed in the principal surface 14 of the semiconductor layer 1003. When the contact member 504 is arranged, etching of the semiconductor layer 1003 can be suppressed when forming trenches to bury the conductive members 501.

Figure 18F:
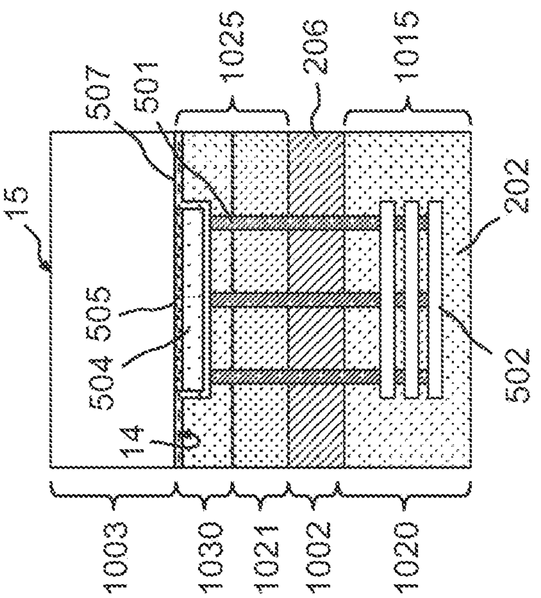

Also, as shown in FIG. 18F, a pattern simulating a gate structure arranged in the region 2 may be arranged between the conductive member 501 and the semiconductor layer 1003. For example, the insulating film 505 formed in the same step as the gate insulating film, the contact member 504 formed in the same step as the gate electrodes 301, and the insulating film 507 made of a material different from a gate insulating film for protecting the element 305 such as a transistor may be arranged. When the contact structure having the same structure as the element 305 arranged in the region 2 is formed, the stability of the process can be increased and, for example, etching can be stabilized when forming trenches to bury the conductive members 501.

Figure 19A:
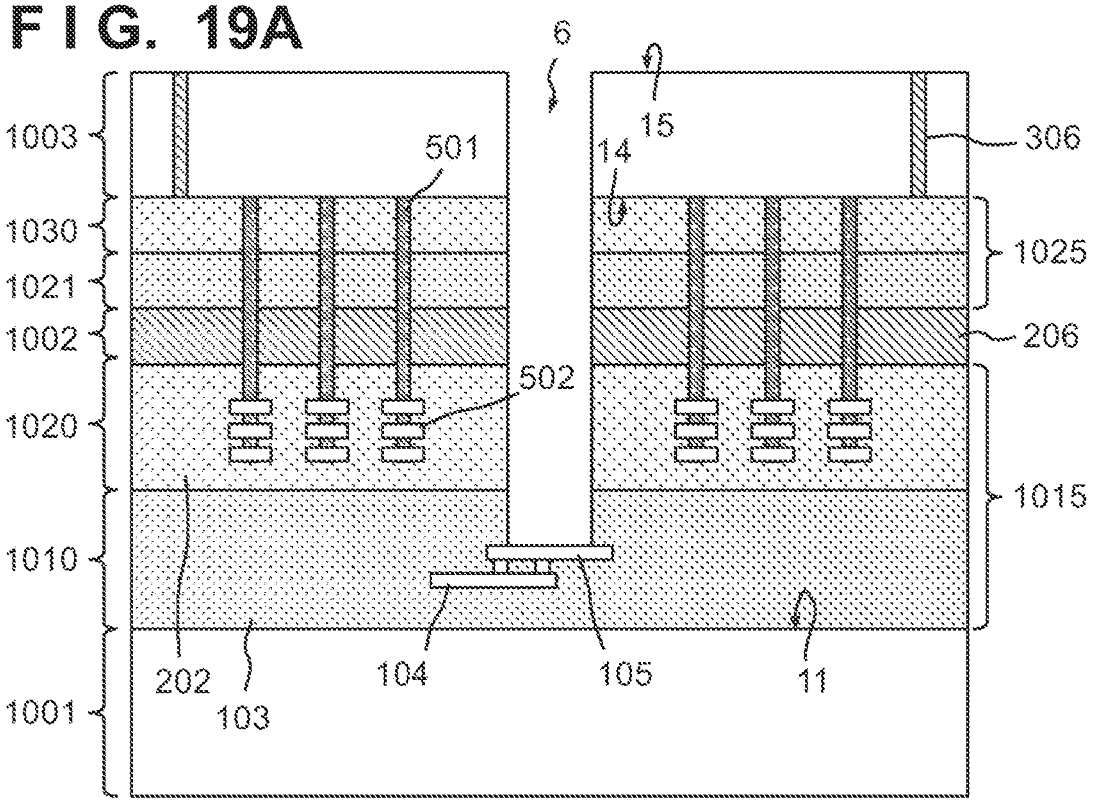
FIGS. 19A and 19B are sectional views showing an example of the arrangement of the conductive member shown in FIG. 16.

As shown in FIG. 19A, the insulator portion 306 may be arranged in the semiconductor layer 1003, like the semiconductor device 1 shown in FIG. 2. That is, in the region 3, a trench extending through the semiconductor layer 1003 from the principal surface 15 to the principal surface 14 of the semiconductor layer 1003 may be arranged, and an insulator may be buried in the trench. Also, for example, the wall surface of the trench may be covered with an insulator and a conductor may be buried. As the insulator buried in the trench of the insulator portion 306, one or a plurality of layers of aluminum oxide, hafnium oxide, tantalum oxide may be formed, and a silicon oxide or silicon nitride film may further be formed. As described above, the insulator portion 306 holds the insulating characteristic between the semiconductor layer 1003 and the opening portion 6. When burying a conductor in the trench covered with the insulator, polycrystalline silicon, tungsten, copper, or the like may be buried. When the conductor is buried, effects of improving the moisture resistance and suppressing stray light that enters from the opening portion 6 or the outer edge portion of the semiconductor device 1 can be obtained. The insulator portion 306 can be formed with a width of, for example, several tens of nm to several hundred nm.

Figure 19B:
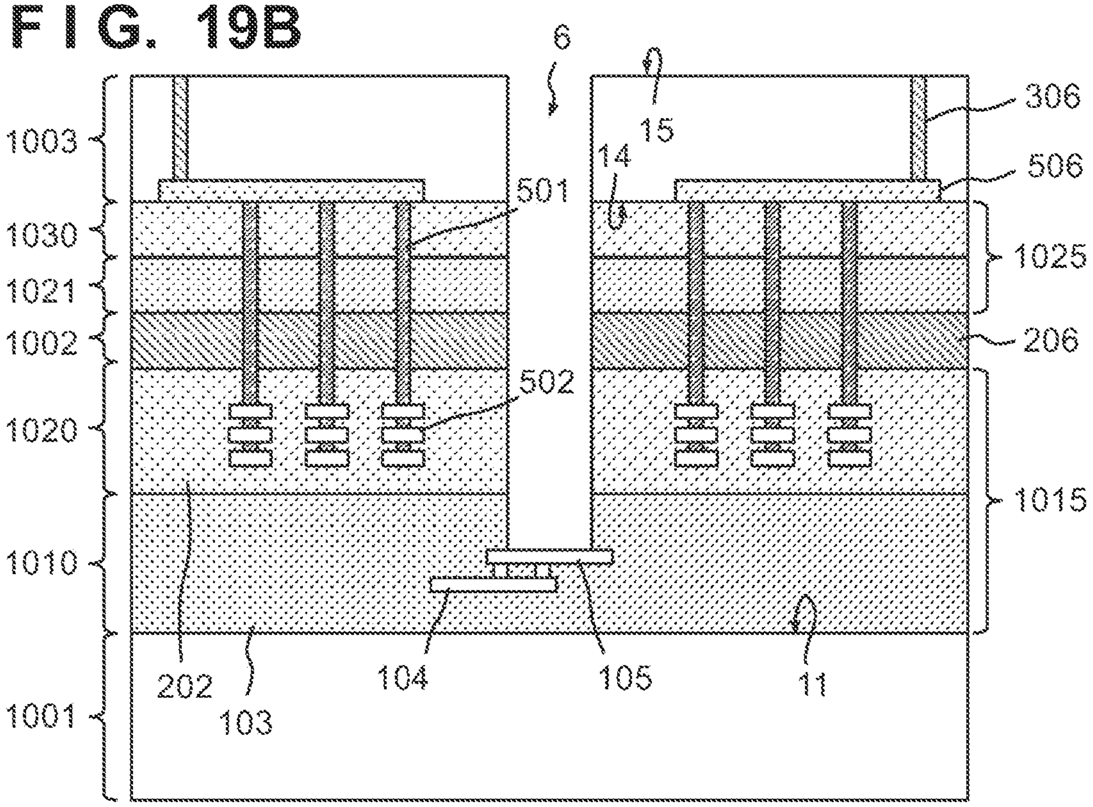

Also, as shown in FIG. 19B, the insulating layer 506 formed in the same step as the isolation structure such as an STI formed in the principal surface 14 of the semiconductor layer 1003 may be arranged between the insulator portion 306 and the conductive members 501. When the insulating layer 506 is provided, the insulating layer 506 can be used when forming the trench of the insulator portion 306, and etching of the structure 1030 can be suppressed. In other words, it is possible to prevent the trench used to form the insulator portion 306 from being arranged in the structure 1025 (structure 1030). FIGS. 19A and 19B show examples in which the conductive members 501 are arranged to surround the opening portion 6. However, as described above, the conductive members 501 may be arranged to surround the region 2 or the outer edge portion of the semiconductor device 1. Also, in addition to FIG. 19B, the uniformity of the pattern can be improved by providing an isolation structure in the region 3, as described above.

Figure 20A:
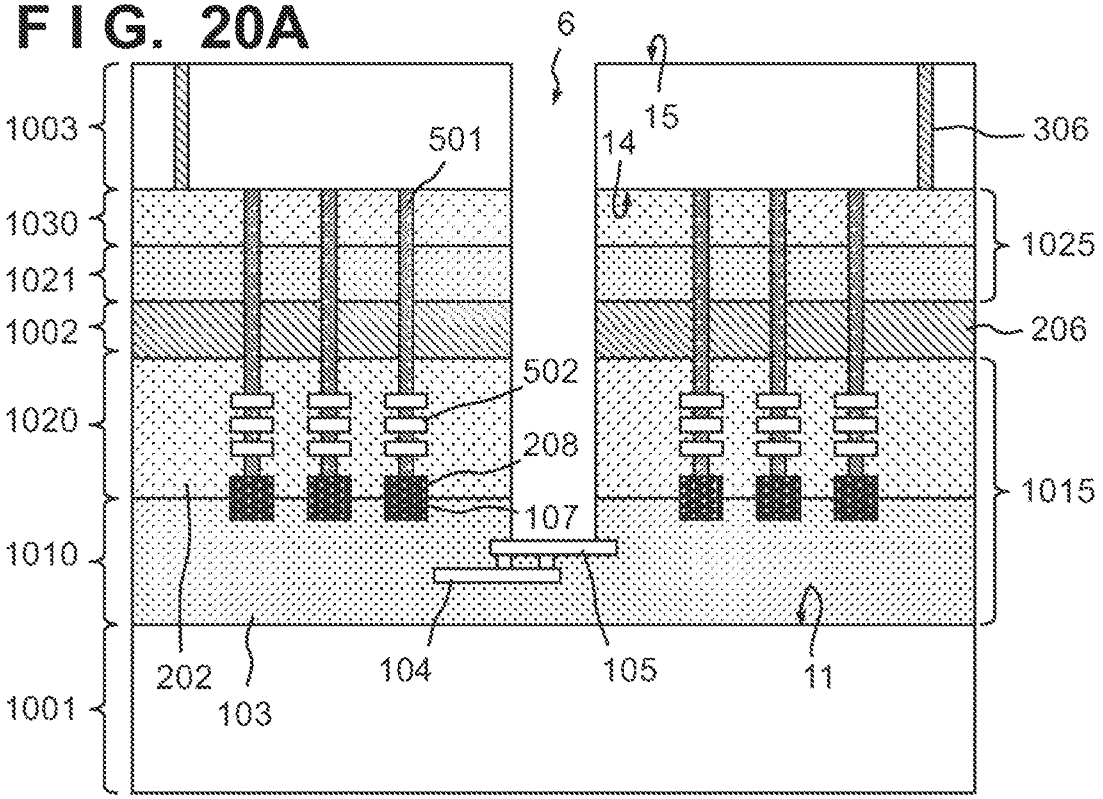
FIGS. 20A and 20B are sectional views showing an example of the arrangement of the conductive member shown in FIG. 16.
Figure 20B:
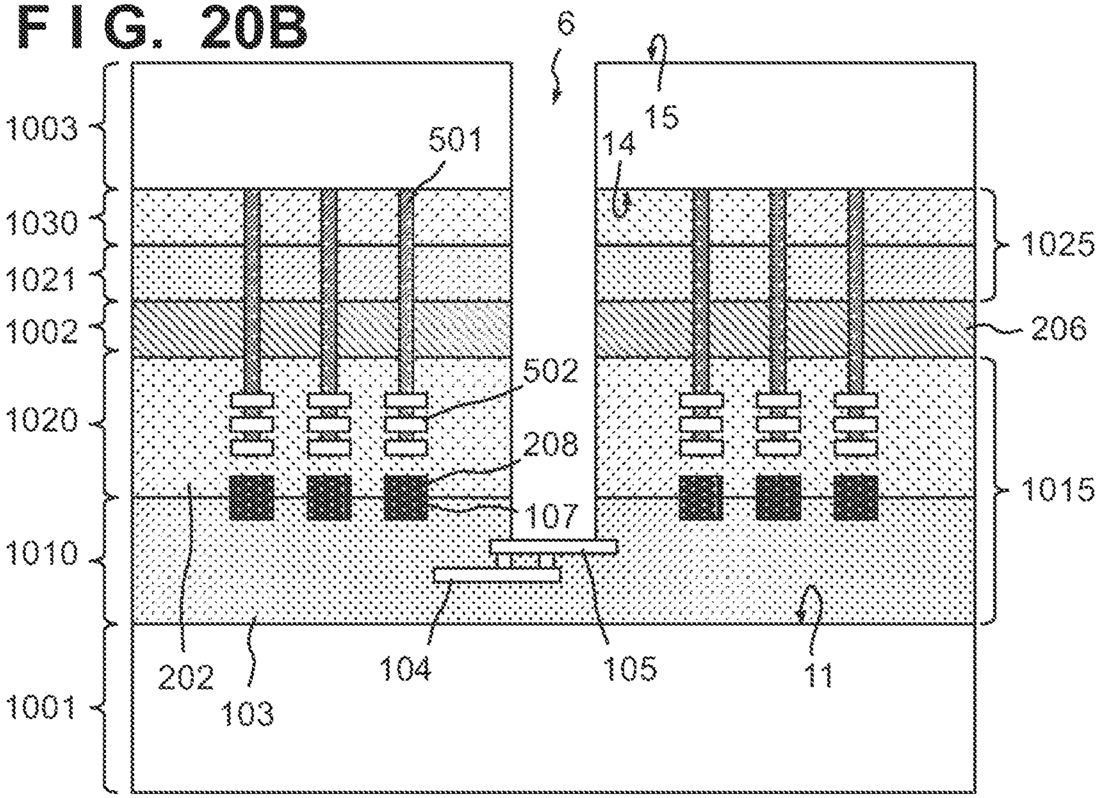
Figure 21B:
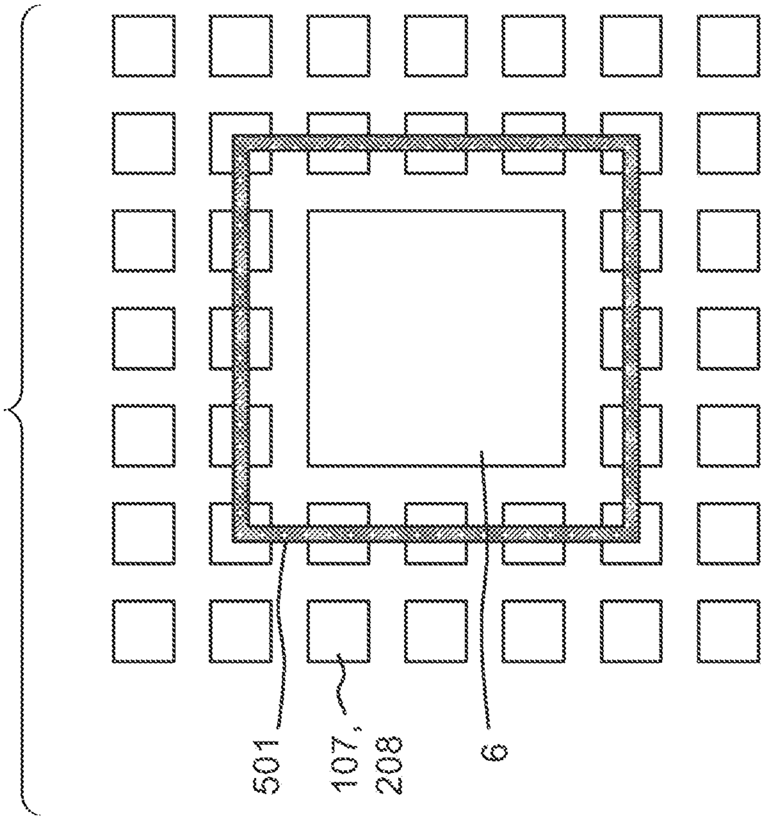
FIGS. 21A to 21D are sectional views showing an example of the arrangement of the conductive member shown in FIG. 16.
Figure 21A:
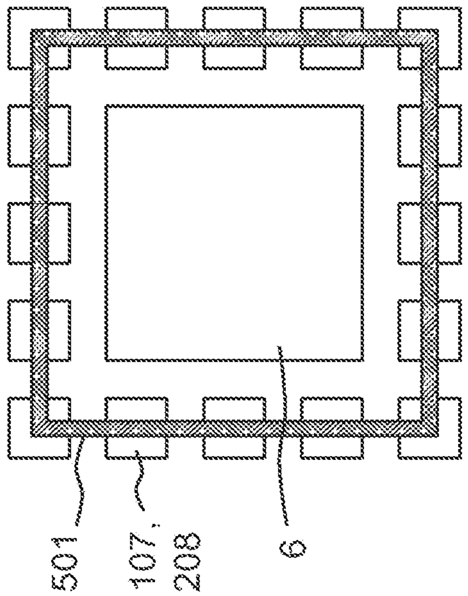
Figure 21D:
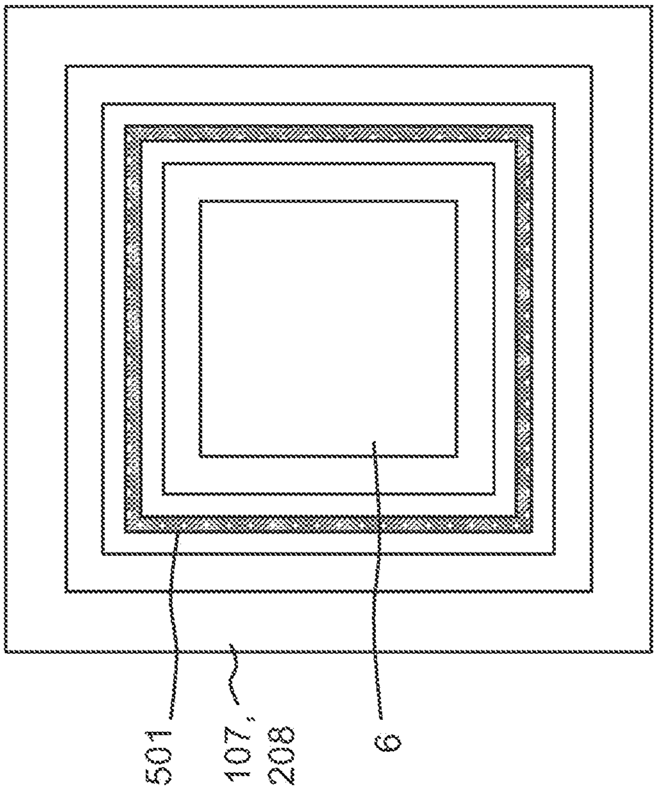
Figure 21C:
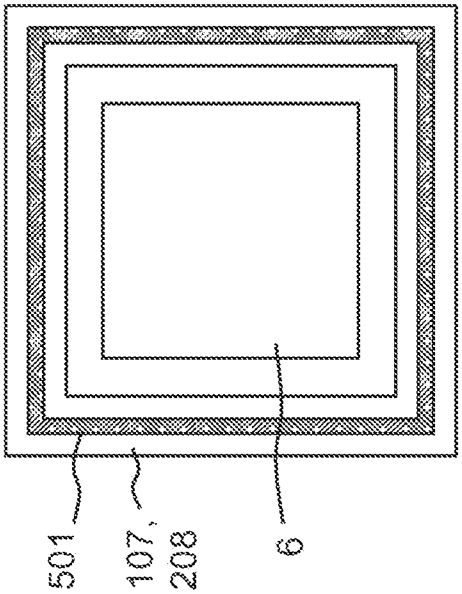

As shown in FIG. 20A, the conductive members 501 may be in contact with the bonding pads 208 used to bond the structure 1010 and the structure 1020. In the orthographic projection to the principal surface 15 of the semiconductor layer 1003, the bonding pads 107 and 208 may be formed intermittently, as shown in FIG. 21A, or may be formed continuously, as shown in FIG. 21C. When the conductive members 501 are connected to the bonding pads 208, the moisture resistance can be improved. On the other hand, the conductive members 501 may be only close to the bonding pads 208 and may not be in contact, as shown in FIG. 20B.

The bonding pads 107 and 208 are arranged near the conductive members 501. The bonding pads 107 and 208 may be formed intermittently, as shown in FIG. 21A, or may be formed continuously, as shown in FIG. 21C. In the orthographic projection to the principal surface 15 of the semiconductor layer 1003, the bonding pads 107 and 208 may be arranged to overlap the conductive members 501, as shown in FIGS. 21A and 21C, or may be arranged at different positions. Also, the bonding pads 107 and 208 may at least doubly surround the opening portions 6, as shown in FIGS. 21B and 21D. Furthermore, to form a reliably bonding interface, the bonding pads 107 and the bonding pads 208 may be formed in a mixture of the intermittent arrangement and the continuous arrangement. When the bonding pads 107 and 208 are arranged in the region 2, it is possible to increase the moisture resistance and simultaneously increase the bonding strength in the region 2.

In the above-described embodiment, an example in which the pad electrode 105 is arranged in the structure 1010 formed on the semiconductor layer 1001 in the structure 1015 has been described. However, the present invention is not limited to this. The pad electrode 105 may be arranged in the structure 1020 formed on the principal surface 12 of the semiconductor layer 1002 in the structure 1015. When the pad electrode 105 is arranged in the structure 1020 in the structure 1015, the depth of the opening portion 6 can be made shallow. As a result, in the semiconductor device 1, a mounting failure that occurs at the time of wire bonding is suppressed. That is, the reliability of an apparatus using the semiconductor device 1 can be increased.

Figure 22A:
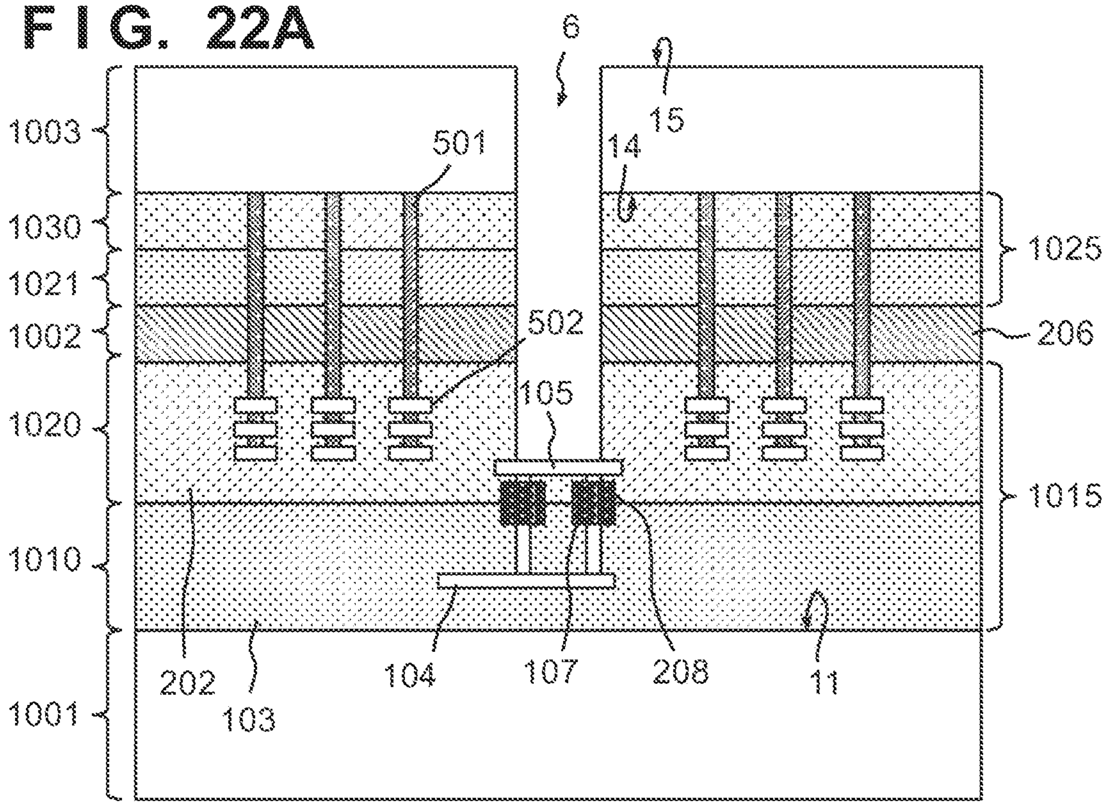
FIGS. 22A and 22B are sectional views showing an example of the arrangement of the conductive member shown in FIG. 16.
Figure 22B:
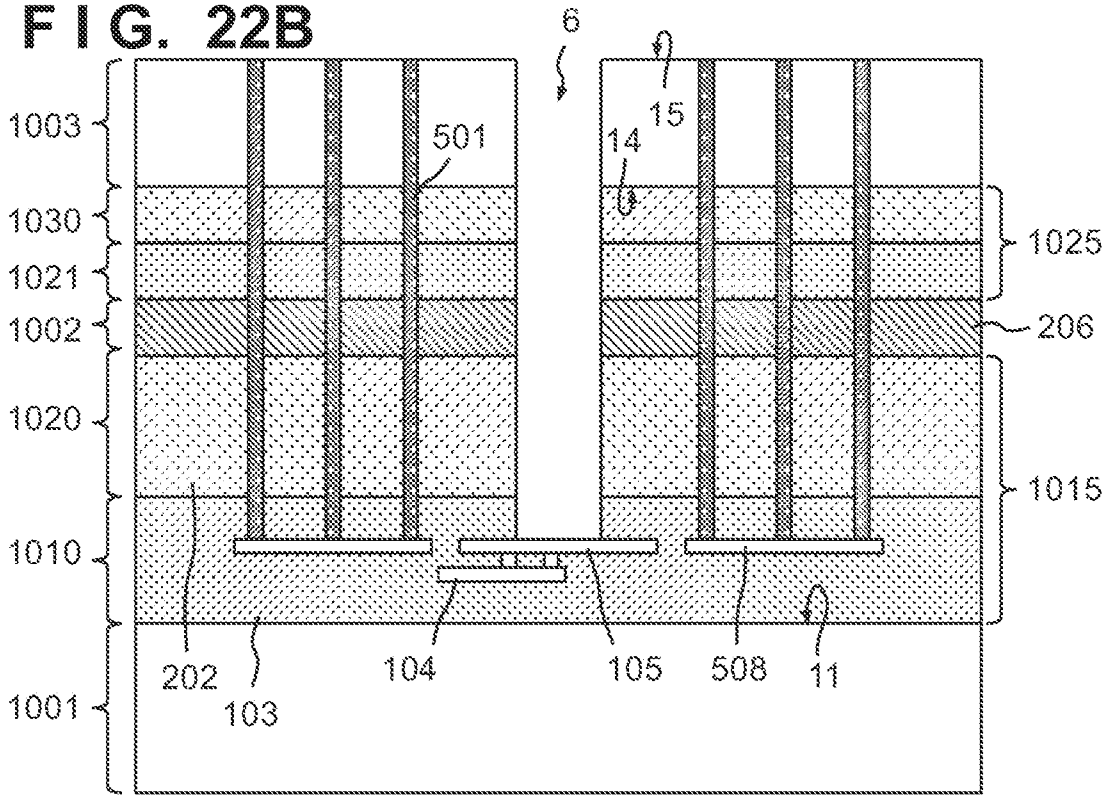

In the above-described embodiment, an example in which the pad electrode 105 is arranged at a position closer to the semiconductor layer 1001 than the conductive members 501 has been described. However, the present invention is not limited to this. As shown in FIG. 22B, the structure 1015 may include, in the insulating layer 103 or the insulating layer 202, a conductor portion 508 that is formed in the same layer as the pad electrode 105 and is made of the same material as the pad electrode 105, and the conductive members 501 may be in contact with the conductor portion 508. For example, the trenches to bury the conductive members 501 may be formed from the principal surface 15 of the semiconductor layer 1003, as shown in FIG. 22B. In this case, when the conductor portion 508 is arranged simultaneously in the step of forming the pad electrode 105 in the structure 1015, the conductive members 501 can be used as an etching stopper when forming the trenches to bury the conductive members 501. After the formation of the trenches, a material such as tungsten is buried using the CVD method or ALD method, thereby forming the walls of the conductive members 501 with a moisture resistance from the semiconductor layer 1003 to the structure 1015. The conductive members 501 may thus extend through the structure 1025 and extend to the semiconductor layer 1003.

Consider a case where photoelectric conversion elements are arranged in the semiconductor layer 1003 of the semiconductor device 1, as described above, to cause the semiconductor device 1 to function as a photoelectric conversion device. Japanese Patent Laid-Open No. 2019-220703 shows that generation of an afterimage in an image is suppressed by reducing the oxygen concentration in a silicon layer in which photoelectric conversion elements are formed. On the other hand, if the oxygen concentration included in the silicon layer is low, the mechanical strength of a semiconductor layer lowers, and a failure such as a dislocation readily occurs. However, as described above, the semiconductor device 1 according to this embodiment has a configuration in which the semiconductor layer 1003 in which the elements 305 including photoelectric conversion elements are arranged, the semiconductor layer 1002, and the semiconductor layer 1001 are stacked. Hence, the concentration of oxygen contained in each of the semiconductor layers 1001 to 1003 can independently be controlled for each semiconductor layer. A configuration and a manufacturing method of the semiconductor device 1 based on this concept will be described below.

The basic configuration of the semiconductor device 1 can be any one of the above-described configurations. In this embodiment as well, the plurality of elements 305 including photoelectric conversion elements are arranged in the semiconductor layer 1003, an element circuit including the transistor 205 that amplifies a signal output from the photoelectric conversion element is arranged in the semiconductor layer 1002, and a driving circuit configured to drive the plurality of elements 305 and the element circuits is arranged in the semiconductor layer 1001. A description will be made assuming that the semiconductor layers 1001 to 1003 are each made of silicon.

As described above, the oxygen concentration in the semiconductor layer 1003 in which the photoelectric conversion elements are arranged needs to be reduced. Hence, when a substrate including an epitaxial layer is used as the semiconductor substrate 1003*a* shown in FIG. 10A, the oxygen concentration in the semiconductor layer 1003 in which the photoelectric conversion elements (elements 305) are arranged can effectively be reduced. In this case, a heat load in a process concerning the semiconductor substrate 1003*a* (semiconductor layer 1003) is reduced, thereby suppressing diffusion of oxygen from the bulk of the semiconductor substrate 1003*a* to the epitaxial layer.

Also, for example, the semiconductor substrates (semiconductor layers) may be prepared such that the maximum oxygen concentration in the semiconductor substrate 1003*a* (semiconductor layer 1003) becomes lower than the maximum oxygen concentration in the semiconductor substrate 1002*a* (semiconductor layer 1002) and the maximum oxygen concentration in the semiconductor layer 1001. Also, as described above, the semiconductor substrate 1003*a* changes to the semiconductor layer 1003 by thinning. The portion of the epitaxial layer with the photoelectric conversion elements arranged accounts for most of the semiconductor layer 1003 left after thinning. Hence, even if an epitaxial substrate is selected as the semiconductor substrate 1003*a*, the maximum oxygen concentration in the semiconductor layer 1003 can be lower than the maximum oxygen concentration in each of the semiconductor layers 1002 and 1001 in the completed semiconductor device 1.

In addition, for example, the semiconductor substrate 1003*a* (semiconductor layer 1003) may not include a trench-type element isolation structure arranged in the region 2 where the plurality of elements 305 are arranged. This suppresses an occurrence of a dislocation caused by stress applied to the vicinity of the element isolation structure in the semiconductor substrate 1003*a* (semiconductor layer 1003). That is, in the region 2 where the photoelectric conversion elements are arranged, it is possible to suppress generation of a defect caused by lowering of the mechanical strength and suppress lowering of image quality.

On the other hand, the oxygen concentrations in the semiconductor layers 1001 and 1002 are higher than the oxygen concentration in the semiconductor layer 1003. This suppresses lowering of the mechanical strength in the semiconductor layers 1001 and 1002. Hence, for example, a trench-type element isolation structure configured to isolate the transistors 106 arranged in the semiconductor layer 1001 from each other may be arranged in the semiconductor layer 1001. Similarly, a trench-type element isolation structure configured to isolate the transistors 205 arranged in the semiconductor layer 1002 from each other may be arranged in the semiconductor layer 1002.

For example, the maximum oxygen concentration in the semiconductor layer 1003 on the side of the principal surface 15 is set to $1\times10^{17}$ atoms/cm$^3$ or less. The maximum oxygen concentration in the semiconductor layer 1002 is set to $1\times10^{17}$ atoms/cm$^3$ to the mid of the $10^{17}$ atoms/cm$^3$ range. The maximum oxygen concentration in the semiconductor layer 1001 is set to the mid in the $10^{17}$ atoms/cm$^3$ range to the $10^{18}$ atoms/cm$^3$ range. In this configuration, the maximum oxygen concentration in the semiconductor layer 1001 is higher than the maximum oxygen concentration in the semiconductor layer 1002, and the maximum oxygen concentration in the semiconductor layer 1002 is higher than the maximum oxygen concentration in the semiconductor layer 1003. This configuration can effectively suppress generation of a defect caused by lowering of the mechanical strength while suppressing an afterimage in an image obtained using the semiconductor device 1. Here, the mid of the $10^{17}$ atoms/cm$^3$ range is, for example, less than $7\times10^{17}$ atoms/cm$^3$.

Also, for example, before the step of stacking the semiconductor substrate 1003*a* and the semiconductor substrate 1002*a* shown in FIG. 11B, a process of forming an element isolation structure and the like in the semiconductor substrate 1002*a* may be executed. When at least a part of the process for the semiconductor substrate 1002*a* is performed before the semiconductor substrate 1003*a* and the semiconductor substrate 1002*a* are stacked, the heat load applied to the semiconductor substrate 1003*a* (semiconductor layer 1003) decreases. As a result, movement of oxygen from the bulk of the semiconductor substrate 1003*a* (semiconductor layer 1003) to the epitaxial layer is suppressed, and an increase of the oxygen concentration in the epitaxial layer in which the photoelectric conversion elements are arranged is suppressed. In addition, when the number of steps that the semiconductor layer 1003 (semiconductor substrate 1003*a*) undergoes is decreased, a mechanical load applied to the semiconductor layer 1003 (semiconductor layer 1003) decreases. As a result, it is possible to suppress generation of a defect caused by lowering of the mechanical strength of the semiconductor layer 1003 (semiconductor substrate 1003*a*).

Also, to suppress an increase of the oxygen concentration in the epitaxial layer of the semiconductor substrate 1003*a* (semiconductor layer 1003), the following manufacturing step may be used. Reducing the thermal history (thermal budget) of the semiconductor layer 1003 is effective. The thermal history is determined by time, temperature, or the like. As a method of reducing the thermal history of the semiconductor layer 1003, for example, the following method is used. In the manufacturing step of the semiconductor device 1, the maximum temperature of annealing for the semiconductor layer 1003 (semiconductor substrate 1003*a*) is made lower than the maximum temperature of annealing for each of the semiconductor layer 1002 (semiconductor substrate 1002*a*) and the semiconductor layer 1001. Also, for example, the maximum temperature of annealing after the semiconductor substrate 1003*a* (semiconductor layer 1003) and the semiconductor substrate 1002*a* (semiconductor layer 1002) are stacked (the step after FIG. 11B) is made lower than the maximum temperature of annealing for each substrate before the semiconductor substrate 1003*a* (semiconductor layer 1003) and the semiconductor substrate 1002*a* (semiconductor layer 1002) are stacked.

Here, as described above, the semiconductor layer 1002 can be formed thin, considering the processing stability and resistance stability of a through via in which the plug electrode 5 is arranged. That is, the thinned semiconductor layer 1002 can be thinner than the semiconductor layer 1001 and the semiconductor layer 1003. At this time, the semiconductor layer 1001 may be thicker than the semiconductor layer 1003. Hence, the semiconductor layer 1001 can also function as the support substrate of the semiconductor device 1.

As described above, the semiconductor layer 1002 is thinner than the semiconductor layer 1001, and its mechanical strength readily lowers. Hence, the maximum oxygen concentration in the semiconductor layer 1002 may be higher than the maximum oxygen concentration in the semiconductor layer 1001 and the maximum oxygen concentration in the semiconductor layer 1003. Even in this case, the maximum oxygen concentration in the semiconductor layer 1001 is higher than the maximum oxygen concentration in the semiconductor layer 1003. In other words, to suppress an afterimage, the oxygen concentration in the semiconductor layer 1003 is lower than those in the semiconductor layers 1001 and 1002. For example, the maximum oxygen concentration in the semiconductor layer 1003 on the side of the principal surface 15 is set to $1\times10^{17}$ atoms/cm$^3$ or less. The maximum oxygen concentration in the semiconductor layer 1002 is set to the mid of the $10^{17}$ atoms/cm$^3$ range to the $10^{18}$ atoms/cm$^3$ range. The maximum oxygen concentration in the semiconductor layer 1001 is set to $1\times10^{17}$ atoms/cm$^3$ to the mid of the $10^{17}$ atoms/cm$^3$ range. This suppresses generation of a defect in the thin semiconductor layer 1002 whose mechanical strength readily lowers. As a result, the characteristic such as the reliability of the semiconductor device 1 improves. Here, the mid of the $10^{17}$ atoms/cm$^3$ range is, for example, less than $7\times10^{17}$ atoms/cm$^3$.

When the concentration of oxygen contained in each of the semiconductor layers 1001 to 1003 is taken into consideration, an afterimage is suppressed in the semiconductor device 1 functioning as a photoelectric conversion device. Also, defect generation caused by lowering of the mechanical strength of the semiconductor layers 1001 to 1003 can be suppressed by using the above-described steps. This makes it possible to improve the characteristic of the semiconductor device 1 such as the quality of an image obtained by the semiconductor device 1 and the reliability of the semiconductor device 1.

Suppressing heat and mechanical loads applied to the semiconductor substrate 1003*a* (semiconductor layer 1003) by performing at least a part of the process for the semiconductor substrate 1002*a* before the semiconductor substrate 1003*a* and the semiconductor substrate 1002*a* are stacked has been described above. On the other hand, in the step of bonding the semiconductor substrate 1003*a* (semiconductor layer 1003) and the semiconductor substrate 1002*a* (semiconductor layer 1002), if unevenness occurs on the surface of the structure 1021 in the step before bonding, the reliability of bonding between the structure 1021 and the structure 1030 may lower. As a result, the reliability of the semiconductor device 1 may lower.

For example, if the structure 1021 and the structure 1030 are bonded after (the precursor structure of) the above-described insulator portion 207 is formed on the principal surface 13 of the semiconductor substrate 1002*a*, a step difference may be formed on the surface of the structure 1021 by the insulator portion 207. A method of planarizing the surface of the structure 1021 even in a case where (the precursor structure of) the insulator portion 207 is formed on the structure 1021 before the structure 1021 and the structure 1030 are bonded will be described with reference to FIGS. 23A to 23D and FIGS. 24A and 24B. Steps to be described below are steps replacing the steps shown in FIGS. 11A to 11D.

Figure 23A:
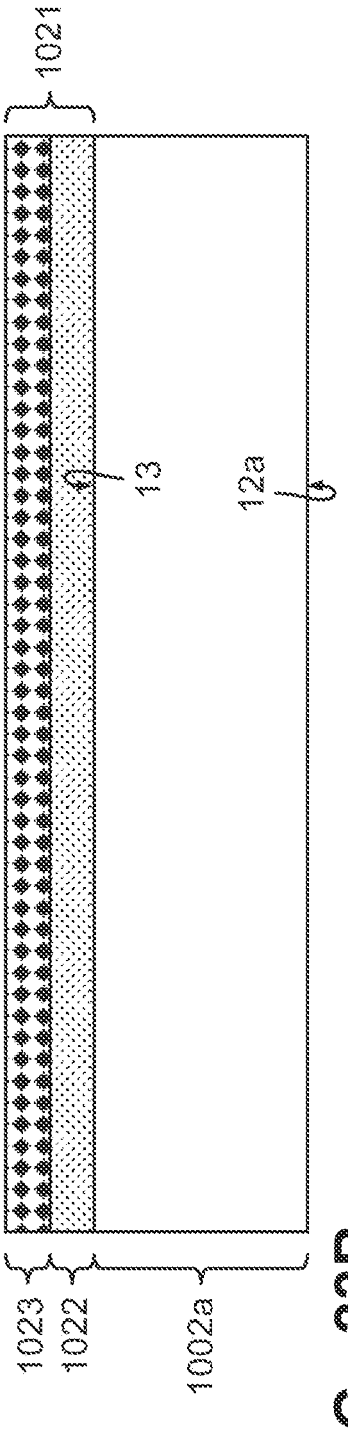
FIGS. 23A to 23D are sectional views showing a modification of the manufacturing method shown in FIGS. 11A to 11D.

First, as shown in FIG. 23A, an insulating layer 1022 and an insulating layer 1023 are arranged as the structure 1021 on the principal surface 13 of the semiconductor substrate 1002*a*. For the insulating layer 1022, for example, silicon oxide is used. For the insulating layer 1023, for example, silicon nitride is used. The insulating layer 1023 is made of a material different from an insulator 2072 to be used to form the insulator portion 207 in the step later.

Figure 23B:
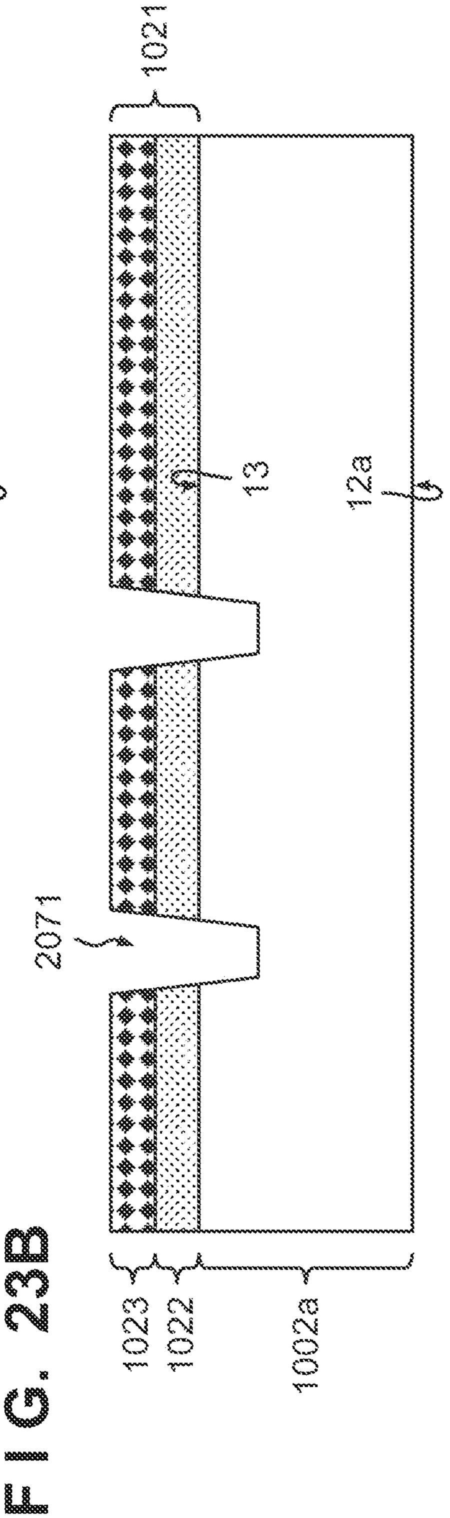

Next, as shown in FIG. 23B, an opening is formed in the insulating layer 1023 via an opening of a mask pattern, and a groove 2071 is formed in the principal surface 13 of the semiconductor substrate 1002*a*. At this time, after the opening is formed in the insulating layer 1023 using a mask pattern, the insulating layer 1022 and the semiconductor substrate 1002*a* may be etched using the opening formed in the insulating layer 1023 as a mask.

Figure 23C:
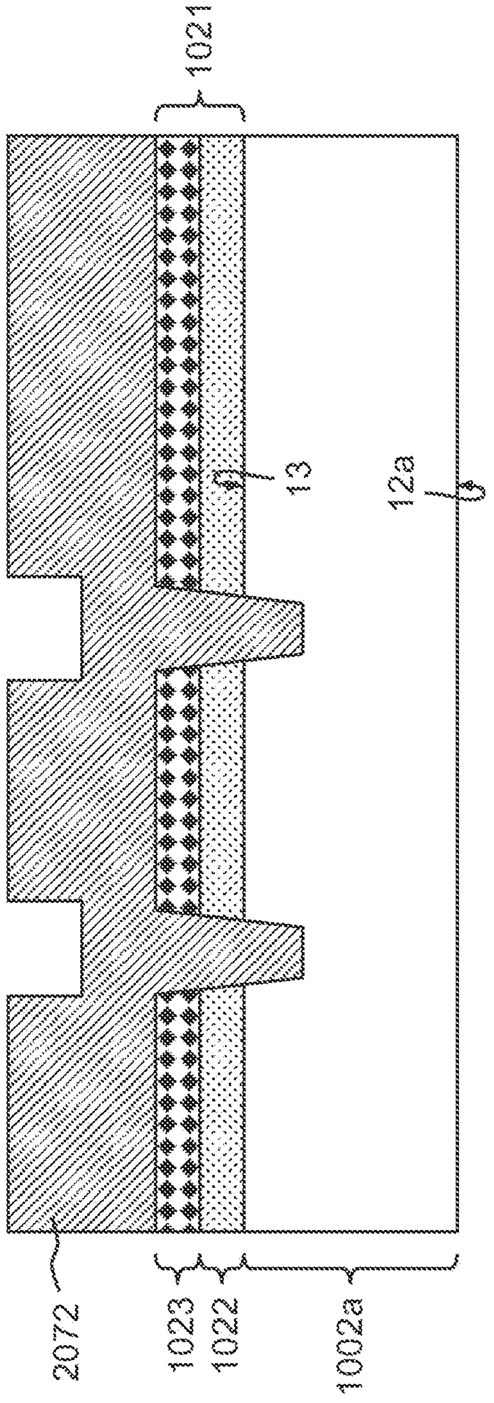

After the formation of the groove 2071, the insulator 2072 that covers the principal surface 13 of the semiconductor substrate 1002*a* is formed to fill the groove 2071, as shown in FIG. 23C. For the insulator 2072, for example, silicon oxide is used. Thus, the materials different from each other are used for the insulating layer 1023 and the insulator 2072. If the insulator 2072 is made of silicon oxide, the insulating layer 1023 may be formed not silicon oxide described above but, for example, polycrystalline silicon.

Figure 23D:
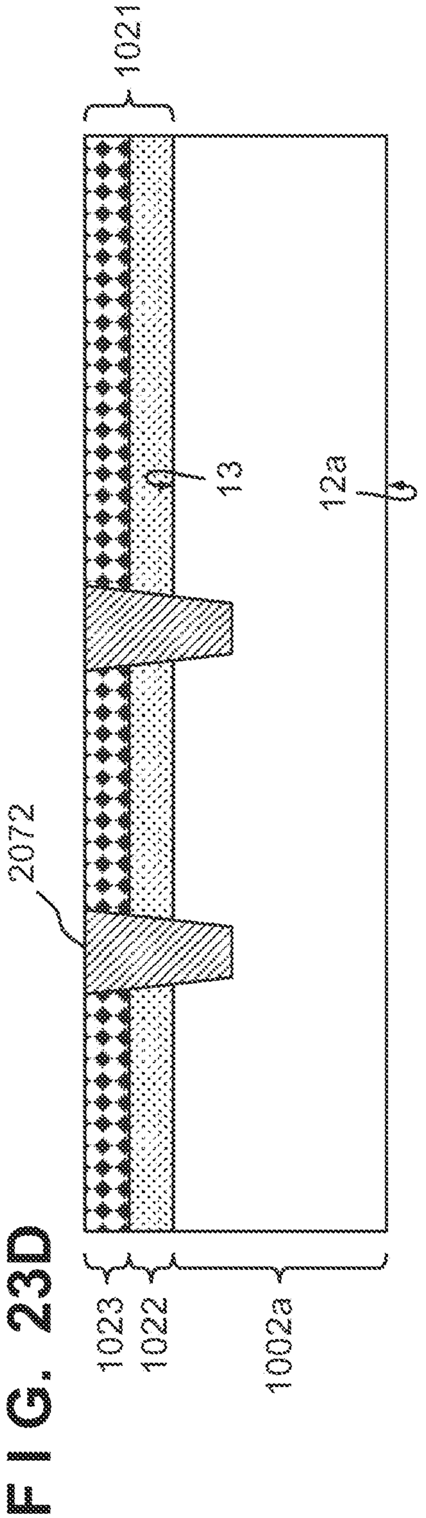

After the formation of the insulator 2072, as shown in FIG. 23D, the insulator 2072 is planarized using the insulating layer 1023 as an etching stopper, thereby forming a bonding surface that is the surface of the structure 1021. Planarization of the insulator 2072 is performed using, for example, a CMP apparatus. As described above, since the insulating layer 1023 is made of a material different from the insulator 2072, when the conditions of planarization are appropriately set, the etching (polishing) of the insulating layer 1023 is suppressed, and the surface of the structure 1021 is made flat. The bonding surface that is the surface of the structure 1021 is formed by the insulating layer 1023 and the insulator 2072 buried in the groove 2071. Depending on the etching conditions when forming the groove 2071 shown in FIG. 23B, the groove 2071 may have a tapered shape whose width is wider on the side of the bonding surface that is the surface of the structure 1021. In this case, the insulator portion 206 formed by the subsequent steps has a tapered shape conforming to the groove 2071. Note that for the next bonding, silicon oxide may be formed on the insulating layer 1023. The silicon oxide can have a smooth surface because it is formed on the flat surface. Also, planarization processing may be performed for the silicon oxide arranged on the insulating layer 1023. A bonding surface with improved planarity can thus be obtained.

Figure 24A:
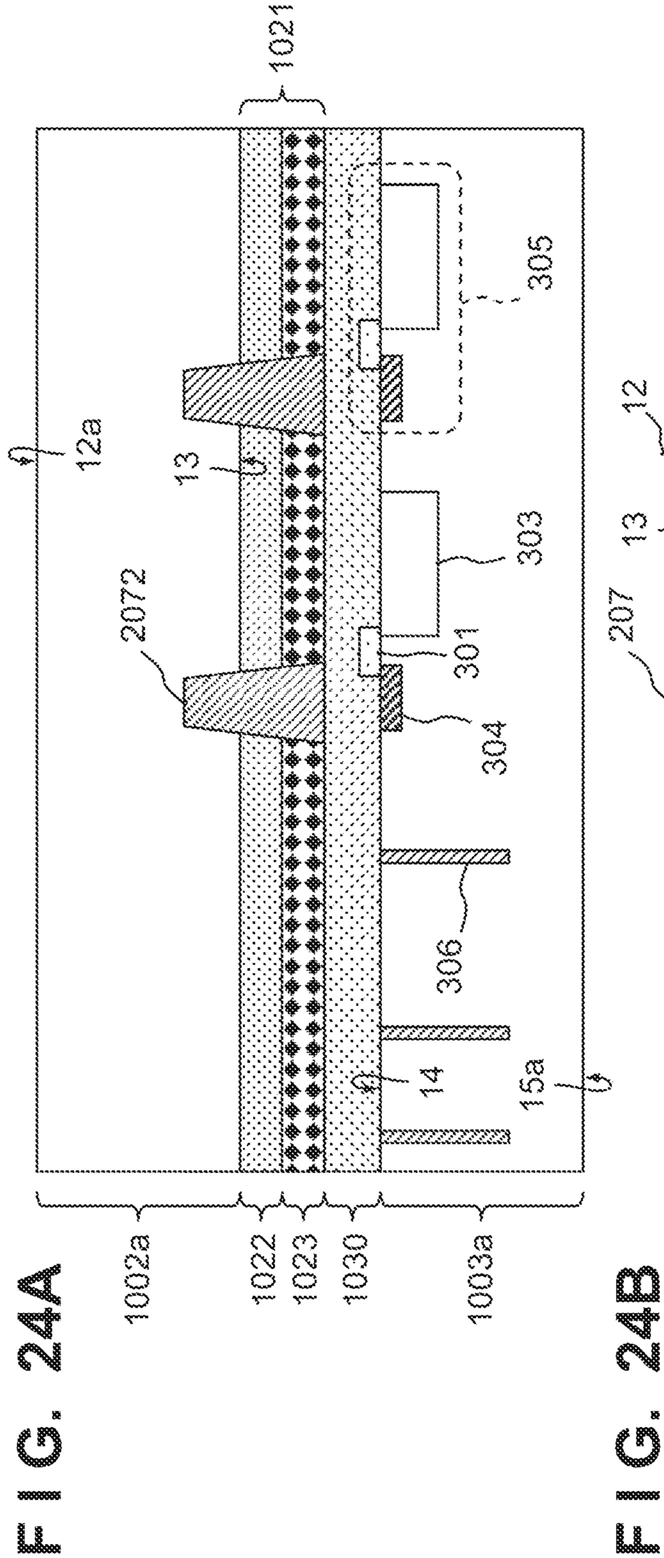
FIGS. 24A and 24B are sectional views showing a modification of the manufacturing method shown in FIGS. 11A to 11D.

Next, as shown in FIG. 24A, the surface of the structure 1030 formed on the principal surface 14 of the semiconductor substrate 1003*a* and the above-described bonding surface of the structure 1021 formed on the principal surface 13 of the semiconductor substrate 1002*a* are bonded. The semiconductor substrate 1003*a* (semiconductor layer 1003) and the semiconductor substrate 1002*a* (semiconductor layer 1002) are thus stacked. As described above, since the bonding surface that is the surface of the structure 1021 can be formed flat, lowering of the bonding strength between the structure 1021 and the structure 1030, which is caused by unevenness on the surface of the structure 1021, can be suppressed.

Figure 24B:
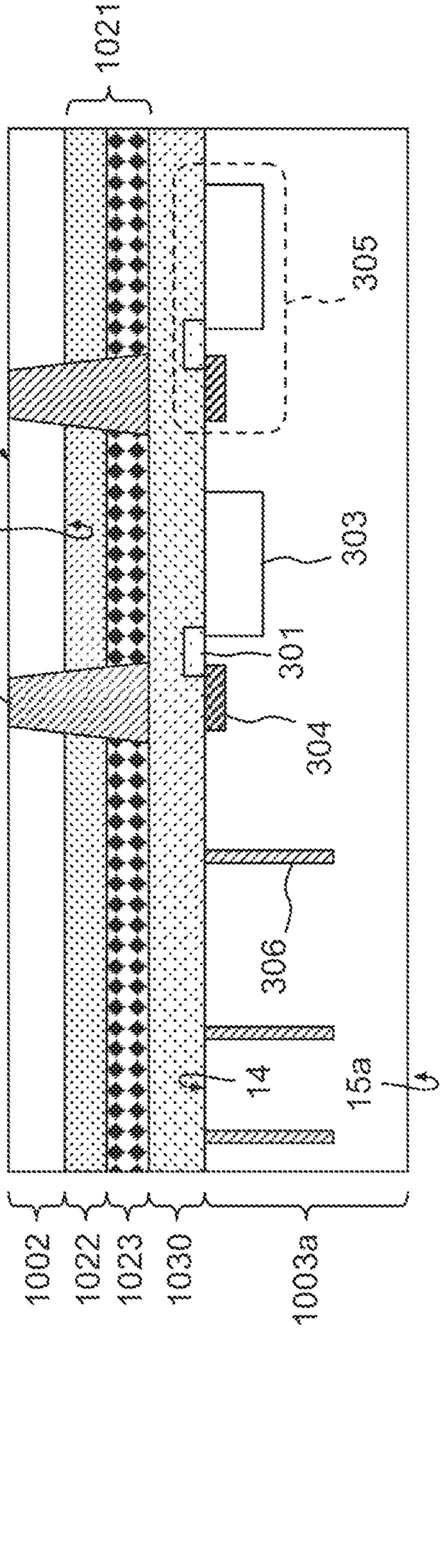

After the semiconductor substrate 1003*a* (semiconductor layer 1003) and the semiconductor substrate 1002*a* (semiconductor layer 1002) are stacked, the semiconductor substrate 1002*a* is thinned from the side of the principal surface 12*a* on the opposite side of the principal surface 13 of the semiconductor substrate 1002*a* on which the structure 1021 is formed. Thus, the semiconductor layer 1002 including the insulator portion 207 is formed, as shown in FIG. 24B. When thinning the semiconductor substrate 1002*a*, etching (polishing) may be performed using the insulator 2072 as an etching stopper. As the steps after this, steps after the step shown in FIG. 12A are performed.

In the above-described example, a case where (the precursor structure of) the insulator portion 207 is formed in the semiconductor layer 1002 has been described. However, the present invention is not limited to this. For example, (the precursor structure of) the insulator portion 206 may be formed at the same time as (the precursor structure of) the insulator portion 207.

When the steps shown in FIGS. 23A to 23D and FIGS. 24A and 24B are used, lowering of the bonding strength can be suppressed in the step of bonding the semiconductor substrate 1003*a* (semiconductor layer 1003) and the semiconductor substrate 1002*a* (semiconductor layer 1002). In addition, a part of the process for the semiconductor substrate 1002*a* can be performed before the semiconductor substrate 1003*a* and the semiconductor substrate 1002*a* are stacked. For this reason, loads to the semiconductor layer 1003 in association with the process can be reduced. That is, the reliability of the semiconductor device 1 improves, and the quality of an image obtained by the semiconductor device 1 improves. As a result, improvement of the characteristic of the semiconductor device 1 can be implemented.

The above-described embodiments can appropriately be combined. For example, the step of forming (the precursor structure of) the insulator portion 207 before the semiconductor substrate 1002*a* and the semiconductor substrate 1003*a* are stacked can be incorporated in each of the configurations of the semiconductor device 1 shown in FIGS. 2, 5 to 7, 9, and 16.

The disclosure of this specification includes a semiconductor device and a manufacturing method of a semiconductor device to be described below.

(Item 1)

A semiconductor device in which a first semiconductor layer, a second semiconductor layer, and a third semiconductor layer are stacked, wherein the second semiconductor layer is arranged between the first semiconductor layer and the third semiconductor layer, a first structure including a first insulating layer is arranged between a first principal surface of the first semiconductor layer and a second principal surface of the second semiconductor layer, which face each other, a second structure including a second insulating layer is arranged between a third principal surface of the second semiconductor layer and a fourth principal surface of the third semiconductor layer, which face each other, in an orthographic projection to the fourth principal surface, a region where a plurality of elements are arranged in the third semiconductor layer is defined as a first region, and a region between the first region and a peripheral portion of the third semiconductor layer is defined as a second region, in the second region, an opening portion configured to expose a pad electrode arranged in the first structure is arranged, the opening portion extends through the third semiconductor layer, the second structure, and the second semiconductor layer from a fifth principal surface, of the third semiconductor layer, on an opposite side of the fourth principal surface to the pad electrode, and in the orthographic projection to the third principal surface, an insulator portion extending through the second semiconductor layer 1002 from the second principal surface to the third principal surface is arranged between the first region of the second semiconductor layer and the opening portion.

(Item 2)

The device according to Item 1, wherein in an orthographic projection to the third principal surface, the insulator portion is arranged to surround the opening portion.

(Item 3)

The device according to Item 2, wherein the insulator portion forms a wall surface of a portion of the opening portion extending through the second semiconductor layer.

(Item 4)

The device according to Item 3, wherein a plurality of pad electrodes and a plurality of opening portions, including the pad electrode and the opening portion, are arranged, and in the orthographic projection to the third principal surface, the insulator portion is arranged continuously for the plurality of opening portions.

(Item 5)

The device according to Item 3, wherein a plurality of pad electrodes and a plurality of opening portions, including the pad electrode and the opening portion, are arranged, the plurality of opening portions include a first opening portion and a second opening portion, which are adjacent to each other, in the orthographic projection to the third principal surface, the insulator portion includes a first portion surrounding the first opening portion, and a second portion surrounding the second opening portion, and a part of the second semiconductor layer is arranged between the first portion and the second portion.

(Item 6)

The device according to Item 5, wherein a portion of the second semiconductor layer arranged in the first region and a portion of the second semiconductor layer arranged between the plurality of opening portions and a peripheral portion of the second semiconductor layer continues via the part of the second semiconductor layer.

(Item 7)

The device according to any one of Items 3 to 6, wherein a member using a material different from the first insulating layer and the insulator portion is arranged in a portion of the first structure in contact with the insulator portion.

(Item 8)

The device according to Item 7, wherein a transistor is arranged on the second principal surface, and a gate electrode of the transistor and the member are made of the same material.

(Item 9)

The device according to Item 7 or 8, wherein the member contains at least one of polycrystalline silicon, amorphous silicon, and single crystal silicon.

(Item 10)

The device according to any one of Items 7 to 9, wherein in an orthographic projection to the fifth principal surface, a portion of the opening portion arranged in the first structure is arranged inside a portion of the opening portion extending through the third semiconductor layer, the second structure, and the second semiconductor layer.

(Item 11)

The device according to any one of Items 1 to 10, wherein a conductive member extending through the second semiconductor layer from the first structure to the second structure is further arranged in the second region.

(Item 12)

The device according to Item 11, wherein the conductive member is arranged to surround the first region.

(Item 13)

The device according to Item 11 or 12, wherein the conductive member is arranged to surround the opening portion.

(Item 14)

The device according to any one of Items 1 to 13, wherein the plurality of elements include a photoelectric conversion element.

(Item 15)

The device according to Item 14, wherein an element circuit including a transistor configured to amplify a signal output from the photoelectric conversion element is arranged on the second principal surface, and a driving circuit configured to drive the plurality of elements and the element circuit is arranged on the first principal surface.

(Item 16)

The device according to Item 15, wherein the insulator portion is defined as a first insulator portion, the first structure includes a wiring pattern arranged in the first insulating layer, a plug electrode configured to connect the photoelectric conversion element and the wiring pattern is arranged to extend through the second structure and the second semiconductor layer, and in the orthographic projection to the third principal surface, a second insulator portion surrounding the plug electrode and extending through the second semiconductor layer from the second principal surface to the third principal surface is arranged in the second semiconductor layer.

(Item 17)

The device according to Item 16, wherein the first insulator portion and the second insulator portion are made of the same material.

(Item 18)

The device according to Item 16 or 17, wherein the second insulating layer includes a first layer that is in contact with the second semiconductor layer, and a second layer that is arranged between the first layer and the third semiconductor layer and is in contact with the first layer, and the second layer is made of a material different from the second insulator portion.

(Item 19)

The device according to claim 18, wherein the second insulator portion is made of silicon oxide, and the second layer is made of silicon nitride or polycrystalline silicon.

(Item 20)

The device according to any one of Items 14 to 19, wherein a third structure including an optical element is further arranged on the fifth principal surface.

(Item 21)

The device according to Item 20, wherein the optical element includes at least one of an intra-layer lens, a color filter, and a microlens.

(Item 22)

The device according to Item 20 or 21, wherein the opening portion further extends through the third structure, and in an orthographic projection to the fifth principal surface, a portion of the opening portion extending through the third semiconductor layer, the second structure, and the second semiconductor layer is arranged inside a portion of the opening portion arranged in the third structure.

(Item 23)

The device according to any one of Items 14 to 22, wherein the first semiconductor layer, the second semiconductor layer, and the third semiconductor layer are made of silicon, a maximum oxygen concentration in the first semiconductor layer is higher than a maximum oxygen concentration in the second semiconductor layer, and the maximum oxygen concentration in the second semiconductor layer is higher than a maximum oxygen concentration in the third semiconductor layer.

(Item 24)

The device according to any one of Items 14 to 22, wherein the first semiconductor layer, the second semiconductor layer, and the third semiconductor layer are made of silicon, and a maximum oxygen concentration in the second semiconductor layer is higher than a maximum oxygen concentration in the first semiconductor layer and a maximum oxygen concentration in the third semiconductor layer.

(Items 25)

The device according to Item 24, wherein the maximum oxygen concentration in the first semiconductor layer is higher than the maximum oxygen concentration in the third semiconductor layer.

(Item 26)

The device according to any one of Items 1 to 25, wherein in the orthographic projection to the third principal surface, the second semiconductor layer has a rectangular shape, and a width of a region of the second region where the insulator portion is arranged is not more than 1/100 of a length of a short side of the second semiconductor layer.

(Item 27)

A semiconductor device in which a first semiconductor layer, a second semiconductor layer, and a third semiconductor layer are stacked, wherein the second semiconductor layer is arranged between the first semiconductor layer and the third semiconductor layer, a first structure including a first insulating layer is arranged between a first principal surface of the first semiconductor layer and a second principal surface of the second semiconductor layer, which face each other, a second structure including a second insulating layer is arranged between a third principal surface of the second semiconductor layer and a fourth principal surface of the third semiconductor layer, which face each other, in an orthographic projection to the fourth principal surface, a region where a plurality of elements are arranged in the third semiconductor layer is defined as a first region, and a region between the first region and a peripheral portion of the third semiconductor layer is defined as a second region, and a conductive member extending from the first structure to the second structure is arranged in the second region.

(Item 28)

The semiconductor device according to Item 27, wherein the conductive member is arranged to surround the first region.

(Item 29)

The semiconductor device according to Item 27 or 28, wherein in the second region, an opening portion configured to expose a pad electrode arranged in the first structure is arranged, and the opening portion extends through the third semiconductor layer, the second structure, and the second semiconductor layer from a fifth principal surface, of the third semiconductor layer, on an opposite side of the fourth principal surface to the pad electrode.

(Item 30)

The semiconductor device according to Item 29, wherein the conductive member is arranged to surround the opening portion.

(Item 31)

The semiconductor device according to Item 29 or 30, wherein in the orthographic projection to the third principal surface, an insulator portion extending through the second semiconductor layer from the second principal surface to the third principal surface is arranged to surround the opening portion, and the conductive member extends through the insulator portion.

(Item 32)

The semiconductor device according to any one of Items 29 to 31, wherein the pad electrode is arranged at a position closer to the first semiconductor layer than the conductive member.

(Item 33)

The semiconductor device according to any one of Items 29 to 31, wherein the first structure includes, in the first insulating layer, a conductor portion that is formed in the same layer as the pad electrode and is made of the same material as the pad electrode, and the conductive member is in contact with the conductor portion.

(Item 34)

The semiconductor device according to any one of Items 27 to 33, wherein the first structure includes a wiring pattern arranged in the first insulating layer, and the conductive member is in contact with the wiring pattern.

(Item 35)

The semiconductor device according to Item 34, wherein a plurality of conductive members including the conductive member are arranged, and the plurality of conductive members are connected to each other by the wiring pattern.

(Item 36)

The semiconductor device according to any one of Items 27 to 35, wherein the conductive member is in contact with the fourth principal surface.

(Item 37)

The semiconductor device according to Item 36, wherein the plurality of elements include a photoelectric conversion element, and an impurity concentration in a portion of the fourth principal surface in contact with the conductive member equals an impurity concentration in a floating diffusion arranged in the photoelectric conversion element.

(Item 38)

The semiconductor device according to any one of Items 27 to 35, wherein a contact member made of the same material as a gate electrode included in the plurality of elements is arranged in the second region of the first structure, and the conductive member is in contact with the contact member.

(Item 39)

The semiconductor device according to Item 38, wherein an insulating film made of the same material as a gate insulating film arranged between the gate electrode and the fourth principal surface is arranged between the contact member and the fourth principal surface.

(Item 40)

The semiconductor device according to any one of Items 27 to 39, wherein a trench extending from a fifth principal surface on an opposite side of the fourth principal surface of the third semiconductor layer to the fourth principal surface is arranged in the second region.

(Item 41)

The semiconductor device according to Item 40, wherein an insulator is buried in the trench.

(Item 42)

The semiconductor device according to Item 40, wherein a wall surface of the trench is covered with an insulator, and a conductor is buried in the trench.

(Item 43)

The semiconductor device according to any one of Items 40 to 42, wherein the trench extends through the third semiconductor layer.

(Item 44)

The semiconductor device according to any one of Items 40 to 43, wherein the trench is not arranged in the second structure.

(Item 45)

The semiconductor device according to any one of Items 27 to 44, wherein the conductive member extends through the second structure and extends to the third semiconductor layer.

(Item 46)

A semiconductor device in which a first semiconductor layer, a second semiconductor layer, and a third semiconductor layer are stacked, wherein the second semiconductor layer is arranged between the first semiconductor layer and the third semiconductor layer, a plurality of elements including a photoelectric conversion element are arranged in the third semiconductor layer, an element circuit including a transistor configured to amplify a signal output from the photoelectric conversion element is arranged in the second semiconductor layer, a driving circuit configured to drive the plurality of elements and the element circuit is arranged in the first semiconductor layer, the first semiconductor layer, the second semiconductor layer, and the third semiconductor layer are made of silicon, a maximum oxygen concentration in the first semiconductor layer is higher than a maximum oxygen concentration in the second semiconductor layer, and the maximum oxygen concentration in the second semiconductor layer is higher than a maximum oxygen concentration in the third semiconductor layer.

(Item 47)

A semiconductor device in which a first semiconductor layer, a second semiconductor layer, and a third semiconductor layer are stacked, wherein the second semiconductor layer is arranged between the first semiconductor layer and the third semiconductor layer, a plurality of elements including a photoelectric conversion element are arranged in the third semiconductor layer, an element circuit including a transistor configured to amplify a signal output from the photoelectric conversion element is arranged in the second semiconductor layer, a driving circuit configured to drive the plurality of elements and the element circuit is arranged in the first semiconductor layer, the first semiconductor layer, the second semiconductor layer, and the third semiconductor layer are made of silicon, and a maximum oxygen concentration in the second semiconductor layer is higher than a maximum oxygen concentration in the first semiconductor layer and a maximum oxygen concentration in the third semiconductor layer.

(Item 48)

The semiconductor device according to Item 47, wherein the maximum oxygen concentration in the first semiconductor layer is higher than the maximum oxygen concentration in the third semiconductor layer.

(Item 49)

The semiconductor device according to Item 47 or 48, wherein a trench-type element isolation structure is not arranged in a region where the plurality of elements are arranged in the third semiconductor layer, and the trench-type element isolation structure is arranged in the second semiconductor layer.

(Item 50)

The semiconductor device according to any one of Items 47 to 49, wherein the second semiconductor layer is thinner than the first semiconductor layer and the third semiconductor layer.

(Item 51)

The semiconductor device according to Item 50, wherein the first semiconductor layer is thicker than the third semiconductor layer.

(Item 52)

A manufacturing method of a semiconductor device in which a first semiconductor layer in which a plurality of elements including a photoelectric conversion element are arranged, a second semiconductor layer in which an element circuit including a transistor configured to amplify a signal output from the photoelectric conversion element is arranged, and a third semiconductor layer in which a driving circuit configured to drive the plurality of elements and the element circuit is arranged are stacked, wherein the second semiconductor layer is arranged between the first semiconductor layer and the third semiconductor layer, and in manufacturing the semiconductor device, a maximum temperature of annealing for the third semiconductor layer is lower than the maximum temperature of the annealing for each of the first semiconductor layer and the second semiconductor layer.

(Item 53)

A manufacturing method of a semiconductor device in which a first semiconductor layer in which a plurality of elements including a photoelectric conversion element are arranged, a second semiconductor layer in which an element circuit including a transistor configured to amplify a signal output from the photoelectric conversion element is arranged, and a third semiconductor layer in which a driving circuit configured to drive the plurality of elements and the element circuit is arranged are stacked, wherein the second semiconductor layer is arranged between the first semiconductor layer and the third semiconductor layer, the method includes stacking the first semiconductor layer and the second semiconductor layer, and a maximum temperature of annealing after the first semiconductor layer and the second semiconductor layer are stacked is lower than the maximum temperature of the annealing before the first semiconductor layer and the second semiconductor layer are stacked.

(Item 54)

A manufacturing method of a semiconductor device in which a first semiconductor layer in which a structure including a plurality of elements including a photoelectric conversion element is arranged, and a second semiconductor layer in which an element circuit including a transistor configured to amplify a signal output from the photoelectric conversion element is arranged are stacked, including:

preparing the first semiconductor layer;

forming an insulating layer on a first principal surface of the second semiconductor layer;

forming an opening in the insulating layer via an opening of a mask pattern and forming a groove in the first principal surface;

forming an insulator covering the first principal surface to bury the groove;

planarizing the insulator using the insulating layer as an etching stopper, thereby forming a bonding surface; and bonding a surface of the structure and the bonding surface, thereby stacking the first semiconductor layer and the second semiconductor layer, wherein the bonding surface is formed by the insulating layer and the insulator buried in the groove.

(Item 55)

The manufacturing method according to Item 54, wherein the insulating layer is made of a material different from the insulator.

(Item 56)

The manufacturing method according to Item 54 or 55, wherein the insulating layer is made of silicon nitride or polycrystalline silicon, and the insulator is made of silicon oxide.

(Item 57)

The manufacturing method according to any one of Items 54 to 56, further including, after the first semiconductor layer and the second semiconductor layer are stacked, thinning the second semiconductor layer from a side of a second principal surface on an opposite side of the first principal surface of the second semiconductor layer, wherein when thinning the second semiconductor layer, the insulator is used as an etching stopper.

(Item 58)

The manufacturing method according to any one of Items 54 to 57, further including:

preparing a third semiconductor layer in which a driving circuit configured to drive the plurality of elements and the element circuit is arranged; and stacking the second semiconductor layer and the third semiconductor layer.

(Item 59)

The manufacturing method according to Item 58, further including thinning the first semiconductor layer after the second semiconductor layer and the third semiconductor layer are stacked.

(Item 60)

The manufacturing method according to any one of Items 54 to 59, further including forming the element circuit after the second semiconductor layer is thinned.

(Item 61)

The manufacturing method according to any one of Items 54 to 60, wherein the groove has a tapered shape in which a width on a side of the bonding surface is wider.

The present invention is not limited to the above embodiments, and various changes and modifications can be made within the spirit and scope of the present invention. Therefore, to apprise the public of the scope of the present invention, the following claims are made.

According to the present invention, it is possible to provide a technique advantageous in improving the characteristic of a semiconductor device in which a plurality of semiconductor substrates are stacked.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-114323, filed Jul. 15, 2022, which is hereby incorporated by reference herein in its entirety.

What is claimed is:

1. A semiconductor device in which a first semiconductor layer, a second semiconductor layer, and a third semiconductor layer are stacked, wherein the second semiconductor layer is arranged between the first semiconductor layer and the third semiconductor layer, a first structure comprising a first insulating layer is arranged between a first principal surface of the first semiconductor layer and a second principal surface of the second semiconductor layer, which face each other, a second structure comprising a second insulating layer is arranged between a third principal surface of the second semiconductor layer and a fourth principal surface of the third semiconductor layer, which face each other, in an orthographic projection to the fourth principal surface, a region where a plurality of elements are arranged in the third semiconductor layer is defined as a first region, and a region between the first region and a peripheral portion of the third semiconductor layer is defined as a second region, in the second region, an opening portion configured to expose a pad electrode arranged in the first structure is arranged, the opening portion extends through the third semiconductor layer, the second structure, and the second semiconductor layer from a fifth principal surface, of the third semiconductor layer, on an opposite side of the fourth principal surface to the pad electrode, between the first insulating layer and the second insulating layer and between the first region and the opening portion, an insulator portion is arranged at the same height as the second semiconductor layer, the plurality of elements include a photoelectric conversion element, the first semiconductor layer, the second semiconductor layer, and the third semiconductor layer are made of silicon, a maximum oxygen concentration in the first semiconductor layer is higher than a maximum oxygen concentration in the second semiconductor layer, and the maximum oxygen concentration in the second semiconductor layer is higher than a maximum oxygen concentration in the third semiconductor layer.

2. The device according to claim 1, wherein in an orthographic projection to the third principal surface, the insulator portion is arranged to surround the opening portion.

3. The device according to claim 2, wherein the insulator portion forms a wall surface of a portion of the opening portion extending through the second semiconductor layer.

4. The device according to claim 3, wherein a plurality of pad electrodes and a plurality of opening portions, including the pad electrode and the opening portion, are arranged, and in the orthographic projection to the third principal surface, the insulator portion is arranged continuously for the plurality of opening portions.

5. The device according to claim 3, wherein a plurality of pad electrodes and a plurality of opening portions, including the pad electrode and the opening portion, are arranged, the plurality of opening portions include a first opening portion and a second opening portion, which are adjacent to each other, in the orthographic projection to the third principal surface, the insulator portion includes a first portion surrounding the first opening portion, and a second portion surrounding the second opening portion, and a part of the second semiconductor layer is arranged between the first portion and the second portion.

6. The device according to claim 5, wherein a portion of the second semiconductor layer arranged in the first region and a portion of the second semiconductor layer arranged between the plurality of opening portions and a peripheral portion of the second semiconductor layer continues via the part of the second semiconductor layer.

7. The device according to claim 1, wherein a conductive member extending through the second semiconductor layer from the first structure to the second structure is further arranged in the second region.

8. The device according to claim 7, wherein the conductive member is arranged to surround the first region.

9. The device according to claim 7, wherein the conductive member is arranged to surround the opening portion.

10. The device according to claim 1, wherein an element circuit comprising a transistor configured to amplify a signal output from the photoelectric conversion element is arranged on the second principal surface, and a driving circuit configured to drive the plurality of elements and the element circuit is arranged on the first principal surface.

11. The device according to claim 10, wherein the insulator portion is defined as a first insulator portion, the first structure comprises a wiring pattern arranged in the first insulating layer, a plug electrode configured to connect the photoelectric conversion element and the wiring pattern is arranged to extend through the second structure and the second semiconductor layer, and in the orthographic projection to the third principal surface, a second insulator portion surrounding the plug electrode and extending through the second semiconductor layer from the second principal surface to the third principal surface is arranged in the second semiconductor layer.

12. The device according to claim 11, wherein the first insulator portion and the second insulator portion are made of the same material.

13. The device according to claim 11, wherein the second insulating layer includes a first layer that is in contact with the second semiconductor layer, and a second layer that is arranged between the first layer and the third semiconductor layer and is in contact with the first layer, and the second layer is made of a material different from the second insulator portion.

14. The device according to claim 13, wherein the second insulator portion is made of silicon oxide, and the second layer is made of silicon nitride or polycrystalline silicon.

15. The device according to claim 1, wherein a third structure including an optical element is further arranged on the fifth principal surface.

16. The device according to claim 15, wherein the opening portion further extends through the third structure, and in an orthographic projection to the fifth principal surface, a portion of the opening portion extending through the third semiconductor layer, the second structure, and the second semiconductor layer is arranged inside a portion of the opening portion arranged in the third structure.

17. The device according to claim 1, wherein in the orthographic projection to the third principal surface, the second semiconductor layer has a rectangular shape, and a width of a region of the second region where the insulator portion is arranged is not more than 1/100 of a length of a short side of the second semiconductor layer.

18. A semiconductor device in which a first semiconductor layer, a second semiconductor layer, and a third semiconductor layer are stacked, wherein the second semiconductor layer is arranged between the first semiconductor layer and the third semiconductor layer, a first structure comprising a first insulating layer is arranged between a first principal surface of the first semiconductor layer and a second principal surface of the second semiconductor layer, which face each other, a second structure comprising a second insulating layer is arranged between a third principal surface of the second semiconductor layer and a fourth principal surface of the third semiconductor layer, which face each other, in an orthographic projection to the fourth principal surface, a region where a plurality of elements are arranged in the third semiconductor layer is defined as a first region, and a region between the first region and a peripheral portion of the third semiconductor layer is defined as a second region, in the second region, an opening portion configured to expose a pad electrode arranged in the first structure is arranged, the opening portion extends through the third semiconductor layer, the second structure, and the second semiconductor layer from a fifth principal surface, of the third semiconductor layer, on an opposite side of the fourth principal surface to the pad electrode, between the first insulating layer and the second insulating layer and between the first region and the opening portion, an insulator portion is arranged at the same height as the second semiconductor layer, the plurality of elements include a photoelectric conversion element, wherein the first semiconductor layer, the second semiconductor layer, and the third semiconductor layer are made of silicon, and a maximum oxygen concentration in the second semiconductor layer is higher than a maximum oxygen concentration in the first semiconductor layer and a maximum oxygen concentration in the third semiconductor layer.

19. The device according to claim 18, wherein the maximum oxygen concentration in the first semiconductor layer is higher than the maximum oxygen concentration in the third semiconductor layer.

* * * * *